United States Patent
Kimura

(10) Patent No.: US 7,583,032 B2
(45) Date of Patent: Sep. 1, 2009

(54) SEMICONDUCTOR DEVICE

(75) Inventor: Hajime Kimura, Kanagawa (JP)

(73) Assignee: Semiconductor Energy Laboratory Co., Ltd., Atsugi-Shi, Kanagawa-Ken (JP)

( * ) Notice: Subject to any disclaimer, the term of this patent is extended or adjusted under 35 U.S.C. 154(b) by 165 days.

(21) Appl. No.: 10/942,089

(22) Filed: Sep. 16, 2004

(65) Prior Publication Data
US 2005/0231123 A1 Oct. 20, 2005

Related U.S. Application Data

(63) Continuation of application No. 10/244,489, filed on Sep. 17, 2002, now Pat. No. 6,909,242.

(30) Foreign Application Priority Data

Sep. 21, 2001 (JP) ............................. 2001-290287
Sep. 28, 2001 (JP) ............................. 2001-304643
May 27, 2002 (JP) ............................. 2002-152727

(51) Int. Cl.
*G09G 3/10* (2006.01)

(52) U.S. Cl. .................... 315/169.3; 315/169.1; 345/76; 257/59; 257/72

(58) Field of Classification Search ... 315/169.1–169.3; 345/76, 82, 204, 55; 313/484, 498, 586; 257/59, 72, E27.133

See application file for complete search history.

(56) References Cited

U.S. PATENT DOCUMENTS 5,095,248 A 3/1992 Sato ......................... 315/169.3
5,359,341 A 10/1994 Hutchings .................... 345/45

(Continued)

FOREIGN PATENT DOCUMENTS

EP 1 003 150 5/2000

(Continued)

OTHER PUBLICATIONS

International Search Report (Application No. 2002005281-9), Jul. 19, 2004, 6 pages.

(Continued)

*Primary Examiner*—Douglas W Owens
*Assistant Examiner*—Jimmy T Vu
(74) *Attorney, Agent, or Firm*—Fish & Richardson P.C.

(57) ABSTRACT

A light emitting device capable of performing signal electric current write-in operations at high speed and without dispersion in the characteristics of TFTs structuring pixels influencing the brightness of light emitting elements is provided. The gate length L of a transistor in which an electric current flows during write-in of a signal electric current is made shorter than the gate length L of a transistor in which electric current supplied to EL elements flows during light emission, and high speed write-in is thus performed by having a larger electric current flow than the electric current flowing in conventional EL elements. A converter and driver transistor (108) is used for signal write-in. By using the converter and driver transistor (108) and a driver transistor (107) when supplying electric current to a light emitting element during light emission, dispersion in the transistor characteristics can be made to have less influence on brightness than when using a structure in which write-in operations and light emission operations are performed using different transistors.

29 Claims, 40 Drawing Sheets

U.S. PATENT DOCUMENTS

| | | | | |
|---|---|---|---|---|
| 5,581,160 | A | 12/1996 | Fujita | 315/169.3 |
| 5,673,058 | A | 9/1997 | Uragami et al. | 345/3.1 |
| 6,037,719 | A | 3/2000 | Yap et al. | 315/169.3 |
| 6,091,203 | A | 7/2000 | Kawashima et al. | 315/169.3 |
| 6,229,506 | B1 * | 5/2001 | Dawson et al. | 345/82 |
| 6,246,179 | B1 | 6/2001 | Yamada | |
| 6,246,180 | B1 | 6/2001 | Nishigaki | 315/169.3 |
| 6,246,384 | B1 | 6/2001 | Sano | |
| 6,278,131 | B1 | 8/2001 | Yamazaki et al. | 257/59 |
| 6,362,798 | B1 | 3/2002 | Kimura et al. | 345/55 |
| 6,380,687 | B1 | 4/2002 | Yamazaki | 315/169.3 |
| 6,501,466 | B1 * | 12/2002 | Yamagishi et al. | 345/204 |
| 6,753,656 | B2 * | 6/2004 | Kimura | 315/169.3 |
| 6,774,877 | B2 | 8/2004 | Nishitoba et al. | 315/169.3 |
| 6,794,675 | B1 | 9/2004 | Suzuki et al. | |
| 6,839,057 | B2 | 1/2005 | Iguchi | 315/169.3 |
| 6,940,214 | B1 | 9/2005 | Komiya et al. | |
| 7,138,967 | B2 * | 11/2006 | Kimura | 345/76 |
| 7,365,715 | B2 * | 4/2008 | Inukai | 345/76 |
| 2001/0029070 | A1 | 10/2001 | Yamazaki et al. | 315/169.3 |
| 2002/0070913 | A1 | 6/2002 | Kimura et al. | 315/169.3 |
| 2002/0196212 | A1 | 12/2002 | Nishitoba et al. | 315/169.3 |
| 2003/0020413 | A1 | 1/2003 | Oomura | 315/169.3 |
| 2003/0043131 | A1 | 3/2003 | Iguchi | 315/169.3 |
| 2003/0169218 | A1 | 9/2003 | Kimura et al. | 315/169.3 |

FOREIGN PATENT DOCUMENTS

| | | |
|---|---|---|
| EP | 1 020 920 | 7/2000 |
| EP | 1 063 630 A2 | 12/2000 |
| EP | 1 291 839 | 3/2001 |
| EP | 1 102 234 | 5/2001 |
| EP | 1 103 946 A2 | 5/2001 |
| JP | 10-319872 | 12/1998 |
| JP | 2000-86968 | 3/2000 |
| JP | 2001-5426 | 1/2001 |
| JP | 2001-147659 | 5/2001 |
| JP | 2001-343933 | 12/2001 |
| JP | 2003-005710 | 1/2003 |
| JP | 2003-066909 | 3/2003 |
| JP | 2003-076327 | 3/2003 |
| WO | WO 98/48403 | 10/1998 |
| WO | WO 99/65011 | 12/1999 |

OTHER PUBLICATIONS

Pribat, et al., "Matrix addressing for organic electroluminescent displays," *Thin Solid Films*, vol. 383, pp. 25-30, Jan. 1, 2001.

Search Report (Application No. 02020442.6), dated Sep. 9, 2005, 3 pages.

Baldo et al.; "Highly Efficient Phosphorescent Emission From Organic Electroluminescent Devices"; *Nature*, vol. 395; pp. 151-154; Sep. 10, 1998.

Baldo et al.; "Very High-Efficiency Green Organic Light-Emitting Devices Based on Electrophosphorescence"; *Applied Physics Letters*, vol. 75, No. 1; pp. 4-6; Jul. 5, 1999.

Tsutsui et al.; "Electroluminescence in Organic Thin Films"; *Photochemical Processes in Organized Molecular Systems*; pp. 437-450; 1991.

Tsutsui et al.; "High Quantum Efficiency in Organic Light-Emitting Devices with Iridium-Complex as a Triplet Emissive Center"; *Japanese Journal of Applied Physics*, vol. 38; pp. L1502-L1504; Dec. 15, 1999.

\* cited by examiner

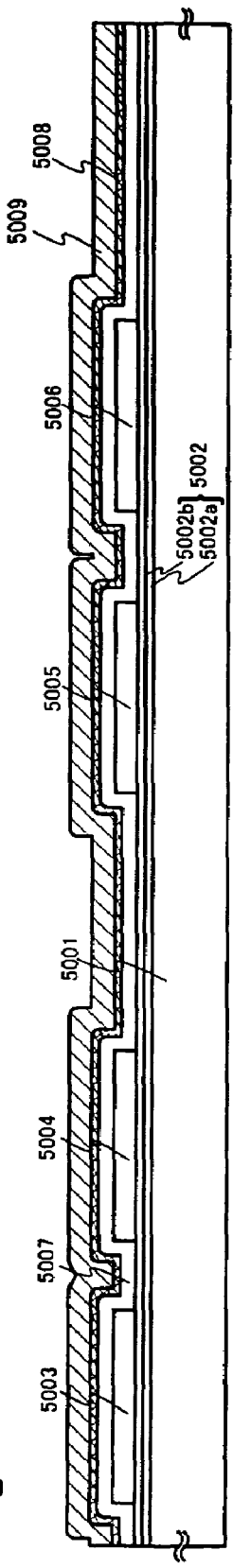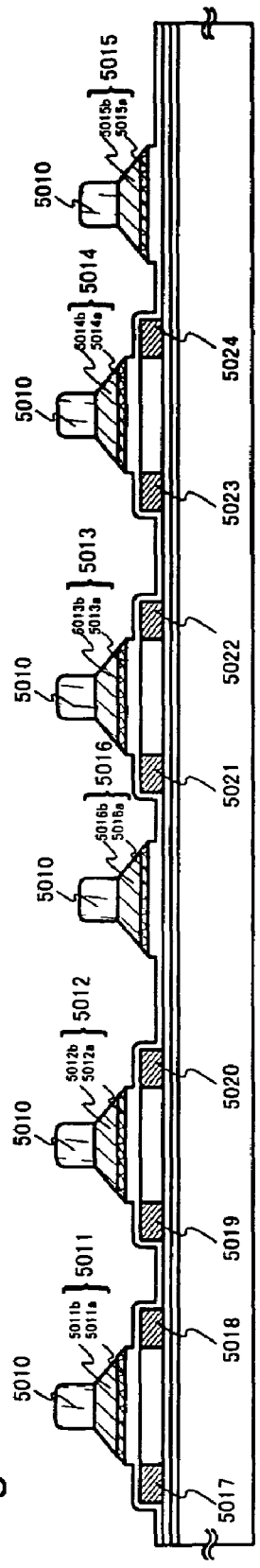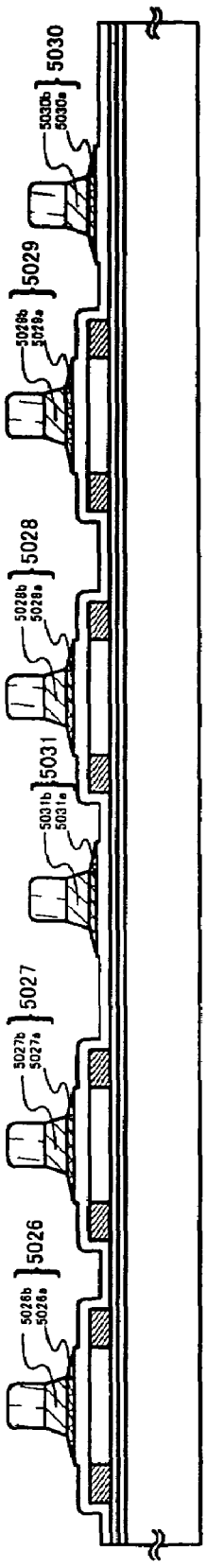

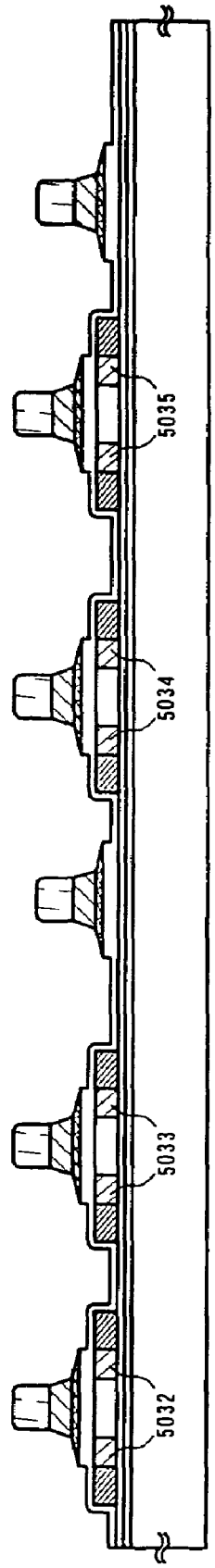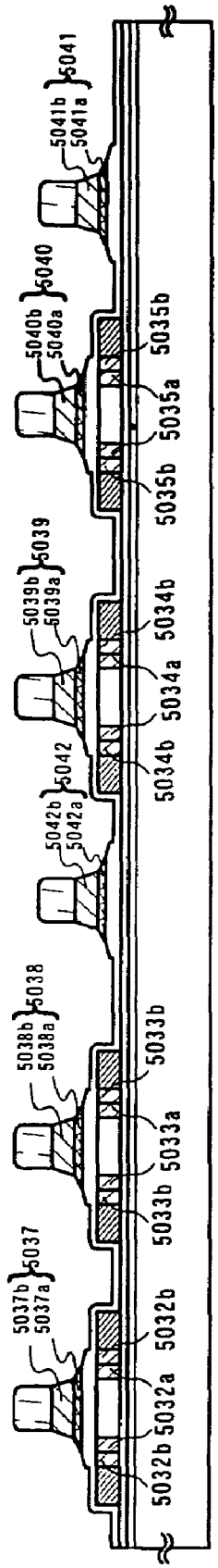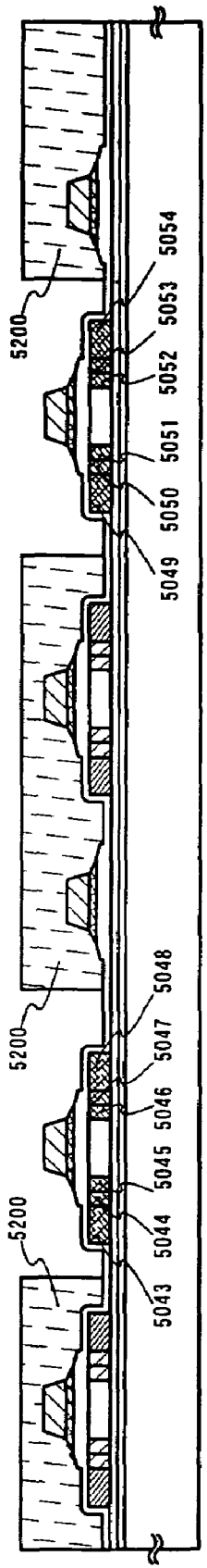

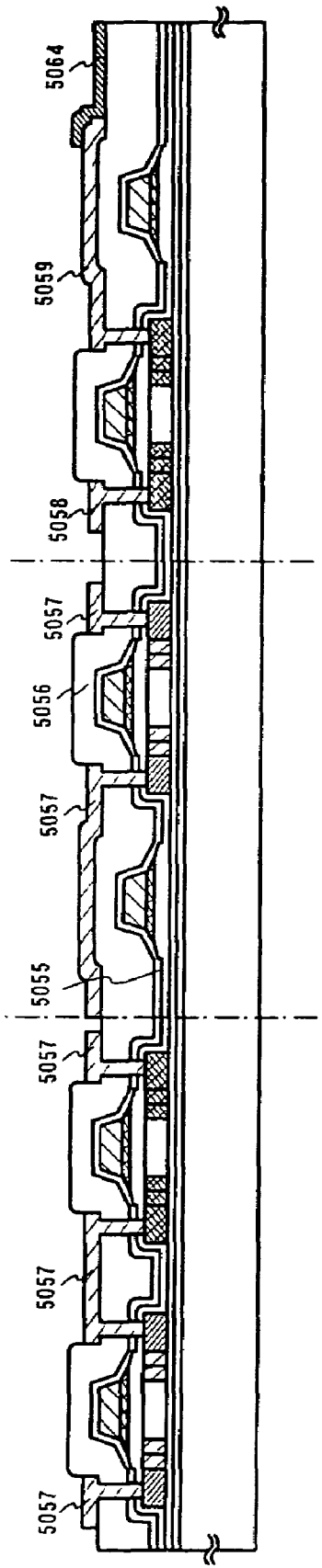
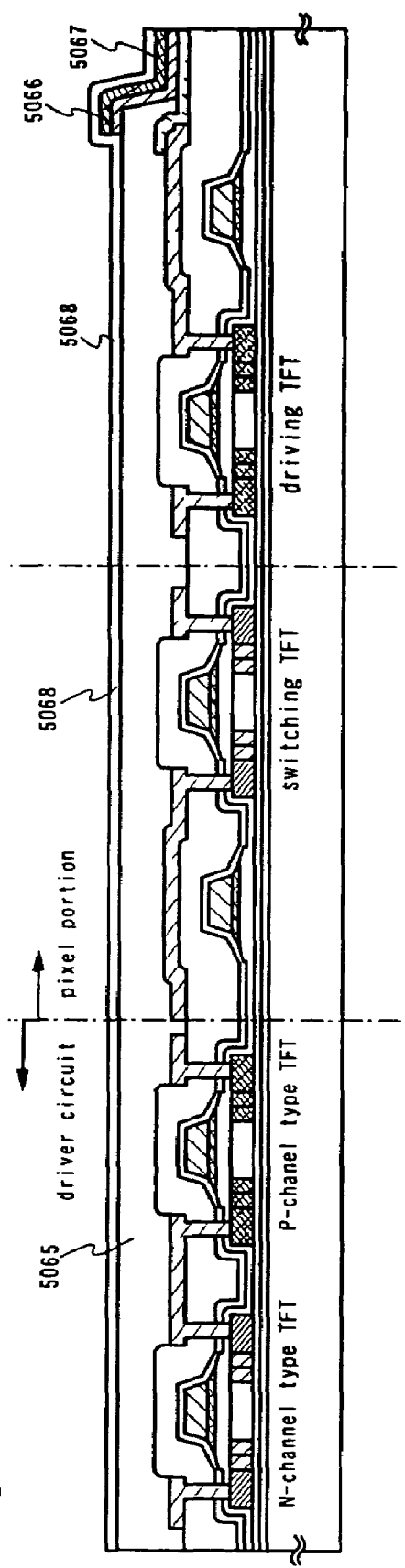
Fig. 23A
Fig. 23B

Fig. 34A
Fig. 34B
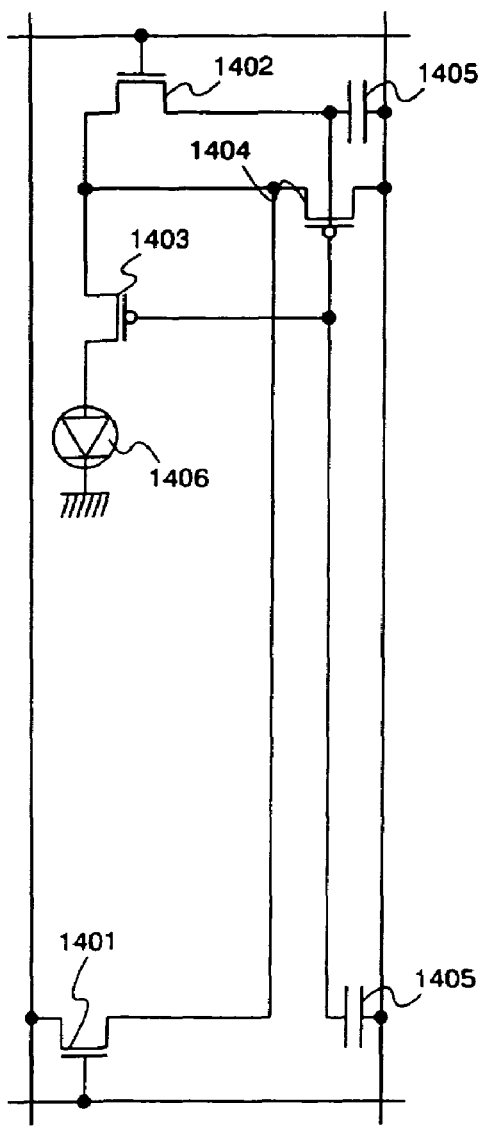
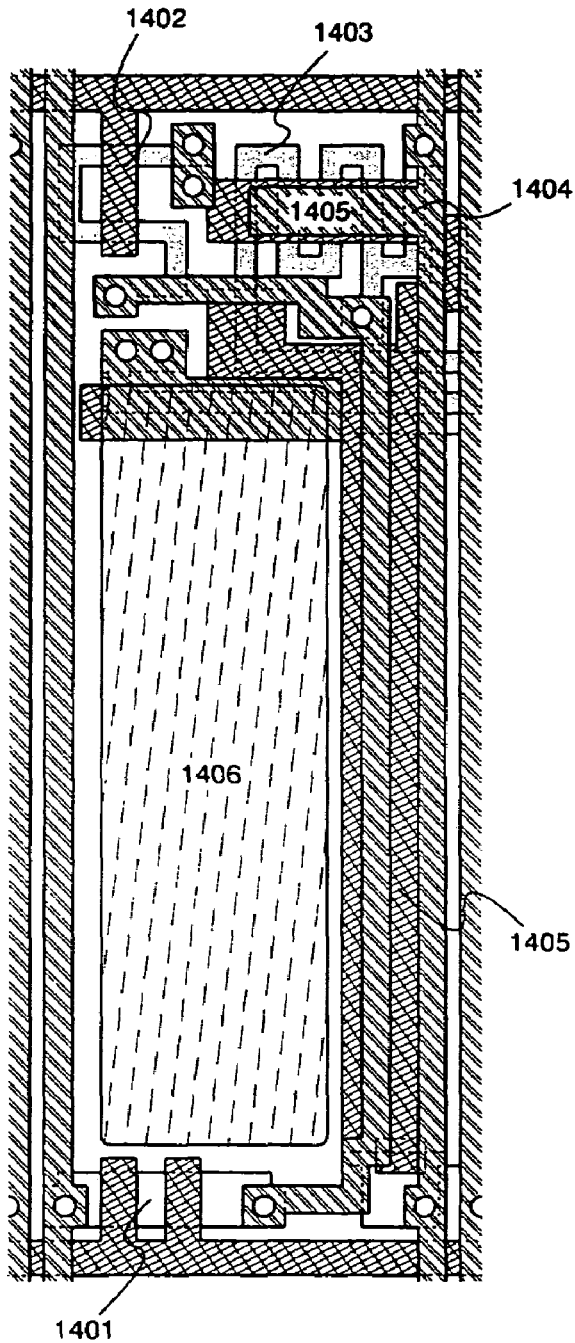
☐ : semiconductor layer
▨ : gate metal
▧ : wiring
○ : contact hole
☐ : transparent conductive film

SEMICONDUCTOR DEVICE

CROSS-REFERENCE TO RELATED APPLICATIONS

This application is a continuation application of U.S. application Ser. No. 10/244,489, filed Sep. 17, 2002, now allowed, which claims the benefit of foreign priority applications filed in Japan as Serial No. 2001-290287 on Sep. 21, 2001, as Serial No. 2001-304643 on Sep. 28, 2001, and as Serial No. 2002-152727 on May 27, 2002. This application claims priority to each of these prior applications, and the disclosures of the prior applications are considered part of (and are incorporated by reference in) the disclosure of this application.

BACKGROUND OF THE INVENTION

1. Field of the Invention

The present invention relates to the structure of a semiconductor device. In particular, the present invention relates to the structure of an active matrix semiconductor device having a thin film transistor (hereinafter referred to as TFT) manufactured on an insulator such as glass or plastic. Further, the present invention relates to electronic equipment using this type of semiconductor device as a display portion.

2. Description of the Related Art

The development of self-light emitting display devices such as electroluminescence (EL) display devices and FEDs (field emission displays) has become active in recent years. The advantages of the self-light emitting display devices include their high visibility, their ability to be made thinner because a back light which is necessary for liquid crystal display devices (LCDs) and the like is not needed, and that there are almost no limitations on their angle of view.

The term EL element indicates an element having a light emitting layer in which luminescence generated by the application of an electric field can be obtained. There are light emission when returning to a base state from a singlet excitation state (fluorescence), and light emission when returning to a base state from a triplet excitation state (phosphorescence) in the light emitting layer, and a semiconductor device of the present invention may use either of the aforementioned types of light emission.

EL elements normally have a laminate structure in which a light emitting layer is sandwiched between a pair of electrodes (anode and cathode). A laminate structure having "an anode, a hole transporting layer, a light emitting layer, an electron transporting layer, and a cathode", proposed by Tang et al. of Eastman Kodak Company, can be given as a typical structure. This structure has extremely high efficiency light emission, and most of the EL elements currently being researched employ this structure.

Further, structures having the following layers laminated in order between an anode and a cathode also exist: a hole injecting layer, a hole transporting layer, a light emitting layer, and an electron transporting layer; and a hole injecting layer, a hole transporting layer, a light emitting layer, an electron transporting layer, and an electron injecting layer. Any of the above-stated structures may be employed as the EL element structure used in the semiconductor device of the present invention. Furthermore, fluorescent pigments and the like may also be doped into the light emitting layer.

All layers formed in EL elements between the anode and the cathode are referred to generically as "EL layers" in this specification. The aforementioned hole injecting layer, hole transporting layer, light emitting layer, electron transporting layer, and electron injecting layer are all included in the category of EL layers, and light emitting elements structured by an anode, an EL layer, and a cathode are referred to as EL elements.

The structure of a pixel in a general semiconductor device is shown in FIG. 5. Note that an EL display device is used as an example of a typical semiconductor device. The pixel shown in FIG. 5 has a source signal line 501, a gate signal line 502, a switching TFT 503, a driver TFT 504, a storage capacitor 505, an EL element 506, and electric power sources 507 and 508.

The connective relationship between each portion is explained. The TFTs have three terminals, a gate, a source, and a drain, but it is difficult to clearly differentiate the source and the drain here due to the TFT structure. The explanation regarding connectivity between the elements is therefore given with one electrode, the source or the drain, referred to as a first electrode, and the other electrode referred to as a second electrode. The terms source, drain, and the like are used, however, when giving explanations about on and off states of the TFTs, the electric potential of each terminal, and the like.

A gate electrode of the switching TFT 503 is connected to the gate signal line 502, and a first electrode of the switching TFT 503 is connected to the source signal line 501. A second electrode of the switching TFT 503 is connected to a gate electrode of the driver TFT 504. A first electrode of the driver TFT 504 is connected to the electric power source 507, and a second electrode of the driver TFT 504 is connected to one electrode of the EL element 506. The other electrode of the EL element 506 is connected to the electric power source 508. The storage capacitor 505 is connected between the gate electrode and the first electrode of the driver TFT 504, and stores the voltage between the gate and the source of the driver TFT 504.

If the electric potential of the gate signal line 502 changes and the switching TFT 503 turns on, then an image signal input to the source signal line 501 is input to the gate electrode of the driver TFT 504. The voltage between the gate and the source of the driver TFT 504, and the amount of electric current flowing between the source and the drain of the driver TFT 504 (hereinafter referred to as drain current), are determined in accordance with the electric potential of the input image signal. The electric current is supplied to the EL element 506, which emits light.

TFTs formed by using polysilicon (hereinafter referred to as P—Si) have a higher electric field mobility and a larger on current than TFTs formed by using amorphous silicon (hereinafter referred to as A-Si), and therefore are suitable as transistors used in semiconductor devices.

Conversely, TFTs formed by polysilicon have a problem point in that dispersion in their electrical characteristics occurs easily due to defects in their crystal grain boundaries.

If there is dispersion per pixel in characteristics such as the TFT threshold value and the on current when the TFTs structure pixels like the one shown in FIG. 5, then there is a large difference in the amount of the drain current in the TFT in response to the input image signal, even for cases in which the same image signal is input, and thus there is dispersion in the brightness of the EL elements 506.

In order to solve this type of problem, a desired amount of electric current may be supplied to the EL elements, without dependence upon the TFT characteristics. Therefore, various types of electric current write-in pixels that can control the size of the electric current flowing in the EL elements, without being influenced by the TFT characteristics, have thus been proposed.

The term electric current write-in denotes a method in which an image signal input to pixels using source signal lines is input by electric current as opposed to the normal input by analog or digital voltage information. The value of the electric current to be supplied to the EL elements is set by a signal electric current on the outside, and an equivalent electric current thereto is made to flow in the pixels. This has the advantage that there is no influence due to dispersion in the TFT characteristics.

Several examples of typical electric current write-in pixels are shown below, and explanations are given regarding their structure, operation, and characteristics.

An example of a first structure is shown in FIG. 6. The pixel of FIG. 6 has a source signal line 601, first to third gate signal lines 602 to 604, an electric current supply line 605, TFTs 606 to 609, a storage capacitor 610, an EL element 611, and a signal electric current input current source 612.

A gate electrode of the TFT 606 is connected to the first gate signal line 602, a first electrode of the TFT 606 is connected to the source signal line 601, and a second electrode of the TFT 606 is connected to: a first electrode of the TFT 607, a first electrode of the TFT 608, and a first electrode of the TFT 609. A gate electrode of the TFT 607 is connected to the second gate signal line 603, and a second electrode of the TFT 607 is connected to a gate electrode of the TFT 608. A second electrode of the TFT 608 is connected to the electric current supply line 605. A gate electrode of the TFT 609 is connected to the third gate signal line 604, and a second electrode of the 609 is connected to an anode of the EL element 611. The storage capacitor 610 is connected between the gate electrode and an input electrode of the TFT 608, and stores the voltage between a gate and a source of the TFT 608. Predetermined electric potentials are input to the electric current supply line 605 and a cathode of the EL element 611, and the two have a mutual electric potential difference.

Operation from write-in of a signal electric current to light emission is explained using FIGS. 7A to 7E. Reference numerals used within the figures denoting each portion are based on those of FIG. 6. FIGS. 7A to 7C show electric current flow schematically. FIG. 7D shows the relationship between the electric currents flowing in each pathway during write-in of the signal electric current, and FIG. 7E shows the voltage accumulating in the storage capacitor 610 during the same write-in of the signal electric current, namely the voltage between the gate and the source of the TFT 608.

First, pulses are input to the first gate signal line 602 and the second gate signal line 603, and the TFTs 606 and 607 turn on. The electric current flowing in the source signal line at this point, namely the signal electric current, is taken as $I_{data}$.

The electric current $I_{data}$ flows in the source signal line, and therefore the electric current path within the pixel is divided into $I_1$ and $I_2$, as shown in FIG. 7A. The relationship between the two is shown in FIG. 7D. Note that $I_{data}=I_1+I_2$.

Electric charge is not yet stored in the storage capacitor 610 at the instant when the TFT 606 turns on, and therefore the TFT 608 is off. Consequently, $I_2=0$, and $I_{data}=I_1$. That is, electric current only flows due to the accumulation of electric charge in the storage capacitor 610 during this period.

Electric charge then accumulates gradually in the storage capacitor 610, and an electric potential difference starts to develop between both electrodes (see FIG. 7E). The TFT 608 turns on when the electric potential difference between both electrodes reaches Vth (point A in FIG. 7E), and $I_2$ develops. $I_{data}=I_1+I_2$, as discussed above, and therefore $I_1$ is gradually reduced. Electric current still flows, and in addition, electric charge accumulates in the storage capacitor.

Electric charge continues to accumulate in the storage capacitor 610 until the electric potential difference between both electrodes in the storage capacitor 610, namely the voltage between the gate and the source of the TFT 608, becomes a desired voltage, that is, becomes a voltage (VGS) at which the TFT 608 causes as much as possible for the electric current $I_{data}$ to flow. When the accumulation of electric charge is then complete (point B in FIG. 7E), the electric current $I_2$ stops flowing, and in addition, an electric current corresponding to VGS flows in the TFT 608 at this point, and $I_{data}=I_2$ (see FIG. 7B). Signal write-in operations are thus complete. Selection of the first gate signal line 602 and the second gate signal line 603 is finally completed, and the TFTs 606 and 607 turn off.

Light emission operations are covered next. A pulse is input to the third gate signal line 604, and the TFT 609 turns on. The previously written in VGS is stored in the storage capacitor 610, and therefore the TFT 608 is on, and the electric current $I_{data}$ flows from the electric current supply line 605. Thereby the EL element 611 emits light. If the TFT 608 is operated in the saturated region at this point, then $I_{data}$ can continue to flow without changing, even if the voltage between the source and the drain of the TFT 608 changes.

FIG. 17 shows a second structure example. A pixel of FIG. 17 has a source signal line 1701, first to third gate signal lines 1702 to 1704, an electric current supply line 1705, TFTs 1706 to 1709, a storage capacitor 1710, an EL element 1711, and a current source for inputting signal electric current 1712.

A gate electrode of the TFT 1706 is connected to the first gate signal line 1702, a first electrode of the TFT 1706 is connected to the source signal line 1701, and a second electrode of the TFT 1706 is connected to a first electrode of the TFT 1708 and a first electrode of the TFT 1709. A gate electrode of the TFT 1708 is connected to the second gate signal line 1703, and a second electrode of the TFT 1708 is connected to the electric current supply line 1705. A gate electrode of the TFT 1707 is connected to the third gate signal line 1704, a first electrode of the TFT 1707 is connected to a gate electrode of the TFT 1709, and a second electrode of the TFT 1707 is connected to a second electrode of the TFT 1709 and one electrode of the EL element 1711. The storage capacitor 1710 is connected between the gate electrode and a first electrode of the TFT 1709, and stores a voltage between a gate and a source of the TFT 1709. Predetermined electric potentials are input to the electric current supply line 1705 and to the other electrode of the EL element 1711, which thus have a mutual electric potential difference.

Operation from write-in of a signal electric current through light emission is explained using FIGS. 18A to 18E. Reference numerals used within the figures denoting each portion are based on those of FIG. 17. FIGS. 18A to 18C show electric current flow schematically. FIG. 18D shows the relationship between the electric currents flowing in each pathway during write-in of the signal electric current, and FIG. 18E shows the voltage accumulating in the storage capacitor 1710 during the same write-in of the signal electric current, namely the voltage between the gate and the source of the TFT 1709.

First, pulses are input to the first gate signal line 1702 and the third gate signal line 1704, and the TFTs 1706 and 1707 turn on. The electric current flowing in the source signal line 1701 at this point, namely the signal electric current, is taken as $I_{data}$.

The electric current $I_{data}$ flows in the source signal line 1701, and therefore the electric current path within the pixel is divided into $I_1$ and $I_2$, as shown in FIG. 18A. The relationship between the two is shown in FIG. 18D. Note that $I_{data}=I_1+I_2$.

Electric charge is not yet stored in the storage capacitor 1710 at the instant when the TFT 1706 turns on, and therefore the TFT 1709 is off. Consequently, $I_2=0$, and $I_{data}=I_1$. That is, electric current only flows due to the accumulation of electric charge in the storage capacitor 1710 during this period.

Electric charge then accumulates gradually in the storage capacitor 1710, and an electric potential difference starts to develop between both electrodes (see FIG. 18E). The TFT 1709 turns on when the electric potential difference between both electrodes reaches Vth (point A in FIG. 18E), and $I_2$ develops. $I_{data}=I_1+I_2$, as discussed above, and therefore $I_1$ is gradually reduced. Electric current still flows, and in addition, electric charge accumulates in the storage capacitor.

Electric charge continues to accumulate in the storage capacitor 1710 until the electric potential difference between both electrodes in the storage capacitor 1710, namely the voltage between the gate and the source of the TFT 1709, becomes a desired voltage, that is, becomes a voltage (VGS) at which the TFT 1709 causes as much as possible for the electric current $I_{data}$ to flow. When the accumulation of electric charge is then complete (point B in FIG. 18E), the electric current $I_1$ stops flowing, and in addition, an electric current corresponding to VGS flows in the TFT 1709 at this point, and $I_{data}=I_2$ (see FIG. 18B). Signal write-in operations are thus complete. Selection of the first gate signal line 1702 and the third gate signal line 1704 is finally completed, and the TFTs 1706 and 1707 turn off.

A pulse is then input to the second gate signal line 1703, and the TFT 1708 turns on. The previously written in VGS is stored in the storage capacitor 1710 at this point, and therefore the TFT 1709 is on, and the electric current $I_{data}$ flows from the electric current supply line 1705. The EL element 1711 thus emits light. If the TFT 1709 is operated in the saturated region at this point, then $I_{data}$ can be made to flow without changing, even if there is some changes in the voltage between the source and the drain of the TFT 1709.

A third structure example is shown in FIG. 19. A pixel of FIG. 19 has a source signal line 1901, a first gate signal line 1902, a second gate signal line 1903, an electric current supply line 1904, TFTs 1905 to 1908, a storage capacitor 1909, an EL element 1910, and a current source for inputting signal electric current 1911.

A gate electrode of the TFT 1905 is connected to the first gate signal line 1902, a first electrode of the TFT 1905 is connected to the source signal line 1901, and a second electrode of the TFT 1906 is connected to a first electrode of the TFT 1906 and a first electrode of the TFT 1907. A gate electrode of the TFT 1906 is connected to the second gate signal line 1903, and a second electrode of the TFT 1906 is connected to a gate electrode of the TFT 1907 and a gate electrode of the TFT 1908. A second electrode of the TFT 1907 and a first electrode of the TFT 1908 are both connected to the electric current supply line 1904, and a second electrode of the TFT 1908 is connected to an anode of the EL element 1910. The storage capacitor 1909 is connected between the gate electrodes of the TFTs 1907 and 1908, and the second electrode of the TFT 1907 and the first electrode of the TFT 1908. The storage capacitor 1909 stores the voltage between a gate and a source of the TFT 1907 and the voltage between a gate and a source of the TFT 1908. Predetermined electric potentials are input to the electric current supply line 1904 and a cathode of the EL element 1910, which thus have a mutual electric potential difference.

Operation from write-in of a signal electric current through light emission is explained using FIGS. 20A to 20E. Reference numerals used within the figures denoting each portion are based on those of FIG. 19. FIGS. 20A to 20C show electric current flow schematically. FIG. 20D shows the relationship between the electric currents flowing in each pathway during write-in of the signal electric current, and FIG. 20E shows the voltage accumulating in the storage capacitor 1909 during the same write-in of the signal electric current, namely the voltage between the gate and the source of the TFTs 1907 and 1908.

First, pulses are input to the first gate signal line 1902 and the second gate signal line 1903, and the TFTs 1905 and 1906 turn on. The electric current flowing in the source signal line 1901 at this point, namely the signal electric current, is taken as $I_{data}$.

The electric current $I_{data}$ flows in the source signal line 1901, and therefore the electric current path within the pixel is divided into $I_1$ and $I_2$, as shown in FIG. 20A. The relationship between the two is shown in FIG. 20D. Note that $I_{data}=I_1+I_2$.

Electric charge is not yet stored in the storage capacitor 1909 at the instant when the TFT 1905 turns on, and therefore the TFTs 1907 and 1908 are off. Consequently, $I_2=0$, and $I_{data}=I_1$. That is, electric current only flows due to the accumulation of electric charge in the storage capacitor 1909 during this period.

Electric charge then accumulates gradually in the storage capacitor 1909, and an electric potential difference starts to develop between both electrodes (see FIG. 20E). The TFT 1907 turns on when the electric potential difference between both electrodes reaches Vth (point A in FIG. 20E), and $I_2$ develops. $I_{data}=I_1+I_2$, as discussed above, and therefore $I_1$ is gradually reduced. Electric current still flows, and in addition, electric charge accumulates in the storage capacitor.

The TFT 1907 is on here, and the TFT 1908 is also on, and electric current begins to flow. However, this electric current flows in an independent path as shown in FIG. 20A, and therefore the value of $I_{data}$ does not change, and there is also no influence on $I_1$ and $I_2$.

Electric charge continues to accumulate in the storage capacitor 1909 until the electric potential difference between both electrodes in the storage capacitor 1909, namely the voltage between the gates and the sources of the TFTs 1907 and 1908, becomes a desired voltage, that is, becomes a voltage (VGS) at which the TFT 1907 causes as much as possible for the electric current $I_{data}$ to flow. When the accumulation of electric charge is then complete (point B in FIG. 20E), the electric current $I_1$ stops flowing, and in addition, an electric current corresponding to VGS flows in the TFT 1907 at this point, and $I_{data}=I_2$ (see FIG. 20B). Signal write-in operations are thus complete. Selection of the first gate signal line 1902 and the second gate signal line 1903 is finally completed, and the TFTs 1905 and 1906 turn off.

An electric charge is stored in the storage capacitor 1909 at this point such that the flow of the electric current $I_{data}$ in the TFT 1907 will impart as much voltage as possible between the gate and the source. The TFTs 1907 and 1908 form a current mirror, and therefore this voltage is also imparted to the TFT 1908 and electric current flows in the TFT 1908. This electric current is denoted by reference symbol $I_{EL}$ in FIGS. 20A to 20E.

$I_{EL}=I_{data}$ provided that the gate length and the channel width of the TFT 1907 and the TFT 1908 are equal. That is, the relationship between the signal electric current $I_{data}$ and the electric current $I_{EL}$ flowing in the EL element can be determined by the method of determining the size of the TFTs 1907 and 1908 structuring the current mirror.

A merit of the electric current write-in shown in the above example is that a voltage between the gate and the source necessary for making the electric current $I_{data}$ flow is stored in the storage capacitor 610, even for cases in which there is dispersion in the characteristics of the TFT 608 and the like. A desired electric current can therefore be accurately supplied to the EL element, and consequently it becomes possible to control dispersions in brightness caused by dispersion in the TFT characteristics.

Characteristics of each structure are shown in Table 1.

TABLE 1

|  | 1st structure | 2nd structure | 3rd structure |
|---|---|---|---|
|  | (FIG. 6) | (FIG. 17) | (FIG. 19) |
| relationship between signal current $I_{data}$ and current IEL flowing in EL element | $I_{data}$ = IEL | $I_{data}$ = IEL | $I_{data}$ ≠ IEL |
| relationship between current-voltage converter TFT and driver TFT | converter TFT: 608 driver TFT: 608 →common | converter TFT: 1709 driver TFT: 1709 →common | converter TFT: 1907 driver TFT: 1908 |
| signal current in write-in period | current doesn't flow in EL element | current flows in EL element | current doesn't flow in EL element |
| numbers of gate signal line | 3 | 3 | 2 |

First, consider the relationship between the signal electric current $I_{data}$ and the electric current $I_{EL}$ flowing in the EL element. Gray scales are expressed by the value of the electric current in semiconductor devices using an analog gray scale method, and therefore a large current flows for a high gray scale, and a small amount of current flows for a low gray scale. That is, the size of the write-in signal electric current differs by gray scale. In this case, a longer amount of time is thus needed for writing low gray scale signals into the pixels than for writing high gray scale signals into the pixels. Further, the current is small for low gray scale signals, and therefore they are very easily influenced by noise.

Next, consider the relationship between a current-voltage converter TFT, and a driver TFT. The current-voltage converter TFT is a TFT used for converting the signal electric current input from the source signal line into a voltage signal, and the driver TFT is a TFT for making current flow in accordance with the voltage stored in the storage capacitor. Figure numbers for the current-voltage converter TFT (denoted as converter TFT) and the driver TFT for each structure are shown in Table 1.

The fact that the converter TFT and the driver TFT are common means that common TFTs are used for write-in and light emission operations. The influence due to TFT dispersion is therefore small. On the other hand, for cases in which the converter TFT and the driver TFT are different, as shown in the third structure, there is influence due to dispersion in the characteristics within the pixels.

Consider the signal electric current pathways next. The signal electric current flows from the electric current source to the electric current supply line, or from the electric current supply line to the electric current source, in the first structure and the third structure. On the other hand, the signal electric current flows from the electric current source through the EL element when the signal electric current is written in when using the second structure. The EL element itself becomes a load with this type of structure for cases in which a high gray scale signal is written in after the write-in of a low gray scale signal, and for cases in which the opposite operations are performed, and therefore it becomes necessary to lengthen the write-in time.

Furthermore, pixel control is performed using three gate signal lines per row of pixels for the first and the second structures, and therefore the aperture ratio is greatly reduced compared to a conventional semiconductor device.

SUMMARY OF THE INVENTION

An object of the present invention is to provide a semiconductor device capable of solving the various problem points discussed above, without increasing the number of signal lines.

One of the problems due to conventional electric current write-in type is that electric current flow for write-in of signal and the electric current flow in EL elements during light emission are the same size. That is, to solve the problem, the electric current flow for write-in signal can be made larger at all time than the electric current flow in EL element during light emission.

To make a difference between electric currents, a difference is given to the size of electric current flow in a transistor. In this embodiment, giving an attention to a gate length L, the gate length L of a transistor in which an electric current flowing during write-in of signal electric current is made shorter than the gate length L of a transistor in which electric current that is supplied to EL elements flowing during light emission. Thus, write-in is performed by having a larger electric current flow than the electric current flow in conventional EL elements. Therefore, it can solve the problem that a large amount of time is needed in case of low gray scale, and further, it can prevent the influence of a noise to a signal.

In addition, common transistors are used for a part of transistors during write-in and light emission so that the dispersion of transistor characteristics is hard to influence to luminance in comparison with using a structure in which different transistors are used during write-in and light emission.

The organization of the present invention is described as follows.

A semiconductor device of the present invention is characterized in that it comprises:
  a first means for converting an input signal electric current into a voltage, and supplying an electric current corresponding to the converted voltage from an electric power source to a load;
  a second means for storing the converted voltage;
  a third means for selecting to store or to release the voltage in the second means; and
  a fourth means for blocking the supply of electric current from the electric power source to the load in a period for inputting the signal electric current, and supplying electric current corresponding to the converted voltage from the electric power source to the load in a period for driving the load.

A semiconductor device of the present invention is characterized in that it comprises:
  a first means for converting an input signal electric current into a voltage, and supplying an electric current corresponding to the converted voltage from an electric power source to a load;
  a second means for storing the converted voltage;
  a third means for selecting to store or to release the voltage in the second means;
  a fourth means for blocking the supply of electric current from the electric power source to the load in a period for inputting the signal electric current, and supplying electric current corresponding to the converted voltage from the electric power source to the load in a period for driving the load; and a fifth means of controlling the input of the signal electric current to the first means.

A semiconductor device of the present invention is characterized in that it comprises:

a first means for converting an input signal electric current into a voltage, and supplying an electric current corresponding to the converted voltage from an electric power source to a load;

a second means for storing the converted voltage;

a third means for selecting to store or to release the voltage in the second means;

a plurality of fourth means, connected in parallel, for: blocking the supply of electric current from the electric power source to the load in a period for inputting the signal electric current, and supplying electric current corresponding to the converted voltage from the electric power source to the load in a period for driving the load;

a fifth means for controlling the input of the signal electric current to the first means; and a plurality of sixth means for selecting at least one of the plurality of the fourth means, to form electric current supply pathways from the electric power source to the load.

A semiconductor device of the present invention is characterized in that it comprises:

a plurality of first means, connected in parallel, for converting an input signal electric current into a voltage, and supplying an electric current corresponding to the converted voltage from an electric power source to a load;

a second means for storing the converted voltage;

a third means for selecting to store or to release the voltage in the second means;

a fourth means for blocking the supply of electric current from the electric power source to the load in a period for inputting the signal electric current, and supplying electric current corresponding to the converted voltage from the electric power source to the load in a period for driving the load;

a fifth means for controlling the input of the signal electric current to the plurality of the first means; and a plurality for sixth means of selecting at least one of the plurality of the first means, to form electric current supply pathways from the electric power source to the load.

A semiconductor device of the present invention is characterized in that it comprises:

a converter and driver transistor for converting an input signal electric current into a voltage and supplying an electric current corresponding to the converted voltage from an electric power source to a load;

a storage capacitive means for storing the converted voltage;

a storage transistor in the storage capacitive means, for selecting whether to store or to release the voltage; and a driver transistor for blocking the supply of electric current form the electric power source to the load in a period during which the signal electric current is input, and supplying electric current corresponding to the converted voltage from the electric power source to the load in a period for driving the load.

A semiconductor device of the present invention is characterized in that it comprises:

a converter and driver transistor for converting an input signal electric current into a voltage and supplying an electric current corresponding to the converted voltage from an electric power source to a load;

a storage capacitive means for storing the converted voltage;

a storage transistor in the storage capacitive means, for selecting whether to store or to release the voltage;

a driver transistor for blocking the supply of electric current form the electric power source to the load in a period during which the signal electric current is input, and supplying electric current corresponding to the converted voltage from the electric power source to the load in a period for driving the load; and a switching transistor for controlling the input of the signal electric current to the converter and driver transistor.

A semiconductor device of the present invention is characterized in that it comprises:

a converter and driver transistor for converting an input signal electric current into a voltage and supplying an electric current corresponding to the converted voltage from an electric power source to a load;

a storage capacitive means for storing the converted voltage;

a storage transistor in the storage capacitive means, for selecting whether to store or to release the voltage;

a plurality of driver transistors, connected in parallel, for blocking the supply of electric current form the electric power source to the load in a period during which the signal electric current is input, and supplying electric current corresponding to the converted voltage from the electric power source to the load in a period for driving the load;

a switching transistor for controlling the input of the signal electric current to the converter and driver transistor;

a plurality of electric current selection transistors that select at least one of the plurality of driver transistors, and make electric current supply pathways from the electric power source to the load.

A semiconductor device of the present invention is characterized in that it comprises:

a plurality of converter and driver transistors, connected in parallel, for converting an input signal electric current into a voltage and supplying an electric current corresponding to the converted voltage from an electric power source to a load;

a storage capacitive means for storing the converted voltage;

a storage transistor in the storage capacitive means, for selecting whether to store or to release the voltage;

a driver transistor for blocking the supply of electric current form the electric power source to the load in a period during which the signal electric current is input, and supplying electric current corresponding to the converted voltage from the electric power source to the load in a period for driving the load;

a switching transistor for controlling the input of the signal electric current to the plurality of the converter and driver transistors; and a plurality of electric current selection transistors that select at least one of the plurality of the converter and driver transistors, and make electric current supply pathways from the electric power source to the load.

A semiconductor device of the present invention is characterized in that:

a plurality of the electric current supply pathways from the electric power source to the load are arranged in parallel; and electric current is supplied to the load using at least one of the plurality of the electric current supply pathways.

A semiconductor device of the present invention is characterized in that:

electric current supply to light emitting elements occurs along pathways that differ according to time by chronologically switching between the plurality of the electric current supply paths.

A semiconductor device of the present invention is characterized in that:

the storage capacitive means stores voltage between a gate and a source of the converter and driver transistor; and the storage transistor provides conductivity, or non-conductivity, between a gate electrode and a drain electrode of the converter and driver transistor by turning on and off.

A semiconductor device of the present invention is characterized in that:

the converter and driver transistor has the same polarity as the driver transistors.

A semiconductor device of the present invention is characterized in that:

the converter and driver transistor and the driver transistors are disposed in series in the electric current supply pathways from the electric power source to the load, and their gate electrodes are electrically connected.

The semiconductor device of the present invention is characterized in that:

the signal electric current pathways is via at least the first means; and the electric current pathways for supplying the load from the electric power source when the load is operating is via at least the first means and the fourth means.

A semiconductor device of the present invention is characterized in that:

the signal electric current pathways is via at least a source and a drain of the converter and driver transistor; and the electric current pathways for supplying the load from the electric power source when driving the load is via at least the source and the drain of the converter and driver transistor, and a source and a drain of the driver transistor.

A semiconductor device of the present invention is characterized in that:

the relationship between the signal electric current, denoted by $I_{data}$, and the electric current supplied to the load from the electric power source, denoted by $I_{EL}$, is $I_{data} \geq I_{EL}$.

A semiconductor device of the present invention is characterized in that:

the load is a light emitting element containing an electroluminescence element.

BRIEF DESCRIPTION OF THE DRAWINGS

In the accompanying drawings:

FIGS. 21A to 21C are diagrams for explaining a process of manufacturing a semiconductor device;

FIGS. 22A to 22C are diagrams for explaining the process of manufacturing a semiconductor device;

FIGS. 23A and 23B are diagrams for explaining the process of manufacturing a semiconductor device;

FIGS. 34A and 34B are diagrams showing an example element layout and its equivalent circuit diagram, respectively;

DETAILED DESCRIPTION OF THE PREFERRED EMBODIMENTS

Embodiment Mode 1

Figure 1A:
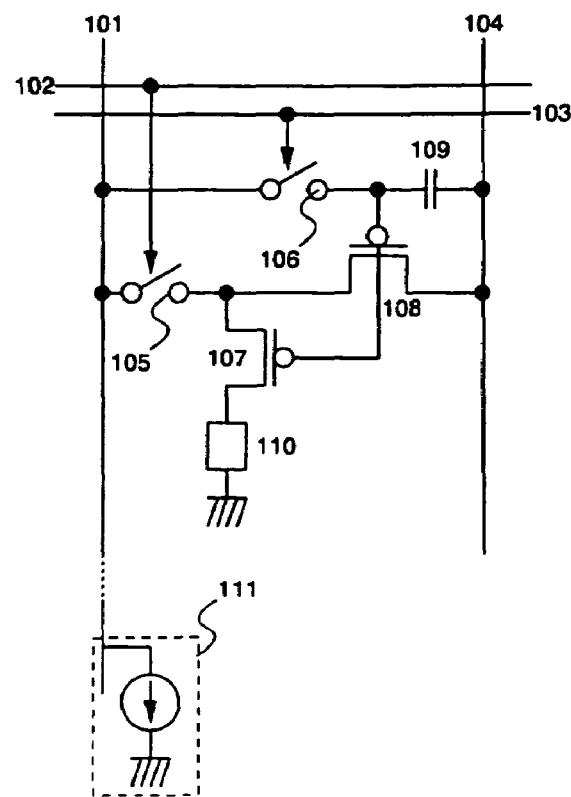
FIGS. 1A and 1B are diagrams showing embodiment modes of the present invention.

A structure of the present invention is shown in FIG. 1A. A pixel of FIG. 1A has a source signal line 101, first and second gate signal lines 102 and 103, an electric current supply line 104, a first switching element 105, a second switching element 106, a driver TFT 107, a converter and driver TFT 108, a storage capacitor 109, an EL element 110, and a current source for inputting signal electric current 111.

Note that the storage capacitor 109 may be formed as a capacitive element by using wirings, active layers, gate materials, and the like, with an insulating layer in between, and may also be eliminated by using a transistor gate capacitor instead. That is, provided that it has the capability to store the voltage between a gate and a source of the converter and driver TFT 108 for a required period of time, any structure may be used.

The first switching element 105 is controlled by the first gate signal line 102. A first electrode of the first switching element 105 is connected to the source signal line 101, a second electrode of the first switching element 105 is connected to a first electrode of the driver TFT 107 and a first electrode of the converter and driver TFT 108. The second switching element 106 is controlled by the second gate signal line 103. A first electrode of the second switching element 106 is connected to a gate electrode of the driver TFT 107 and a gate electrode of the converter and driver TFT 108, and a second electrode of the second switching element 106 is connected to the source signal line 101. A second electrode of the driver TFT 107 is connected to an anode of the EL element 110, and a second electrode of the converter and driver TFT 108 is connected to the electric current supply line 104. The storage capacitor 109 is connected between the gate electrode and the second electrode of the converter and driver TFT 108, and stores the voltage between a gate and a source of the converter and driver TFT 108. Predetermined electric potentials are input to the electric current supply line 104 and a cathode of the EL element 110, which thus have a mutual electric potential difference.

Note that it is preferable that the storage capacitor 109 be connected between the gate and the source of the converter and driver TFT 108.

Figure 1B:
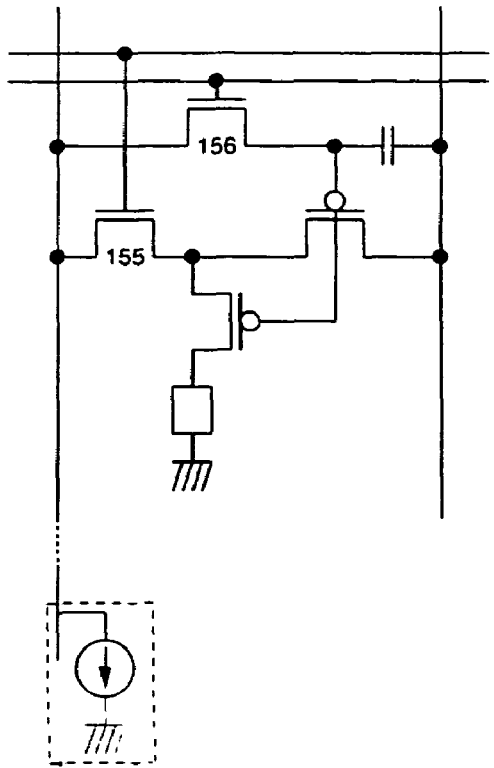

The first and the second switching elements may be formed using TFTs having structures similar to those of other TFTs. An example in which the first switching element 105 and the second switching element 106 are formed by a switching TFT 155 and a storage TFT 156, respectively, is shown in FIG. 1B. The switching TFT 155 and the storage TFT 156 only work as switches for selecting conductivity or non-conductivity by turning on and off, and therefore no limitations are placed on their polarities.

Without being limited to Embodiment Mode 1, there are no limitations placed on TFT polarity when using TFTs as switching elements. In addition, although transistors, in particular TFTs, are used here, transistors formed on single crystal silicon or SOI may also be used.

Figure 2A:
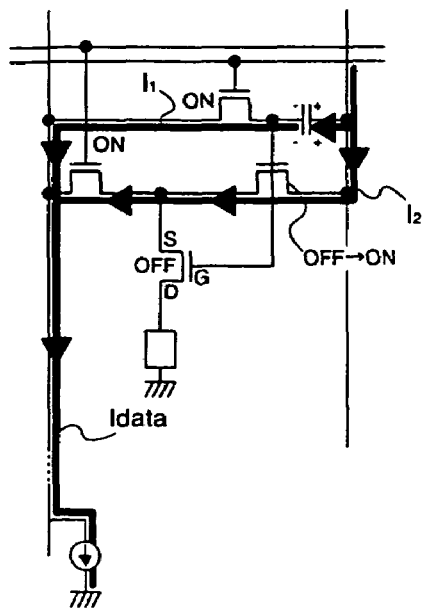
FIGS. 2A to 2E are diagrams for explaining operation and electric current pathways during signal write-in and light emission for the pixels shown in FIGS. 1A and 1B.
Figure 2B:
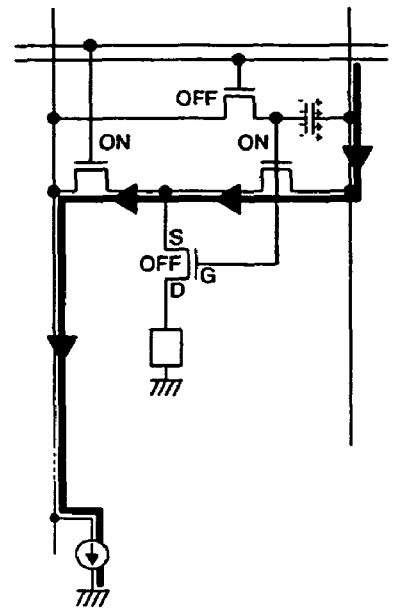
Figure 2C:
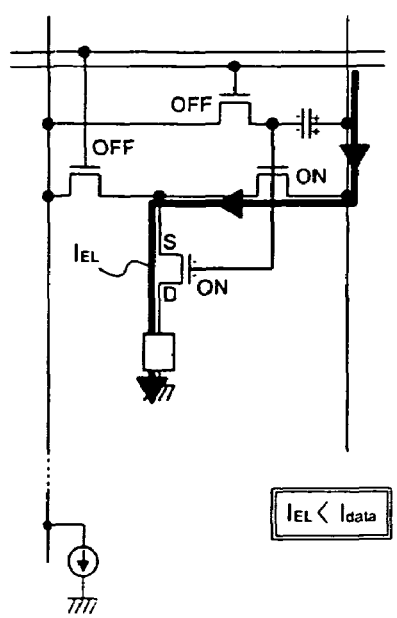
Figure 2D:
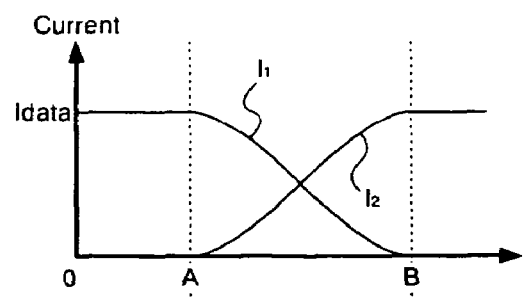
Figure 2E:
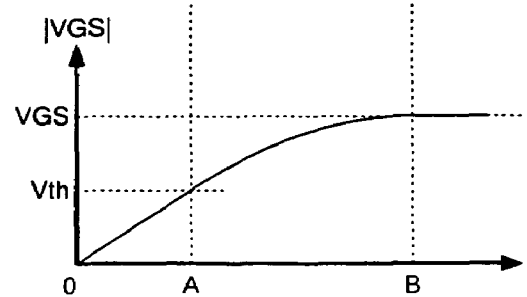

Operation from signal electric current write-in to light emission is explained using FIGS. 2A to 2E. Reference numerals denoting each portion within the figures are based on FIGS. 1A and 1B. FIGS. 2A to 2C show electric current flow schematically during signal input, completion of signal input, and light emission, respectively. FIG. 2D shows the relationship between the electric currents flowing in each pathway during write-in of the signal electric current, and FIG. 2E shows the voltage accumulating in the storage capacitor during the same write-in of the signal electric current, namely the voltage between the gate and the source of the TFT 108.

First, pulses are input to the first gate signal line 102 and the second gate signal line 103, and the switching TFT 155 and the storage TFT 156 turn on. The electric current flowing in the source signal line at this point is taken as $I_{data}$.

The electric current $I_{data}$ flows in the source signal line, and therefore the electric current pathway within the pixel is divided into $I_1$ and $I_2$, as shown in FIG. 2A. The relationship between the two is shown in FIG. 2D. Note that $I_{data}=I_1+I_2$. Further, the electric potential of the gate electrode of the driver TFT 107 becomes equal to the electric potential of an input electrode of the driver TFT 107 at this point due to the switching TFT 155 and the storage TFT 156 both being on. That is, the voltage between the gate and the source is zero, and therefore the driver TFT 107 turns itself off. If the driver TFT 107 is assumed to turn on in this state, then electric current flows in the EL element 111, and the electric current $I_{data}$ cannot be set accurately.

Electric charge is not yet stored in the storage capacitor 109 at the instant when the switching TFT 155 turns on, and therefore the converter and driver TFT 108 is off. Consequently, $I_2=0$, and $I_{data}=I_1$. That is, electric current only flows due to the accumulation of electric charge in the storage capacitor 109 during this period.

Electric charge then accumulates gradually in the storage capacitor 109, and an electric potential difference starts to develop between both electrodes (see FIG. 2D). The converter and driver TFT 108 turns on when the electric potential difference between both electrodes exceeds Vth (point A in FIG. 2E), and $I_2$ develops. $I_{data}=I_1+I_2$, as discussed above, and therefore $I_1$ is gradually reduced. Electric current still flows, and in addition, electric charge accumulates in the storage capacitor.

Electric charge continues to accumulate in the storage capacitor 109 until the electric potential difference between both electrodes in the storage capacitor 109, namely the voltage VGS between the gate and the source of the converter and driver TFT 108, becomes a desired voltage, that is, becomes a voltage (VGS) at which the converter and driver TFT 108 causes as much as possible for the electric current $I_{data}$ to flow. When the accumulation of electric charge is then complete (point B in FIG. 2E), the electric current $I_1$ stops flowing, and in addition, an electric current corresponding to VGS flows in the converter and driver TFT 108 at this point, and $I_{data}=I_2$ (see FIG. 2B). Selection of the second gate signal line 103 is then completed, the storage TFT 156 turns off, and signal write-in operations are completed.

Light emission operations are covered next. The switching TFT 155 turns off when selection of the first gate signal line 102 is complete. An electric current path from the electric current supply line to the switching TFT 105 and to the electric current source is thus cutoff, and therefore a portion of the electric charge stored in the storage capacitor 109 in order for the electric current $I_{data}$ to flow in the converter and driver TFT 108 up to this point is transferred to the gate electrode of the driver TFT 107. The driver TFT 107 thus automatically turns on. Consequently, an electric current path from the electric current supply line to the converter and driver TFT 108 to the driver TFT 107 and to the EL element 110 develops as shown in FIG. 2C, and the electric current $I_{EL}$ is made to flow. The EL element 110 thus emits light.

The gate electrode of the converter and driver TFT 108 and the gate electrode of the driver TFT 107 are connected, and therefore the converter and driver TFT 108 and the driver TFT 107 function as one multi-gate TFT at this point. Generally, if the gate length L in a TFT becomes longer, the drain current becomes smaller. In this case, the electric current is $I_{data}$ finally made to flow only in the converter and driver TFT 108 during signal write-in operations, while the electric current is $I_{EL}$ made to flow in the converter and driver TFT 108 and in the driver TFT 107 during light emission. The number of gate electrodes therefore becomes larger during light emission, the gate length L becomes longer as a result, and the relationship between the electric currents becomes $I_{data}>I_{EL}$. Note that the channel width W of the driver TFT 107 and the channel width W of the converter and driver TFT 108 may have the same size, and may also differ. The relationship between the gate lengths L is also similar.

Signal write-in through light emission are performed in accordance with the aforementioned procedures. In accordance with the present invention, write-in can also be performed using the electric current $I_{data}$, which is greater than the electric current $I_{EL}$ flowing in the EL element, during write-in for cases in which light is emitted by the EL element at a low gray scale. Trouble such as noise embedded in the signal electric current can therefore be avoided, and quick write-in operation becomes possible.

Further, the driver TFT 107 and the converter and driver TFT 108 operate as a multi-gate TFT during light emission, and therefore it is desirable that these TFTs have the same polarity. In addition, it is desirable that the polarity is p-channel for cases in which electric current flows in the direction of FIGS. 2A to 2E.

Figure 36A:
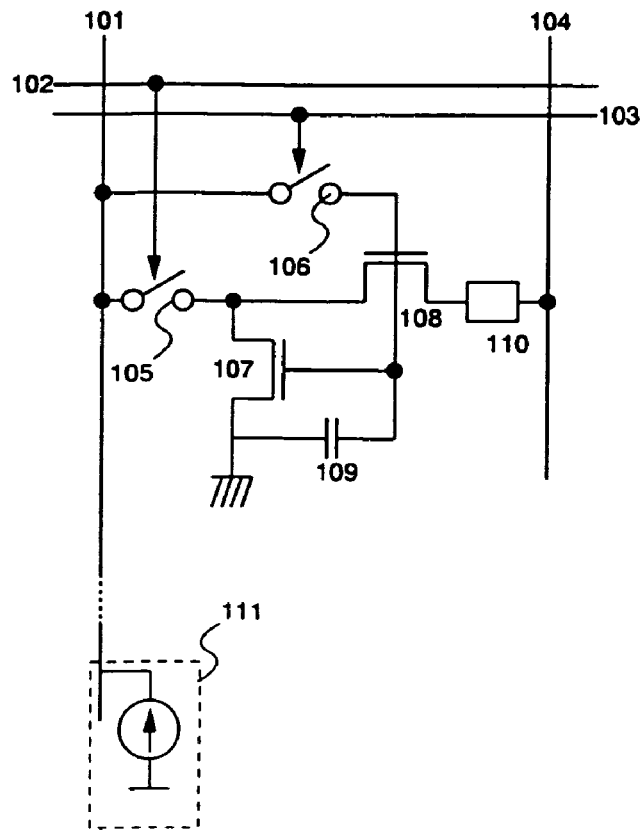
FIGS. 36A to 36C are diagrams of cases in which a portion of the pixel structure shown in FIGS. 1A and 1B is changed.
Figure 36B:
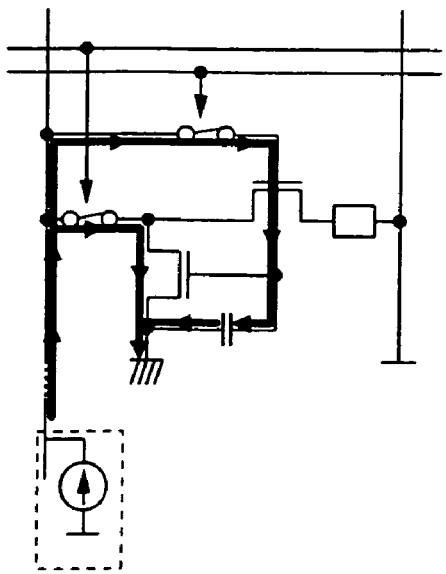
Figure 36C:
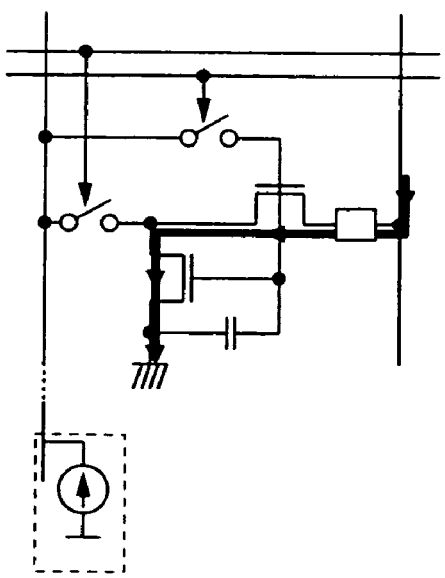

Note that the structure can easily be changed for cases in which the direction of the electric current flowing in the EL element 110 is opposite to that of FIGS. 2A to 2E. This structure is shown in FIGS. 36A to 36C. The polarity of the converter and driver TFT and the driver TFT is the reverse of the polarity used in FIGS. 2A to 2E. The electric current pathways during signal electric current write-in and light emission are as shown in FIGS. 36B and 36C.

In addition, the converter and driver TFT 108 is used during signal write-in and during light emission. That is, dispersion in the TFT characteristics can be made to influence signal write-in operations and light emission less by using a portion of common TFTs during signal write-in and light emission.

Further, a portion of the electric charge that has accumulated in the storage capacitor 109 is transferred to the gate electrode of the driver TFT 107 at the instant when light emission operations begin when moving from the state of FIG. 2B to the state of FIG. 2C. The voltage between the gate and the source of the TFT 108 stored in the storage capacitor 108 therefore becomes slightly smaller during light emission than the desired value during write-in. Consequently, the voltage between the gate and the source of the TFT moves very slightly in a direction making it more difficult for current to flow, and light emission of the element during black display due to a TFT off leak current can also be prevented for cases in which there is dispersion in the characteristics of the TFTs 107 and 108.

Note that, in Embodiment Mode 1, the switching TFT 155 and the storage TFT 156 are controlled to turn on and off by the first gate signal line 102 and the second gate signal line 103, respectively. On and off control may be performed simultaneously for cases in which the EL element emits light immediately after completion of signal write-in. The number of gate signal lines can therefore be reduced by connecting the gate electrodes of the switching TFT 155 and the storage TFT 156 to the same gate signal line and performing control for cases in which the switching TFT 155 and the storage TFT 156 have the same polarity.

Note that, although the explanation is presented here under the assumption that the EL element 110 is used as the load driven by the driver TFT 107 and the converter and driver TFT 108, and that this is applied to the pixel of a light emitting device, the present invention is not limited to this use. That is, it is also possible to drive a load such as a diode, a transistor, a capacitor, a resistor, or a circuit in which these loads are combined. This is similar to the other embodiment modes and embodiments.

Embodiment Mode 2

Figure 28A:
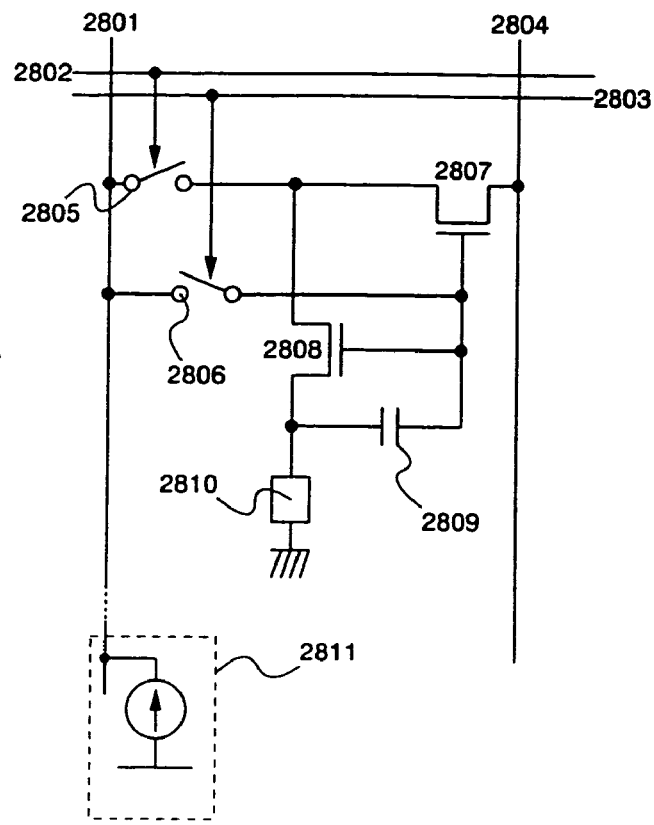
FIGS. 28A and 28B are diagrams showing another embodiment mode of the present invention.

Embodiment Mode 2 of the present invention is shown in FIG. 28A. A pixel of FIG. 28A has a source signal line 2801, first and second gate signal lines 2802 and 2803, an electric current supply line 2804, a first switching element 2805, a second switching element 2806, a driver TFT 2807, a converter and driver TFT 2808, a storage capacitor 2809, and an EL element 2810. Each source signal line has a current source for inputting signal electric current 2811.

Note that the storage capacitor 2809 may be formed as a capacitive element by using wirings, active layers, gate materials, and the like, with an insulating layer in between, and may also be eliminated by using a transistor gate capacitor instead. That is, provided that it has the capability to store the voltage between a gate and a source of the converter and driver TFT 2808 for a required period of time, any structure may be used.

The first switching element 2805 is controlled by the first gate signal line 2802. A first electrode of the first switching element 2805 is connected to the source signal line 2801, a second electrode of the first switching element 2805 is connected to a first electrode of the converter and driver TFT 2808 and a first electrode of the driver TFT 2807. The second switching element 2806 is controlled by the second gate signal line 2803. A first electrode of the second switching element 2806 is connected to the source signal line 2801, and a second electrode of the second switching element 2806 is connected to a gate electrode of the converter and driver TFT 2807 and a gate electrode of the driver TFT 2807. A second electrode of the driver TFT 2807 is connected to the electric current supply line 2804, and a second electrode of the converter and driver TFT 2808 is connected to one electrode of the EL element 2810. The storage capacitor 2809 is connected between the gate electrode and the second electrode of the converter and driver TFT 2808, and stores the voltage between a gate and a source of the converter and driver TFT 2808. Predetermined electric potentials are input to the electric current supply line 2804 and the other electrode of the EL element 2810, which thus have a mutual electric potential difference.

Note that it is preferable that the storage capacitor 2809 be connected between the gate and the source of the converter and driver TFT 2808.

Figure 28B:
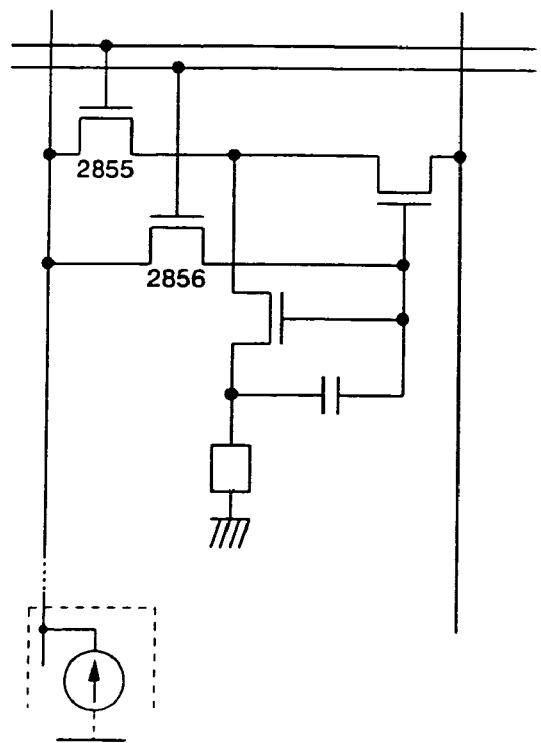

The first and the second switching elements may be formed using TFTs having structures similar to those of other TFTs. An example in which the first switching element 2805 and the second switching element 2806 are formed by a switching TFT 2855 and a storage TFT 2856, respectively, is shown in FIG. 28B. The switching TFT 2855 and the storage TFT 2856 only work as switches for selecting conductivity or non-conductivity by turning on and off, and therefore no limitations are placed on their polarities.

Figure 29A:
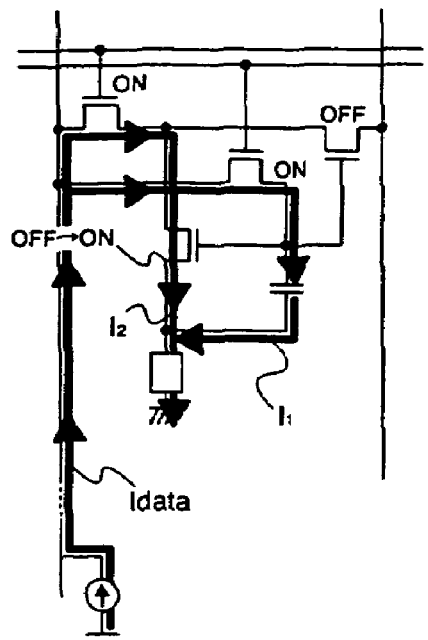
FIGS. 29A to 29E are diagrams for explaining operation and electric current pathways during signal write-in and light emission for a pixel shown in FIGS. 28A and 28B.
Figure 29B:
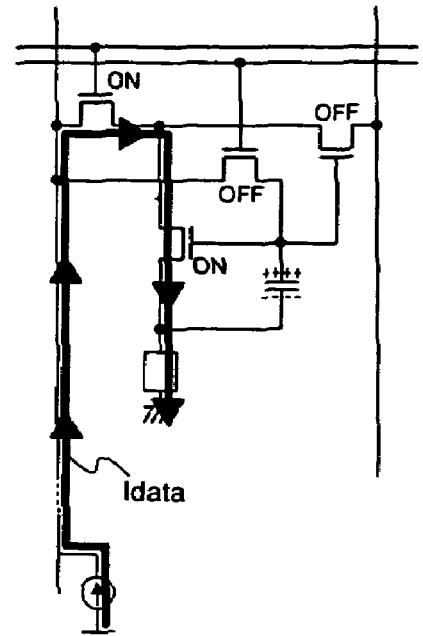
Figure 29C:
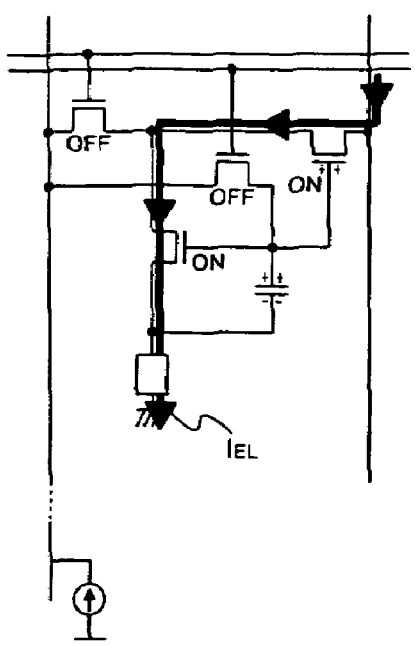
Figure 29D:
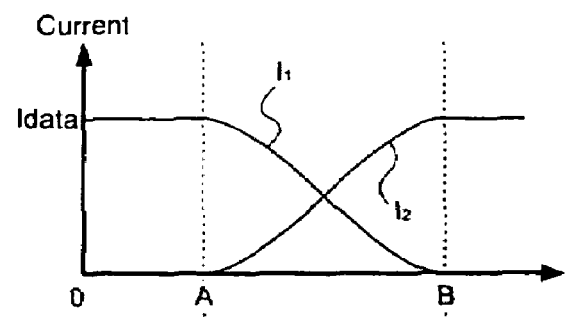
Figure 29E:
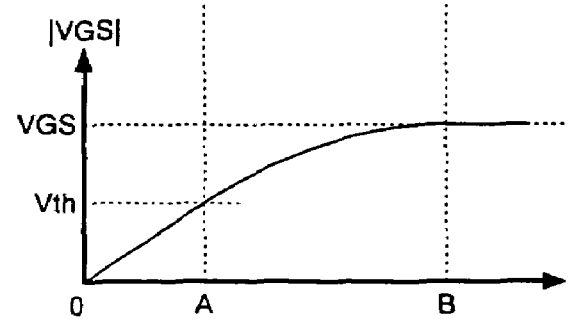

Operation from signal electric current write-in to light emission is explained using FIGS. 29A to 29E. Reference numerals denoting each portion within the figures are based on FIGS. 28A and 28B. FIGS. 29A to 29C show electric current flow schematically during signal input, completion of signal input, and light emission, respectively. FIG. 29D shows the relationship between the electric currents flowing in each pathway during write-in of the signal electric current, and FIG. 29E shows the voltage accumulating in the storage capacitor during the same write-in of the signal electric current, namely the voltage between the gate and the source of the TFT 2808.

First, pulses are input to the first gate signal line 2802 and the second gate signal line 2803, and the switching TFT 2855 and the storage TFT 2856 turn on. A signal electric current is input to the source signal line 2801 at this point, and is taken as $I_{data}$.

The electric current $I_{data}$ flows in the source signal line 2801. There is an electric current pathway within the pixel as shown in FIG. 29A, and $I_{data}$ follows this pathway, separated into $I_1$ and $I_2$. Note that $I_{data}=I_1+I_2$. Further, the electric potential of the gate electrode of the driver TFT 2807 becomes equal to the electric potential of the second electrode of the driver TFT 2807 at this point due to the switching TFT 2855 and the storage TFT 2856 both being on. That is, the voltage between the gate and the source becomes zero, and therefore the driver TFT 2807 turns itself off. If the driver TFT 2807 is assumed to turn on in this state, then electric current flows in the EL element 2810, and the electric current $I_{data}$ cannot be set accurately.

Electric charge is not yet accumulates in the storage capacitor 2809 at the instant when the switching TFT 2855 turns on, and therefore the converter and driver TFT 2808 is off. Consequently, $I_2=0$, and $I_{data}=I_1$. That is, electric charge accumulates in the capacitor 2809 here, and a corresponding electric current is generated.

Electric charge then accumulates gradually in the storage capacitor 2809, and an electric potential difference starts to develop between both electrodes. The converter and driver TFT 2808 turns on when the electric potential difference between both electrodes reaches Vth that is, a threshold value of the converter and driver TFT 2808 (point A in FIG. 29E), and $I_2$ develops. $I_{data}=I_1+I_2$, as discussed above, and therefore $I_1$ is gradually reduced, but does not reach zero until the accumulation of electric charge in the storage capacitor 2809 is complete, and the electric current is still made to flow.

Electric charge continues to accumulate in the storage capacitor 2809 until the electric potential difference between both electrodes of the storage capacitor 2809, namely the voltage between the gate and the source of the converter and driver TFT 2808, becomes a desired voltage, that is, becomes a voltage (VGS) at which the converter and driver TFT 2808 causes as much as possible for the electric current $I_{data}$ to flow. When the accumulation of electric charge is then complete (point B in FIG. 29E), the electric current $I_1$ stops flowing, and in addition, an electric current corresponding to VGS flows in the converter and driver TFT 2808 at this point, and $I_{data}=I_2$ (see FIG. 29B). Selection of the second gate signal line 2803 is then completed, and the storage TFT 2856 turns off. Selection of the first gate signal line 2802 is then complete, the switching TFT 2855 turns off, and signal write-in is complete.

Light emission operations are covered next. The switching TFT 2855 turns off when selection of the first gate signal line 2802 is complete. An electric current path from the source signal line 2801 to the switching TFT 2855 to the converter and driver TFT 2808 and to the EL element 2810 is thus cutoff, and therefore a portion of the electric charge stored in the storage capacitor 2809 in order for the electric current $I_{data}$ to flow in the converter and driver TFT 2808 up to this point is transferred to the gate electrode of the driver TFT 2807. The driver TFT 2807 thus automatically turns on. Consequently, an electric current pathway from the electric current supply line 2804 to the driver TFT 2807 to the converter and driver TFT 2808 and to the EL element 2810 develops as shown in FIG. 29C, and the light emitting electric current $I_{EL}$ is made to flow. The EL element 2810 thus emits light.

The gate electrode of the driver TFT 2807 and the gate electrode of the converter and driver TFT 2808 are connected, and therefore the two TFTs function as a multi-gate TFT at this point. Generally, if the gate length L in a TFT becomes longer, the drain current becomes smaller. In this case, the signal electric current is finally made to flow only in the converter and driver TFT 2808 during signal electric current write-in operations, while the light emitting electric current is made to flow in the driver TFT 2807 and in the converter and driver TFT 2808 during light emission. The number of gate electrodes therefore becomes larger during light emission, the gate length L becomes longer as a result, and the relationship between the electric currents becomes $I_{data}>I_{EL}$.

Note that the channel width W of the driver TFT 2807 and the channel width W of the converter and driver TFT 2808 may have the same size, and may also differ. The relationship between the gate lengths L is also similar.

Signal electric current write-in through light emission are performed in accordance with the aforementioned procedures. In accordance with the present invention, write-in can also be performed using the signal electric current $I_{data}$, which is greater than the light emitting electric current $I_{EL}$, during write-in for cases in which light is to be emitted by the EL element at a low gray scale. In addition, it becomes possible to shorten the amount of write-in time by performing write-in at a sufficiently large electric current, even if the EL element becomes a load.

Further, the driver TFT 2807 and the converter and driver TFT 2808 operate as a multi-gate TFT during light emission, for cases in which the switching TFT 2855 and the storage TFT 2856 have the same polarity.

A comparison in which the structures of Embodiment Mode 1 and Embodiment Mode 2 of the present invention have been added to those of Table 1 is shown in Table 2.

TABLE 2

|  | 1st structure (FIG. 6) | 2nd structure (FIG. 17) | 3rd structure (FIG. 19) | Embodiment Mode 1 (FIG. 1) | Embodiment Mode 2 (FIG. 28) |
| --- | --- | --- | --- | --- | --- |
| relationship between signal current $I_{data}$ and current IEL flowing in EL element | $I_{data}$ = IEL | $I_{data}$ = IEL | $I_{data} \neq$ IEL | $I_{data} \neq$ IEL | $I_{data} \neq$ IEL |
| relationship between current-voltage converter TFT and driver TFT | converter TFT: 608 driver TFT: 608 →common | converter TFT: 1709 driver TFT: 1709 →common | converter TFT: 1907 driver TFT: 1908 | converter TFT: 108 driver TFT: 107 + 108 | converter TFT: 2808 driver TFT: 2807 + 2808 |
| signal current in write-in period | current doesn't flow in EL element | current flows in EL element | current doesn't flow in EL element | current doesn't flow in EL element | current flows in EL element |
| numbers of gate signal line | 3 | 3 | 2 | 2 | 2 | and therefore it is desirable that these TFTs have the same polarity. In addition, it is desirable that the polarity be n-channel for cases in which electric current flows in the direction of FIGS. 29A to 29E.

Figure 37A:
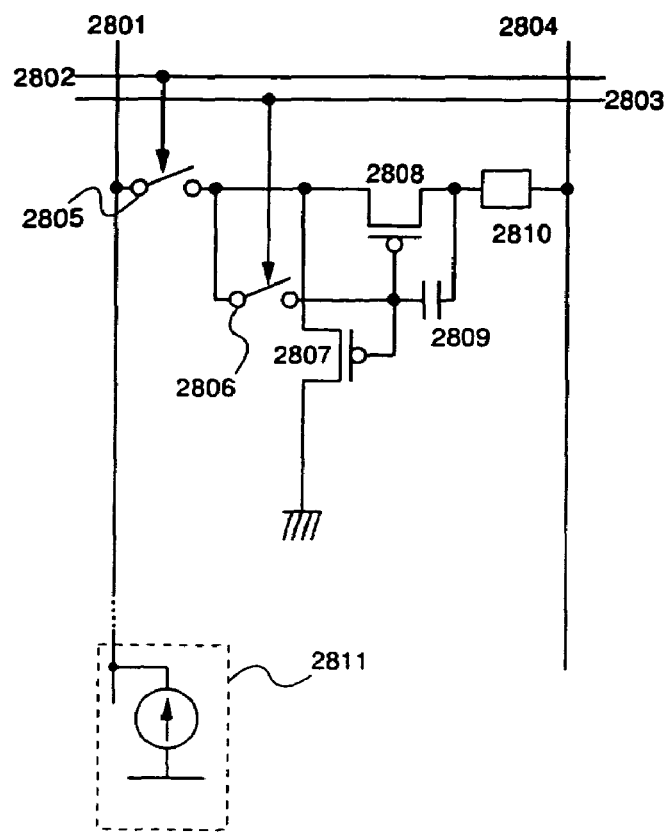
FIGS. 37A to 37C are diagrams of cases in which a portion of the pixel structure shown in FIGS. 28A and 28B is changed.
Figure 37B:
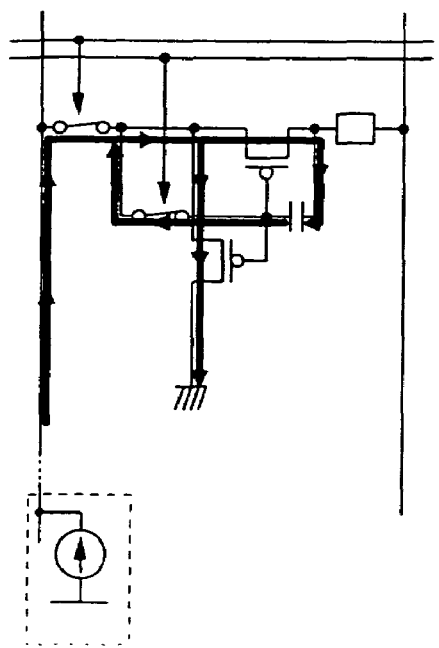

Furthermore, the structure can easily be changed for cases in which the direction of the electric current flowing in the EL element becomes opposite, similar to the explanation made in Embodiment Mode 1. This structure is shown in FIG. 37A. The polarity of the converter and driver TFT and the driver TFT is the reverse of the polarity used in FIGS. 29A to 29E. The electric current pathways during signal electric current write-in and light emission are as shown in FIGS. 37B and 37B. Similar changes are also possible for subsequent embodiments in this specification, and therefore later explanations are omitted.

In addition, the converter and driver TFT 2808 is used during signal write-in and during light emission. That is, dispersion in the TFT characteristics can be made to influence signal write-in operations and light emission less by using a portion of common TFTs during signal write-in and light emission.

Further, a portion of the electric charge that has accumulated in the storage capacitor 2809 is transferred to the gate electrode of the driver TFT 2807 at the instant when light emission operations begin when moving from the state of FIG. 29B to the state of FIG. 29C. The voltage between the gate and the source of the TFT 2808 stored in the storage capacitor 2809 therefore becomes slightly smaller during light emission than the desired value during write-in. Consequently, the voltage between the gate and the source of the TFT moves very slightly in a direction making it more difficult for current to flow, and light emission of the element during black display due to a TFT off leak current can also be prevented for cases in which there is dispersion in the characteristics of the TFTs 2807 and 2808.

Note that, in Embodiment Mode 2, the switching TFT 2855 and the storage TFT 2856 are controlled to turn on and off by the first gate signal line 2802 and the second gate signal line 2803, respectively. On and off control may be performed simultaneously for cases in which the EL element emits light immediately after completion of signal write-in. The number of gate signal lines can therefore be reduced by connecting the gate electrodes of the switching TFT 2855 and the storage TFT 2856 to the same gate signal line and performing control Further, the main point of the present invention is to receive the signal electric current input, perform storage of the electric current at an arbitrary timing, and to use the TFTs that become an electric current pathway as a multi-gate TFT during output sample and hold operations. Embodiment modes for pixels of an light emitting device using EL elements can typically be given in this specification, but the present invention is not limited to these uses in particular, and it is also effective to apply the present invention to analog circuits such as amplitude converter circuits.

EMBODIMENTS

Embodiments of the present invention are discussed below.

Embodiment 1

Figure 3A:
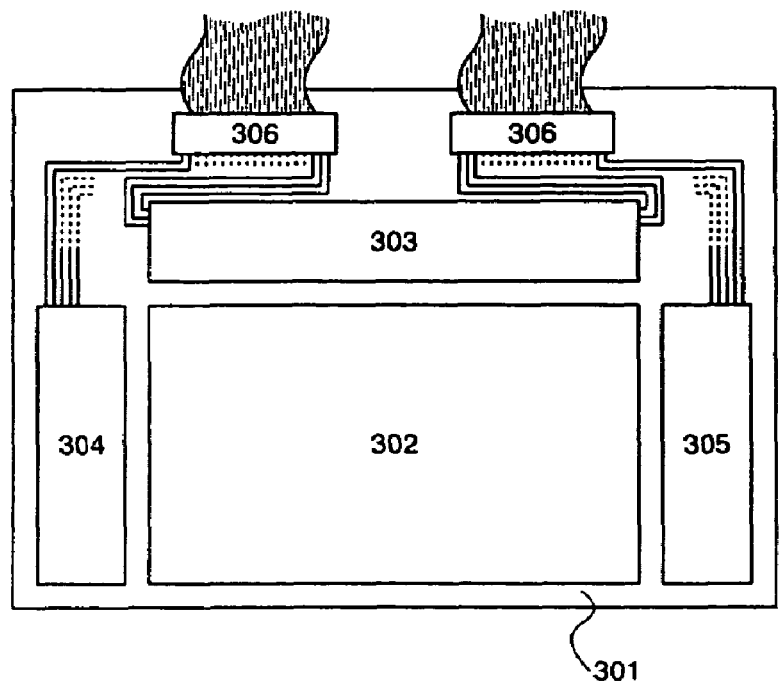
FIGS. 3A to 3C are diagrams showing an example of an analog image signal input semiconductor device of an embodiment mode of the present invention.

The structure of a semiconductor device for performing display using an analog image signal for an image signal is explained in Embodiment 1. An example of the structure of the semiconductor device is shown in FIG. 3A. There is a pixel portion 302, in which a plurality of pixels is arranged in a matrix shape, on a substrate 301. A source signal line driver circuit 303, and first and second gate signal line driver circuits 304 and 305 are in the periphery of the pixel portion 302. Although two gate signal line driver circuits are used in FIG. 3A, only one thereof need be used for cases in which it is not necessary to select a plurality of gate signal lines for pixel drive, as explained in the embodiment modes. Further, a structure in which the gate signal line driver circuits are disposed symmetrically at both ends of gate signal lines, and the gate signal lines are driven from both ends may also be used.

Signals input to the source signal line driver circuit 303, the first gate signal line driver circuit 304, and the second gate signal line driver circuit 305 are supplied from the outside through a flexible printed circuit (FPC) 306.

Figure 3B:
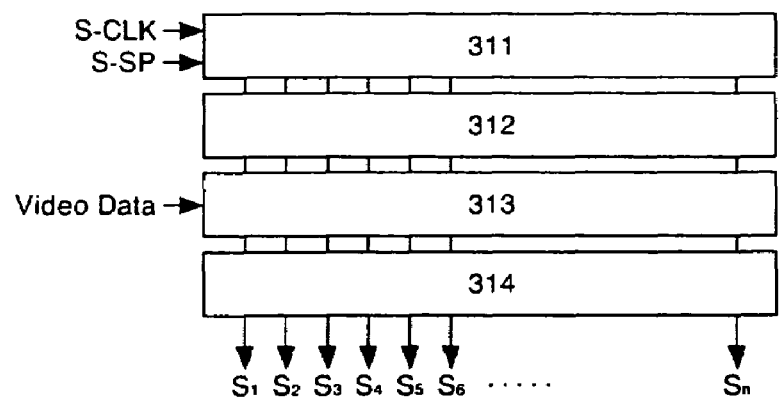

An example of the structure of the source signal line driver circuit is shown in FIG. 3B. The source signal line driver circuit is for performing display using an analog image signal as an image signal, and has a shift register 311, a buffer 312, a sampling circuit 313, and an electric current converter circuit 314. Level shifters and the like not shown in particular in the figure may also be added when necessary.

Figure 8:
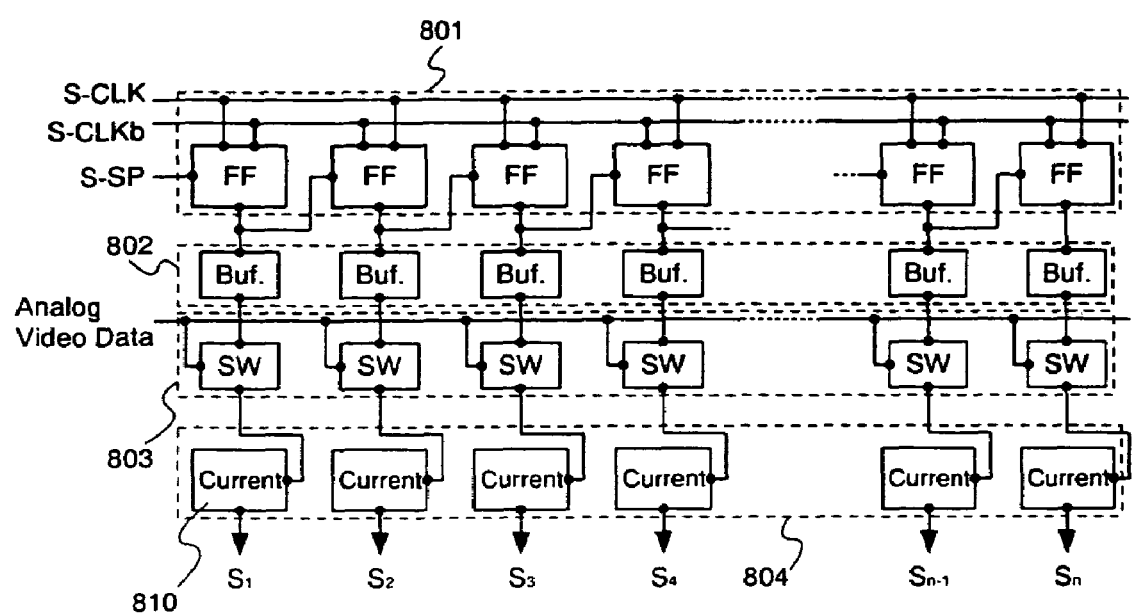
FIG. 8 is a diagram showing an example of the structure of a source signal line driver circuit in the semiconductor device shown in FIGS. 3A to 3C.

Operation of the source signal line driver circuit is explained next. A detailed structure is shown in FIG. 8, which will be referred to.

A shift register 801 is made by using a plurality of stages of flip flop circuits (FF) or the like, and inputs a clock signal (S-CLK), a clock inverted signal (S-CLKb) and a start pulse (S-SP). Sampling pulses are output one after another in accordance with the timing of these signals.

The sampling pulses output from the shift register 801 are input to the sampling circuit after being amplified through a buffer 802 and the like. A sampling circuit 803 is made using a plurality of stages of sampling switches (SW), and performs sampling of a certain column of the image signal in accordance with the timing of the input sampling pulses. Specifically, the sampling switches turn on when the sampling pulses are input to the sampling switches, and the electric potential of the image signal at that point is input to an electric current converter circuit 804 through the sampling switches.

The electric current converter circuit 804 is made using a plurality of stages of electric current setting circuits 810, and outputs a predetermined electric current to source signal lines ($S_i$, where $1 \leq i \leq n$) in accordance with the sampled image signal. Operation of the electric current setting circuits 810 is explained below using FIG. 10.

Figure 10:
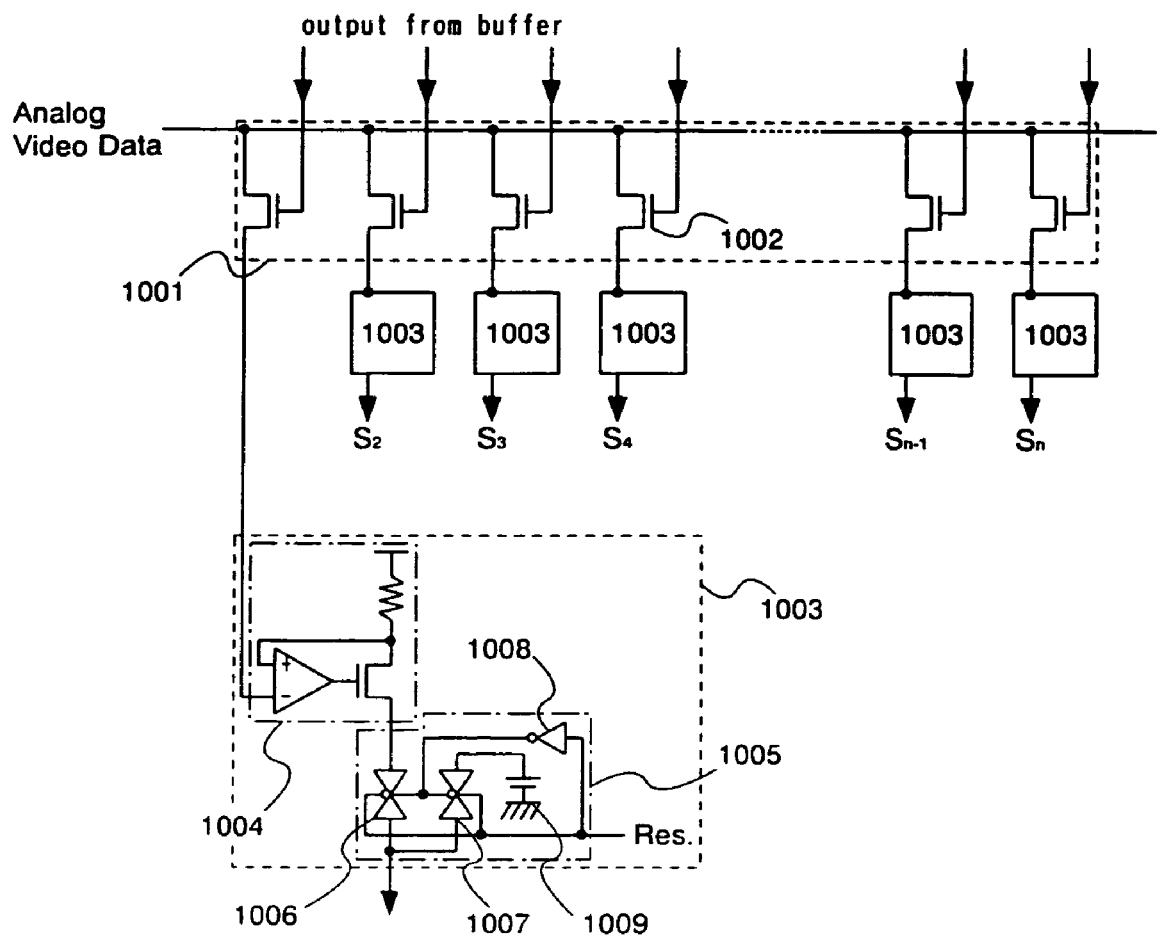
FIG. 10 is a diagram showing an example of the structure of a sampling circuit and an electric current converter circuit in the semiconductor device shown in FIGS. 3A to 3C.

FIG. 10 is a diagram showing the structure of the sampling circuit and the electric current converter circuit. Operation of a sampling circuit 1001 is as discussed above. Although a sampling switch 1002 here uses one TFT, analog switches and the like structured by using an n-channel TFT and a p-channel TFT may also be used.

An electric current converter circuit 1003 has an electric current output circuit 1004 and a reset circuit 1005, and converts a sampled voltage signal into an electric current signal. The image signal is input to the electric current output circuit 1004, and a predetermined signal electric current ($I_{data}$) is output in accordance with the electric potential of the input image signal. The electric current output circuit is structured using an op-amp and a TFT in FIG. 10, but there are no limitations in particular with this structure. Other structures may also be used, provided that they are capable of outputting a predetermined signal electric current in accordance with the electric potential of an input signal.

The signal electric current output from the electric current output circuit 1004 is input to the reset circuit 1005. The reset circuit 1005 has analog switches 1006 and 1007, an inverter 1008, and an electric power source 1009.

The analog switches 1006 and 1007 are both controlled by using a reset signal (Res.) and a reset signal inverted by an inverter 1008, and operate such that one is off when the other one is on.

A reset signal is not input during normal write-in, and therefore the analog switch 1006 is on, while the analog switch 1007 is off. The signal electric current output from the electric current output circuit 1004 is output to the source signal line at this point. On the other hand, the analog switch 1006 turns off if a reset signal is input, and the analog switch 1007 turns on. An electric potential imparted by the electric power source 1009 is applied as the electric potential of the source signal line, and the source signal line is reset. Note that the reset operation is performed in a horizontal return period or the like. Note also that it is preferable that the electric potential imparted from the electric power source 1009 be nearly equal to that of the electric current supply line in the pixel portion. That is, it is preferable that the amount of electric current flowing in the source signal line be able to be set to zero when the source signal line is reset.

Figure 3C:
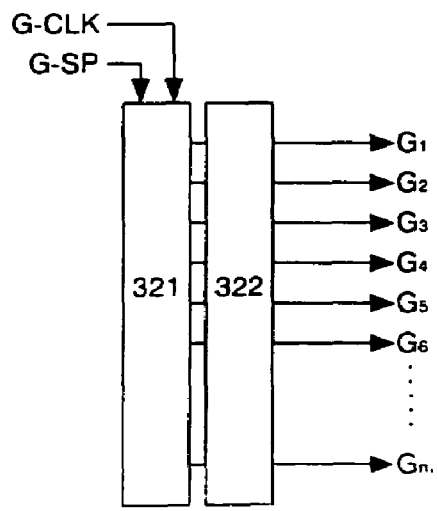

An example of the structure of the gate signal line driver circuit is shown in FIG. 3C. The gate signal line driver circuit has a shift register 321 and a buffer 322. Circuit operation is similar to that of the source signal line driver circuit, and the shift register 321 outputs pulses one after another in accordance with a clock signal and a start pulse. The pulses are input to the gate signal line after being amplified by the buffer 322, and one row at a time is placed in a selected state. The signal electric current is written in order from the source signal line into the pixel column controlled by the selected gate signal line.

Note that, although a shift register having a plurality of flip flops is shown in the figures as an example of the shift register, structures in which it is possible to select the signal lines using a decoder or the like may also be used.

Embodiment 2

Figure 4A:
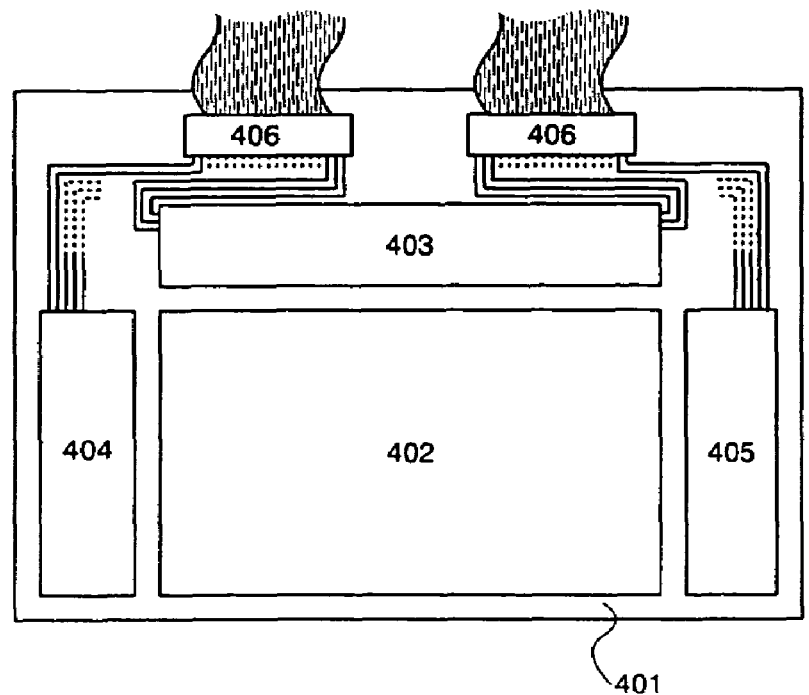
FIGS. 4A and 4B are diagrams showing an example of a digital image signal input semiconductor device of an embodiment mode of the present invention.

The structure of a semiconductor device for performing display using a digital image signal for an image signal is explained in Embodiment 2. An example of the structure of the semiconductor device is shown in FIG. 4A. There is a pixel portion 402, in which a plurality of pixels is arranged in a matrix shape, on a substrate 401. A source signal line driver circuit 403, and first and second gate signal line driver circuits 404 and 405 are in the periphery of the pixel portion 402. Although two gate signal line driver circuits are used in FIG. 4A, only one thereof need be used for cases in which it is not necessary to select a plurality of gate signal lines for pixel drive, as explained in the embodiment modes. Further, a structure in which the gate signal line driver circuits are disposed symmetrically at both ends of gate signal lines, and the gate signal lines are driven from both ends may also be used.

Signals input to the source signal line driver circuit 403, the first gate signal line driver circuit 404, and the second gate signal line driver circuit 405 are supplied from the outside through a flexible printed circuit (FPC) 406.

Figure 4B:
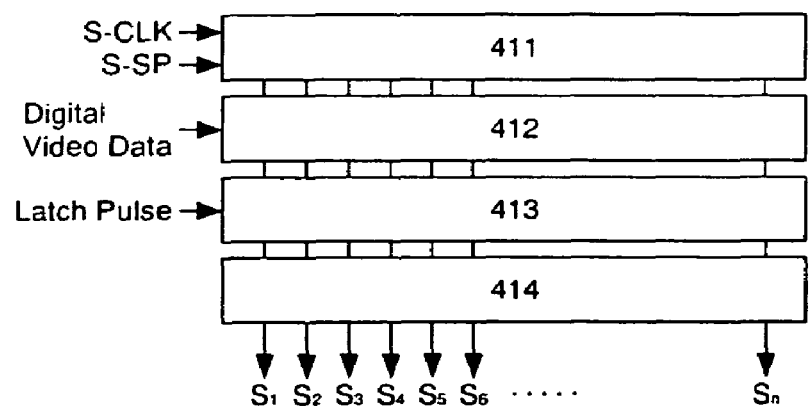

An example of the structure of the source signal line driver circuit is shown in FIG. 4B. The source signal line driver circuit is for performing display using a digital image signal as an image signal, and has a shift register 411, a first latch circuit 412, a second latch circuit 413, and a fixed electric current circuit 414. Level shifters and the like not shown in particular in the figure may also be added when necessary.

The gate signal line driver circuits 404 and 405 may be similar to those shown in Embodiment 1, and therefore they are not shown in the figures here, and an explanation thereof is omitted.

Figure 9:
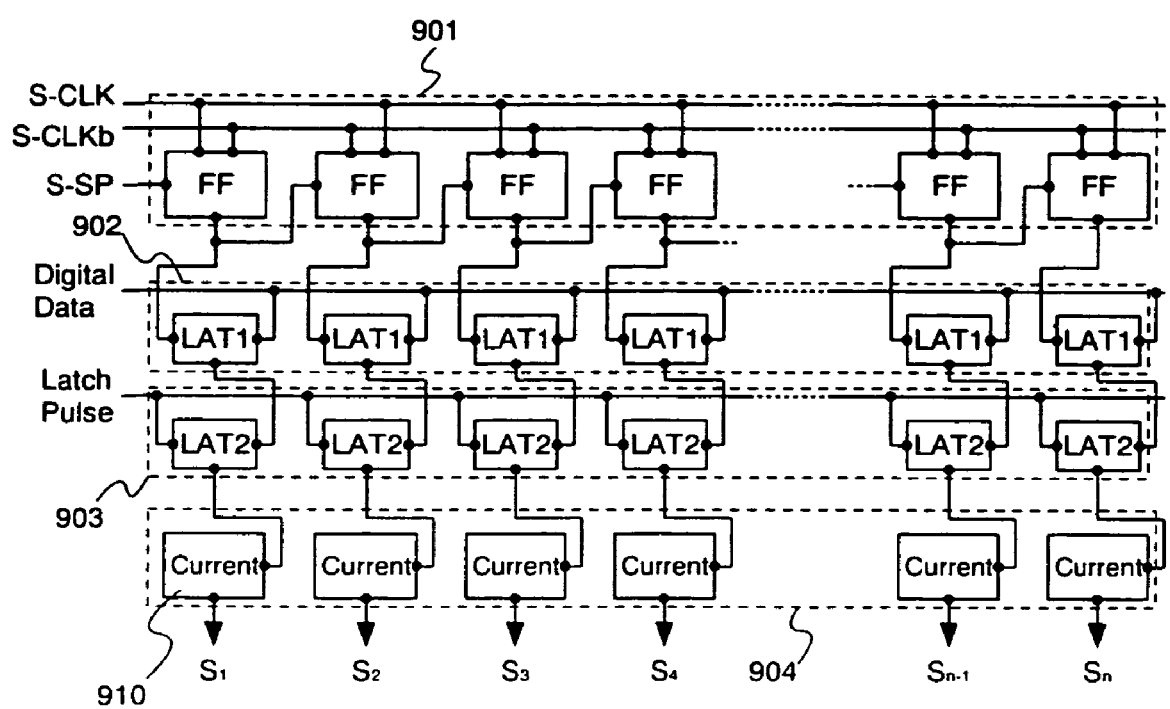
FIG. 9 is a diagram showing an example of the structure of a source signal line driver circuit in the semiconductor device shown in FIGS. 4A and 4B.

Operation of the source signal line driver circuit is explained next. A detailed structure is shown in FIG. 9, which will be referred to.

A shift register 901 is made by using a plurality of stages of flip flop circuits (FF) or the like, and inputs a clock signal (S-CLK), a clock inverted signal (S-CLKb) and a start pulse (S-SP). Sampling pulses are output one after another in accordance with the timing of these signals.

The sampling pulses output from the shift register 901 are input to a first latch circuit 902. The digital image signal is input to the first latch circuit 902, and the digital image signal is stored in each stage in accordance with the timing at which the sampling pulses are input.

When storage of the digital image signal in the first latch circuit 902 is completed through the final stage, a latch pulse is input to a second latch circuit 903 during a horizontal return period, and the digital image signal stored in the first latch circuit 902 is transferred all at once to the second latch circuit 903. One row portion of the digital image signal stored in the second latch circuit 903 is then input to a fixed electric current circuit 904.

A sampling pulse is again output to the shift register 901 while the digital image signal stored in the second latch circuit 903 is input to the fixed electric current circuit 904. Processing of one frame portion of the image signal can be performed by repeating these operations.

Figure 11:
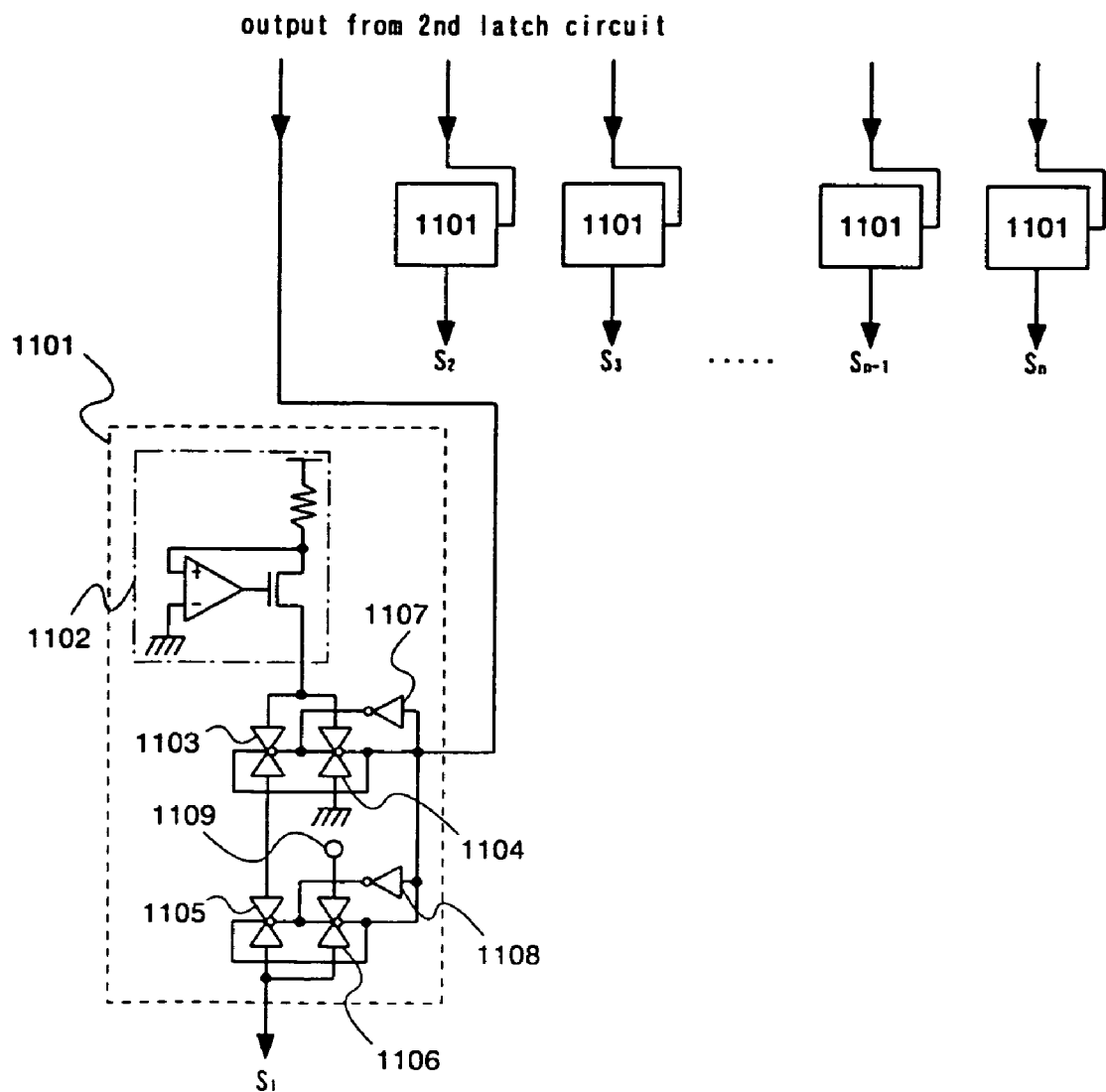
FIG. 11 is a diagram showing an example of the structure of a fixed electric current circuit in the semiconductor device shown in FIGS. 4A and 4B.

FIG. 11 is a diagram showing the structure of the fixed electric current circuit. The fixed electric current circuit has a plurality of stages of electric current setting circuits 1101. The electric current setting circuits 1101 formed in each stage output a predetermined signal electric current ($I_{data}$) to a source signal line in accordance with 1 or 0 information in the digital image signal input from the second latch circuit.

The electric current setting circuit 1101 has a fixed electric current source 1102 for supplying the signal electric current, analog switches 1103 to 1106, inverters 1107 and 1108, and an electric power source 1109. The fixed electric current source 1102 is structured by an op-amp and a TFT in FIG. 11, but there are no particular limitations placed on this structure.

The analog switches 1103 to 1106 are controlled to turn on and off by the digital image signal output from the second latch circuit 903. The analog switches 1103 and 1104 operate in a mutually exclusive manner, and when one is on, the other is off. Similarly, the analog switches 1105 and 1106 also operate in a mutually exclusive manner.

When the digital image signal stored in the second latch circuit 903 is 1, that is when it is H level, the analog switches 1103 and 1105 turn on, and the analog switches 1104 and 1106 turn off. The predetermined signal electric current therefore is made to flow from the fixed electric current source 1102, and is output to the source signal line through the analog switches 1103 and 1105.

On the other hand, if the digital image signal stored in the second latch circuit 903 is 0, that is when it is L level, the analog switches 1104 and 1106 turn on, and the analog switches 1103 and 1105 turn off. The signal electric current output from the fixed electric current source 1102 is not output to the source signal line, and falls to ground level through the analog switch 1104. The electric potential of the electric power source 1109, however, is imparted to the source signal line through the analog switch 1106. Note that it is preferable that the electric potential of the electric power source 1109 be nearly equal to that of the electric current supply line in the pixel portion. That is, it is preferable that the electric current flowing in the source signal line can be set to zero when the digital image signal is L level.

The aforementioned operations are performed similarly over all stages with one horizontal period. The value of the signal electric current output to all of the source signal lines is thus determined.

Note that, although analog switches are used as the switches in the electric current setting circuit, other types of switches may also be used, such as transmission gates. Furthermore, another structure capable of selecting the signal lines by using a decoder or the like as a substitute for the shift register, as discussed in Embodiment 1.

Embodiment 3

Display becomes two gray scales, white and black, in the semiconductor device using the digital image signal shown in Embodiment 2. A driver circuit for similarly displaying multiple gray scales using a digital image signal is described in Embodiment 3.

Figure 12:
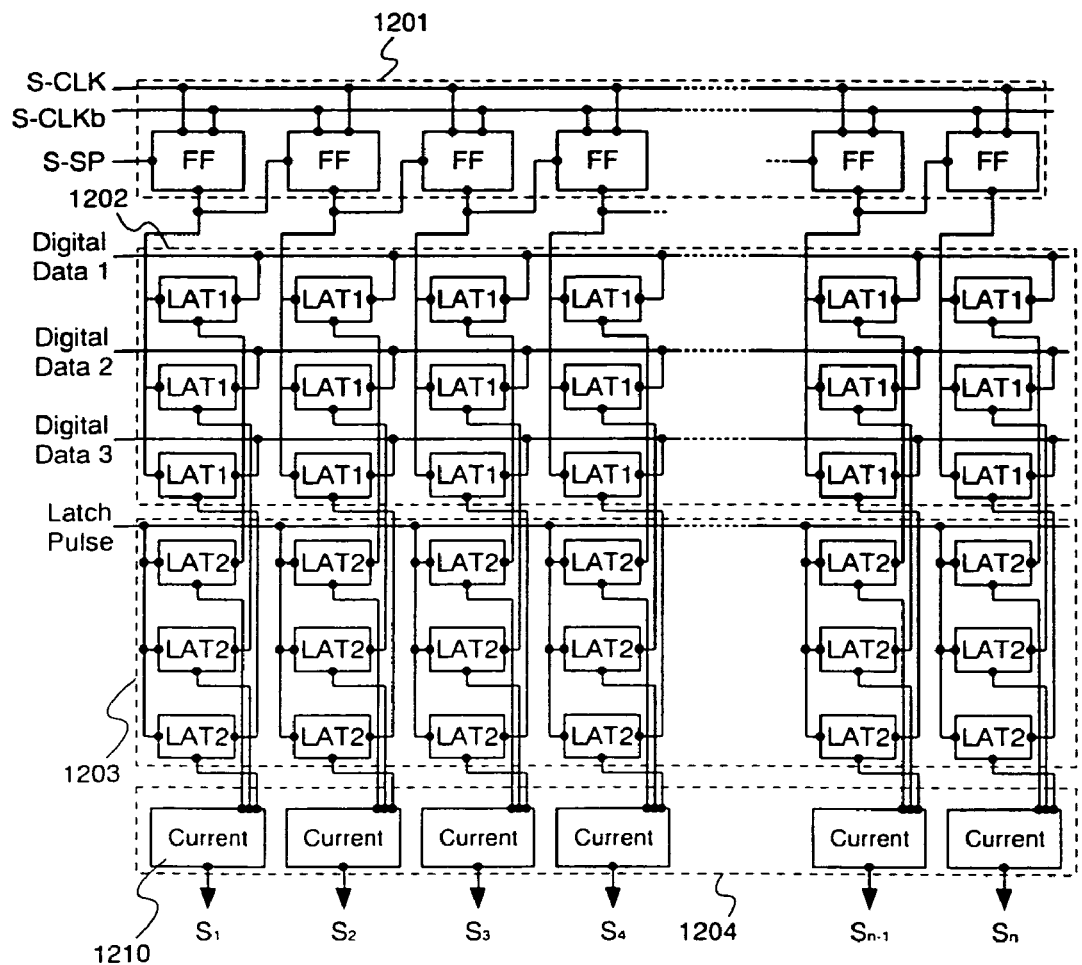
FIG. 12 is a diagram showing an example of the structure of a source signal line driver circuit in the semiconductor device shown in FIGS. 4A and 4B.

FIG. 12 shows an example of the structure of a source signal line driver circuit for performing 3-bit digital gray scale display. The source signal line driver circuit operation is similar to the 1-bit source signal line driver circuit shown in Embodiment 2, and it has a shift register 1201, a first latch circuit 1202, a second latch circuit 1203, and a fixed electric current circuit 1204. The fixed electric current circuit 1204 uses a plurality of electric current setting circuits 1210, similar to Embodiment 2.

A 3-bit digital image signal is input bit by bit (digital data 1 to 3). The first latch circuit 1202 and the second latch circuit 1203 are arranged in parallel with the three bits, and perform storage operations of a three bit portion of the digital image signal simultaneously in accordance with a sampling pulse output from the shift register. The 3-bit digital image signal stored in the second latch circuit 1203 is input to the fixed electric current circuit 1204.

Figure 13:
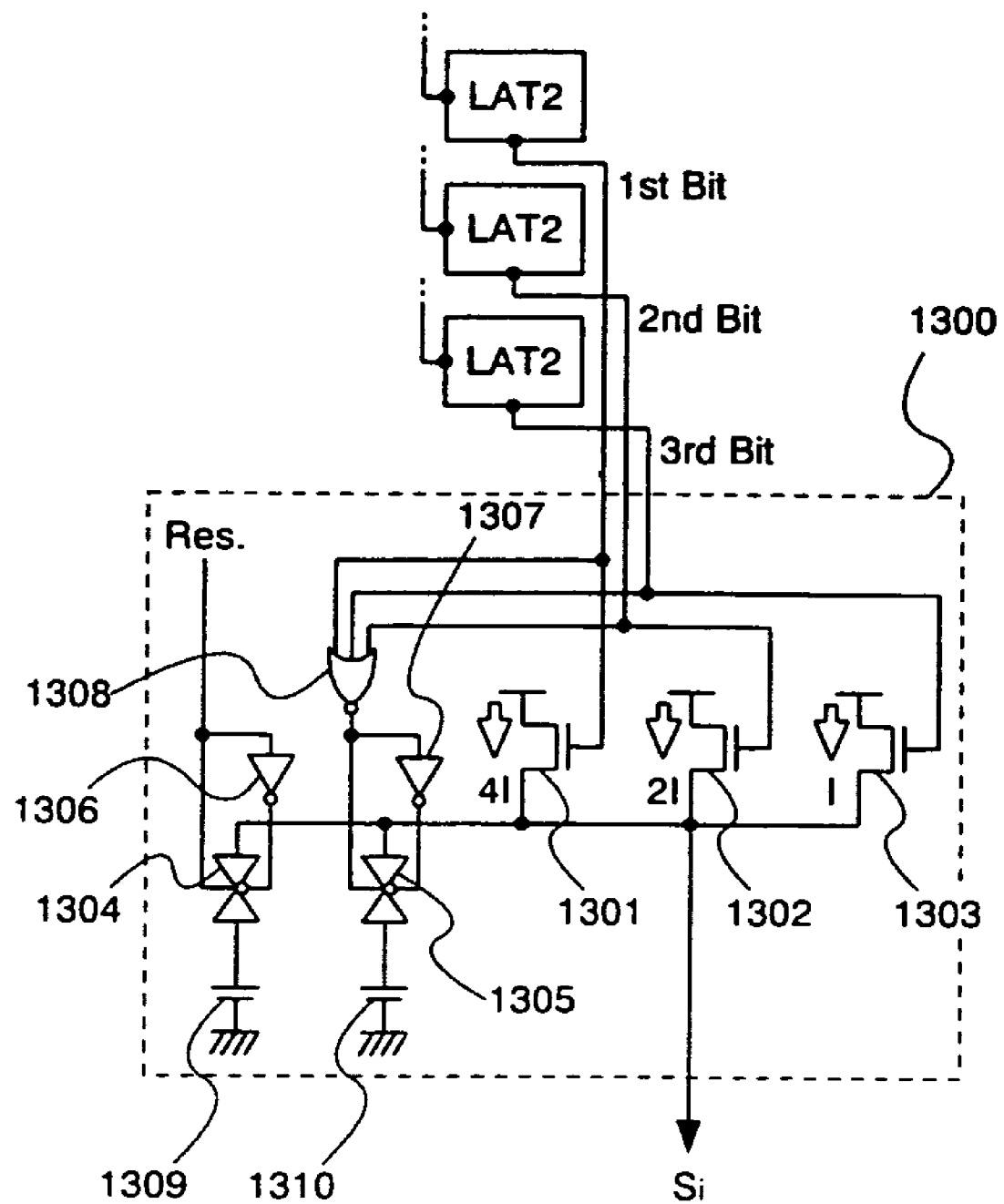
FIG. 13 is a diagram showing an example of the structure of an electric current setting circuit corresponding to 3-bit digital gray scales.

FIG. 13 shows an example of the structure of the electric current setting circuit structures the fixed electric current circuit of Embodiment 3. An electric current setting circuit 1300 has TFTs 1301 to 1303, analog switches 1304 and 1305, inverters 1306 and 1307, a NOR circuit 1308, and electric power sources 1309 and 1310.

The 3-bits of the digital image signal are input to gate electrodes of the TFTs 1301 to 1303, respectively, and to the NOR circuit 1308. The TFTs each have different channel widths W, and their on electric current are set to have a ratio of 4:2:1.

When the digital image signal input to the gate electrodes of the TFTs 1301 to 1303 is 1, that is when it is H level, the TFTs turn on and a predetermined electric current is supplied to a source signal line. The electric current supplied to the source signal line is the sum of the electric currents supplied through the TFTs 1301 to 1303, and the on electric current of each TFT have a ratio of 4:2:1, as stated above, and therefore the size of the electric current can be controlled in $2^3$ stages, namely 8 stages.

If the digital image signal input to the gate electrodes of the TFTs 1301 to 1303 has all zeros, that is if it is L level, then all of the TFTs 1301 to 1303 turn off. On the other hand, H level is output from the NOR, the analog switch 1305 turns on, and the electric power source electric potential of the electric power source 1310 is imparted to the source signal line.

Further, if a reset signal (Res.) is input within a horizontal return period, then the analog switch 1304 turns on, and the electric power source electric potential of the electric power source 1309 is imparted to the source signal line.

It is preferable that the electric potential of the electric power sources 1309 and 1310 each be set to an electric potential similar to that of the electric current supply line of the pixel portion so that the amount of electric current flowing in the source signal line can be set to zero when the electric power source electric potential is imparted to the source signal line.

Gray scale display can thus be performed. Note that, although an example of a case of 3-bit digital gray scales is given in Embodiment 3, there are no particular limitations placed on the number of gray scales, and it is possible to implement Embodiment 3 by a similar method for cases in which a higher number of gray scales are displayed.

Embodiment 4

Figure 14A:
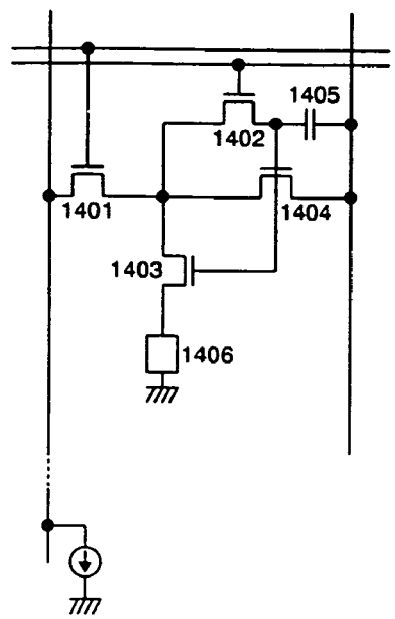
FIGS. 14A to 14D are diagrams showing pixels having a structure that differs from Embodiment Mode 1, their operation, and electric current pathways.

In the structure shown in FIGS. 1A and 1B, the second electrode of the storage TFT 156 is connected to the source signal line 101. The storage TFT 156 may also be connected to an output electrode of a switching TFT 1401, and an input electrode of a driver TFT 1403 as shown in FIG. 14A.

Figure 14B:
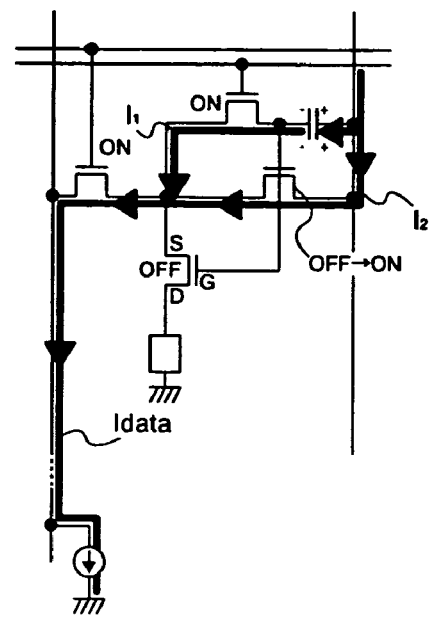
Figure 14C:
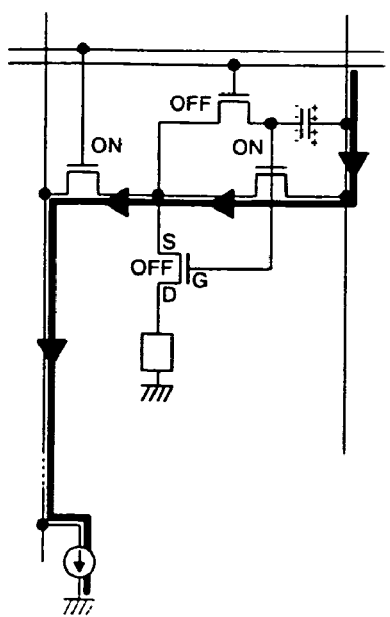
Figure 14D:
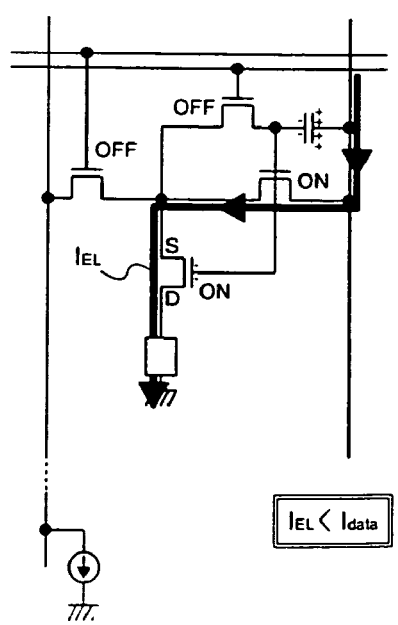

Signal write-in and light emission operations are shown in FIGS. 14B to 14D, but other than the fact that an electric current pathway $I_2$ is slightly different from that of FIGS. 1A and 1B, the operations are similar, and an explanation is therefore omitted here.

Further, by using a connection to a storage TFT 1402 as shown in Embodiment 4, a semiconductor device driven by a time gray scale method using a digital image signal can use a storage TFT 1402 as a reset TFT. The voltage between a gate and a source of the driver TFT 1403 can be set to zero, turning the driver TFT 1403 off, by turning the storage TFT 1402 on after completing a light emission period. Light emission from an EL element stops as a result.

Note that although a detailed explanation regarding the time gray scale method is omitted here, the methods disclosed in JP 2001-5426 B and JP 2000-86968A may be referenced.

An example in which this structure is applied to an active matrix display device is shown in FIGS. 34A and 34B. FIG. 34B is an example of actual element and wiring layout, and FIG. 34A is an equivalent circuit diagram reflecting the positional relationship between each element. Reference numerals within the figures are based upon FIGS. 14A to 14D.

Figure 38A:
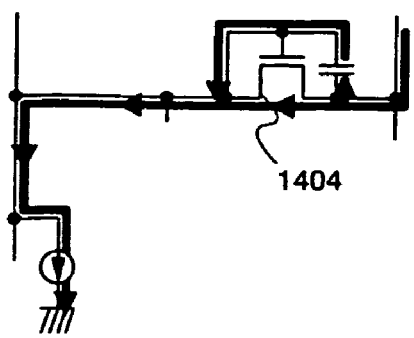
FIGS. 38A to 38C are diagrams of cases in which a portion of the structure and the electric current pathways of the pixel shown in FIGS. 14A to 14D is changed.
Figure 38B:
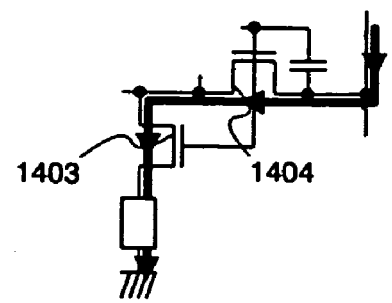
Figure 38C:
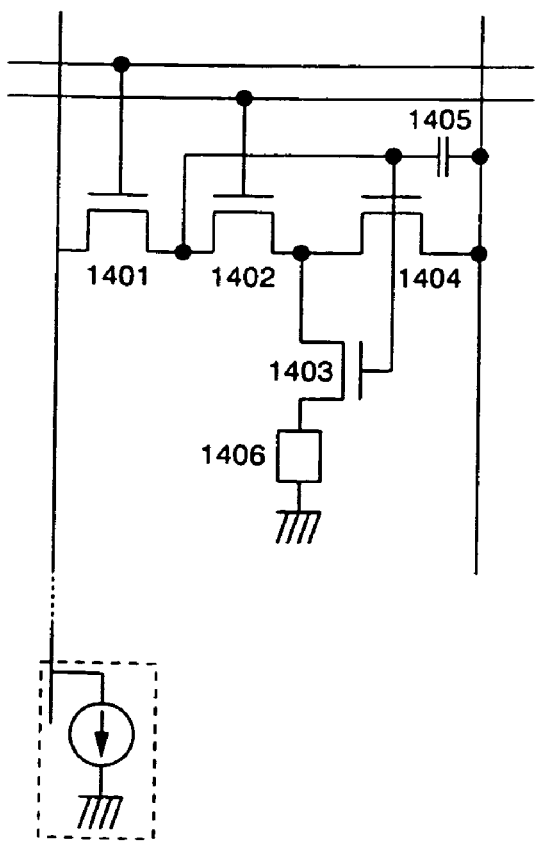

Note that similar operation is also possible using structures that differ from that of FIGS. 14A to 14D. In short, a pathway like that of FIG. 38A may be established when the signal electric current is input, and a pathway like that of FIG. 38B may be established during light emission. The switching elements and the like may therefore be disposed such that their positions are not inconsistent with the aforementioned pathways, and connections such as those of FIG. 38C are also possible.

Embodiment 5

In this embodiment, a manufacturing method of a semiconductor device is described. Typically, n-channel TFT and p-channel TFT that compose the driver circuit and TFT that is provided in the pixel portion are described. With respect to a part of TFT composing a pixel is not illustrated in particular, it can be formed in according to this embodiment.

First, as shown in FIG. 21A, a base film 5002 formed of an insulating film such as a silicon oxide film, a silicon nitride film or a silicon oxynitride film is formed on a substrate 5001 formed of glass such as barium borosilicate glass or alumino borosilicate glass represented by #7059 glass and #1737 glass of Corning Corporation. For example, a silicon oxynitride film 5002a formed from $SiH_4$, $NH_3$ and $N_2O$ by the plasma CVD method and having a thickness of from 10 to 200 nm (preferably 50 to 100 nm) is formed. Similarly, a hydrogenerated silicon oxynitride film formed from $SiH_4$ and $N_2O$ and having a thickness of from 10 to 200 nm (preferably 50 to 100 nm) is layered thereon. In this embodiment, the base film 5002 has a two-layer structure, but may also be formed as a single layer film of one of the above insulating films, or a laminate film having more than two layers of the above insulating films.

Island-like semiconductor layers 5003 to 5006 are formed from a crystalline semiconductor film obtained by conducting laser crystallization method or a known thermal crystallization method on a semiconductor film having an amorphous structure. These island-like semiconductor layers 5003 to 5006 each has a thickness of from 25 to 80 nm (preferably 30 to 60 nm). No limitation is put on the material of the crystalline semiconductor film, but the crystalline semiconductor film is preferably formed from silicon, a silicon germanium (SiGe) alloy, etc.

When the crystalline semiconductor film is to be manufactured by the laser crystallization method, an excimer laser, a YAG laser and an $YVO_4$ laser of a pulse oscillation type or continuous light emitting type are used. When these lasers are used, it is preferable to use a method in which a laser beam radiated from a laser oscillator is converged into a linear shape by an optical system and then is irradiated to the semiconductor film. A crystallization condition is suitably selected by an operator. When the excimer laser is used, pulse oscillation frequency is set to 300 Hz, and laser energy density is set to from 100 to 400 $mJ/cm^2$ (typically 200 to 300 $mJ/cm^2$). When the YAG laser is used, pulse oscillation frequency is preferably set to from 30 to 300 kHz by using its second harmonic, and laser energy density is preferably set to from 300 to 600 $mJ/cm^2$ (typically 350 to 500 $mJ/cm^2$). The laser beam converged into a linear shape and having a width of from 100 to 1000 μm, e.g. 400 μm, is irradiated to the entire substrate surface. At this time, overlapping ratio of the linear laser beam is set to from 50 to 90%.

Note that, a gas laser or solid state laser of continuous oscillation type or pulse oscillation type can be used. The gas laser such as an excimer laser, Ar laser, Kr laser and the solid state laser such as YAG laser, $YVO_4$ laser, YLF laser, $YAlO_3$ laser, glass laser, ruby laser, alexandrite laser, Ti: sapphire laser can be used as the laser beam. Also, crystals such as YAG laser, $YVO_4$ laser, YLF laser, $YAlO_3$ laser wherein Cr, Nd, Er, Ho, Ce, Co, Ti or Tm is doped can be used as the solid state laser. A basic wave of the lasers is different depending on the materials of doping, therefore a laser beam having a basic wave of approximately 1 μm is obtained. A harmonic corresponding to the basic wave can be obtained by the using non-linear optical elements.

When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an $Nd:YVO_4$ laser (basic wave of 1064 nm) is applied. Specifically, laser beams emitted from the continuous oscillation type $YVO_4$ laser with 10 W output is converted into a harmonic by using the non-linear optical elements. Also, a method of emitting a harmonic by applying crystal of $YVO_4$ and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100 $MW/cm^2$ (preferably 01. to 10 $MW/cm^2$) is required. The semiconductor film is moved at approximately 10 to 2000 cm/s rate relatively corresponding to the laser beams so as to irradiate the semiconductor film.

Next, a gate insulating film 5007 covering the island-like semiconductor layers 5003 to 5006 is formed. The gate insulating film 5007 is formed from an insulating film containing silicon and having a thickness of from 40 to 150 nm by using the plasma CVD method or a sputtering method. In this embodiment, the gate insulating film 5007 is formed from a silicon oxynitride film with a thickness of 120 nm. However, the gate insulating film is not limited to such a silicon oxynitride film, but it may be an insulating film containing other silicon and having a single layer or a laminated layer structure. For example, when a silicon oxide film is used, TEOS (Tetraethyl Orthosilicate) and $O_2$ are mixed by the plasma CVD method, the reaction pressure is set to 40 Pa, the substrate temperature is set to from 300 to 400° C., and the high frequency (13.56 MHz) power density is set to from 0.5 to 0.8 $W/cm^2$ for electric discharge. Thus, the silicon oxide film can be formed by discharge. The silicon oxide film manufactured in this way can then obtain preferable characteristics as the gate insulating film by thermal annealing at from 400 to 500° C.

A first conductive film 5008 and a second conductive film 5009 for forming a gate electrode are formed on the gate insulating film 5007. In this embodiment, the first conductive film 5008 having a thickness of from 50 to 100 nm is formed from Ta, and the second conductive film 5009 having a thickness of from 100 to 300 nm is formed from W.

The Ta film is formed by a sputtering method, and the target of Ta is sputtered by Ar. In this case, when suitable amounts of Xe and Kr are added to Ar, internal stress of the Ta film is released, and pealing off this film can be prevented. Resistivity of the Ta film of a phase is about 20 $\mu\Omega$cm, and this Ta film can be used for the gate electrode. However, resistivity of the Ta film of β phase is about 180 $\mu\Omega$cm, and is not suitable for the gate electrode. When tantalum nitride having a crystal structure close to that of the α phase of Ta and having a thickness of about 10 to 50 nm is formed in advance as the base for the Ta film to form the Ta film of the α phase, the Ta film of a phase can be easily obtained.

The W film is formed by the sputtering method with W as a target. Further, the W film can be also formed by a thermal CVD method using tungsten hexafluoride (WF$_6$). In any case, it is necessary to reduce resistance to use this film as the gate electrode. It is desirable to set resistivity of the W film to be equal to or smaller than 20 $\mu\Omega$cm. When crystal grains of the W film are increased in size, resistivity of the W film can be reduced. However, when there are many impurity elements such as oxygen, etc. within the W film, crystallization is prevented and resistivity is increased. Accordingly, in the case of the sputtering method, a W-target of 99.9999% or 99.99% in purity is used, and the W film is formed by taking a sufficient care of not mixing impurities from a gaseous phase into the W film time when the film is to be formed. Thus, a resistivity of from 9 to 20 $\mu\Omega$cm can be realized.

In this embodiment, the first conductive film 5008 is formed from Ta, and the second conductive film 5009 is formed from W. However, the present invention is not limited to this case. Each of these conductive films may also be formed from an element selected from Ta, W, Ti, Mo, Al and Cu, or an alloy material or a compound material having these elements as principal components. Further, a semiconductor film represented by a polysilicon film doped with an impurity element such as phosphorus may also be used. Examples of combinations other than those shown in this embodiment include: a combination in which the first conductive film 5008 is formed from tantalum nitride (TaN), and the second conductive film 5009 is formed from W; a combination in which the first conductive film 5008 is formed from tantalum nitride (TaN), and the second conductive film 5009 is formed from Al; and a combination in which the first conductive film 5008 is formed from tantalum nitride (TaN), and the second conductive film 5009 is formed from Cu.

Next, a mask 5010 is formed from a resist, and first etching processing for forming an electrode and wiring is performed. In this embodiment, an ICP (Inductively Coupled Plasma) etching method is used, and CF$_4$ and Cl$_2$ are mixed with a gas for etching. RF (13.56 MHz) power of 500 W is applied to the electrode of coil type at a pressure of 1 Pa so that plasma is generated. RF (13.56 MHz) of 100 W power is also applied to a substrate side (sample stage), and a substantially negative self bias voltage is applied. When CF$_4$ and Cl$_2$ are mixed, the W film and the Ta film are etched to the same extent.

Under the above etching condition, end portions of a first conductive layer and a second conductive layer are formed into a tapered shape by effects of the bias voltage applied to the substrate side by making the shape of the mask formed from the resist into an appropriate shape. The angle of a taper portion is set to from 15° to 45°. It is preferable to increase an etching time by a ratio of about 10 to 20% so as to perform the etching without leaving the residue on the gate insulating film. Since a selection ratio of a silicon oxynitride film to the W film ranges from 2 to 4 (typically 3), an exposed face of the silicon oxynitride film is etched by about 20 to 50 nm by over-etching processing. Thus, conductive layers 5011 to 5016 of a first shape (first conductive layers 5011a to 5016a and second conductive layers 5011b to 5016b) formed of the first and second conductive layers are formed by the first etching processing. A region that is not covered with the conductive layers 5011 to 5016 of the first shape is etched by about 20 to 50 nm in the gate insulating film 5007, so that a thinned region is formed (FIG. 21B).

Then, an impurity element for giving an n-type conductivity is added by performing first doping processing. A doping method may be either an ion doping method or an ion implantation method. The ion doping method is carried out under the condition that a dose is set to from $1\times10^{13}$ to $5\times10^{14}$ atoms/cm$^2$, and an acceleration voltage is set to from 60 to 100 keV. An element belonging to group 15, typically, phosphorus (P) or arsenic (As) is used as the impurity element for giving the n-type conductivity. However, phosphorus (P) is used here. In this case, the conductive layers 5011 to 5014 serve as masks with respect to the impurity element for giving the n-type conductivity, and first impurity regions 5017 to 5024 are formed in a self-aligning manner. The impurity element for giving the n-type conductivity is added to the first impurity regions 5017 to 5024 in a concentration range from $1\times10^{20}$ to $1\times10^{21}$ atoms/cm$^3$ (FIG. 21B).

Second etching processing is next performed without removing the resist mask as shown in FIG. 21C. A W film is etched selectively by using CF$_4$, Cl$_2$ and O$_2$ as the etching gas. The conductive layers 5026 to 5031 of a second shape (first conductive layers 5026a to 5031a and second conductive layers 5026b to 5031b) are formed by the second etching processing. A region of the gate insulating film 5007, which is not covered with the conductive layers 5026 to 5031 of the second shape, is further etched by about 20 to 50 nm so that a thinned region is formed.

An etching reaction in the etching of the W film or the Ta film using the mixed gas of CF$_4$ and Cl$_2$ can be assumed from the vapor pressure of a radical or ion species generated and a reaction product. When the vapor pressures of a fluoride and a chloride of W and Ta are compared, the vapor pressure of WF$_6$ as a fluoride of W is extremely high, and vapor pressures of other WCl$_5$, TaF$_5$ and TaCl$_5$ are approximately equal to each other. Accordingly, both the W film and the Ta film are etched using the mixed gas of CF$_4$ and Cl$_2$. However, when a suitable amount of O$_2$ is added to this mixed gas, CF$_4$ and O$_2$ react and become CO and F so that a large amount of F-radicals or F-ions is generated. As a result, the etching speed of the W film whose fluoride has a high vapor pressure is increased. In contrast to this, the increase in etching speed is relatively small for the Ta film when F is increased. Since Ta is easily oxidized in comparison with W, the surface of the Ta film is oxidized by adding O$_2$. Since no oxide of Ta reacts with fluorine or chloride, the etching speed of the Ta film is further reduced. Accordingly, it is possible to make a difference in etching speed between the W film and the Ta film so that the etching speed of the W film can be set to be higher than that of the Ta film.

As shown in FIG. 22A, second doping processing is then performed. In this case, an impurity element for giving the n-type conductivity is doped in a smaller dose than in the first doping processing and at a high acceleration voltage by reducing a dose lower than that in the first doping processing. For example, the acceleration voltage is set to from 70 to 120 keV, and the dose is set to $1\times10^{13}$ atoms/cm². Thus, a new impurity region is formed inside the first impurity region formed in the island-like semiconductor layer in FIG. 21B. In the doping, the conductive layers 5026 to 5029 of the second shape are used as masks with respect to the impurity element, and the doping is performed such that the impurity element is also added to regions underside the first conductive layers 5026a to 5029a. Thus, third impurity regions 5032 to 5035 are formed. The third impurity regions 5032 to 5035 contain phosphorus (P) with a gentle concentration gradient that conforms with the thickness gradient in the tapered portions of the first conductive layers 5026a to 5029a. In the semiconductor layers that overlap the tapered portions of the first conductive layers 5026a to 5029a, the impurity concentration is slightly lower around the center than at the edges of the tapered portions of the first conductive layers 5026a to 5029a. However, the difference is very slight and almost the same impurity concentration is kept throughout the semiconductor layers.

Third etching treatment is then carried out as shown in FIG. 22B. $CHF_6$ is used as etching gas, and reactive ion etching (RIE) is employed. Through the third etching treatment, the tapered portions of the first conductive layers 5026a to 5029a are partially etched to reduce the regions where the first conductive layers overlap the semiconductor layers. Thus formed are third shape conductive layers 5037 to 5042 (first conductive layers 5037a to 5042a and second conductive layers 5037b to 5042b). At this point, regions of the gate insulating film 5007 that are not covered with the third shape conductive layers 5037 to 5042 are further etched and thinned by about 20 to 50 nm.

Third impurity regions 5032 to 5035 are formed through the third etching treatment. The third impurity regions 5032a to 5035a that overlap the first conductive layers 5037a to 5040a, respectively, and second impurity regions 5032b to 5036b each formed between a first impurity region and a third impurity region.

As shown in FIG. 22C, fourth impurity regions 5043 to 5054 having the opposite conductivity type to the first conductivity type are formed in the island-like semiconductor layers 5004 and 5006 for forming p-channel type TFTs. The third shape conductive layers 5038b and 5040b are used as masks against the impurity element and impurity regions are formed in a self-aligning manner. At this point, the island-like semiconductor layers 5003 and 5005 for forming n-channel type TFTs and the wiring portions 5041 and 5042 are entirely covered with a resist mask 5200. The impurity regions 5043 to 5054 have already been doped with phosphorus in different concentrations. The impurity regions 5043 to 5054 are doped with diborane ($B_2H_6$) through ion doping and its impurity concentrations are set to form $2\times10^{20}$ to $2\times10^{21}$ atoms/cm³ in the respective impurity regions.

Through the steps above, the impurity regions are formed in the respective island-like semiconductor layers. The third shape conductive layers 5037 to 5040 overlapping the island-like semiconductor layers function as gate electrodes. Reference numeral 5042 functions as island-like first scanning line. Reference numeral 5041 functions as wirings witch connect an island-like third scanning line and the third shape conductive layer 5040.

After resist mask 5200 is removed, a step of activating the impurity elements added to the island-like semiconductor layers is performed to control the conductivity type. This process is performed by a thermal annealing method using a furnace for furnace annealing. Further, a laser annealing method or a rapid thermal annealing method (RTA method) can be applied. In the thermal annealing method, this process is performed at a temperature of from 400 to 700° C., typically from 500 to 600° C. within a nitrogen atmosphere in which oxygen concentration is equal to or smaller than 1 ppm and is preferably equal to or smaller than 0.1 ppm. In this embodiment, heat treatment is performed for four hours at a temperature of 500° C. When a wiring material used in the third shape conductive layers 5037 to 5042 is weak against heat, it is preferable to perform activation after an interlayer insulating film (having silicon as a principal component) is formed in order to protect wiring, etc. When the laser annealing method is employed, the laser used in the crystallization can be used. When activation is performed, the moving speed is set as well as the crystallization processing, and the energy density of about 0.01 to 100 MW/cm² (preferably 0.01 to 10 MW/cm²) is required.

Further, the heat treatment is performed for 1 to 12 hours at a temperature of from 300 to 450° C. within an atmosphere including 3 to 100% of hydrogen so that the island-like semiconductor layer is hydrogenated. This step is to terminate a dangling bond of the semiconductor layer by hydrogen thermally excited. Plasma hydrogenation (using hydrogen excited by plasma) may also be performed as another measure for hydrogenation.

Next, as shown in FIG. 23A, a first interlayer insulating film 5055 is formed from a silicon oxynitride film with a thickness of 100 to 200 nm. The second interlayer insulating film 5056 from an organic insulating material is formed on the first interlayer insulating film. Thereafter, contact holes are formed through the first interlayer insulating film 5055, the second interlayer insulating film 5056 and the gate insulating film 5007. A wiring 5057, an electric current supply line 5058, and a connecting line 5059 are patterned and formed. Thereafter, a pixel electrode 5064 coming in contact with the connecting wiring 5062 is patterned and formed.

A film having an organic resin as a material is used as the second interlayer insulating film 5056. Polyimide, polyamide, acrylic, BCB (benzocyclobutene), etc. can be used as this organic resin. In particular, since the second interlayer insulating film 5056 is provided mainly for planarization, acrylic excellent in leveling the film is preferable. In this embodiment, an acrylic film having a thickness that can sufficiently level a level difference caused by the TFT is formed. The film thickness thereof is preferably set to from 1 to 5 μm (is further preferably set to from 2 to 4 μm).

In the formation of the contact holes, contact holes reaching n-type impurity regions 5017, 5018, 5021 and 5022 or p-type impurity regions 5043, 5048, 5049 and 5054, a contact hole reaching wiring 5042 (not illustrated), a contact hole reaching an electric current supply line (not illustrated), and contact holes reaching gate electrodes (not illustrated) are formed.

Further, a laminate film of a three-layer structure is patterned in a desired shape and is used as wirings (including a connecting wiring and signal line) 5057 to 5062. In this three-layer structure, a Ti film with a thickness of 100 nm, an aluminum film containing Ti with a thickness of 300 nm, and a Ti film with a thickness of 150 nm are continuously formed by the sputtering method. Of course, another conductive film may also be used.

In this embodiment, an ITO film of 110 nm in thickness is formed as a pixel electrode 5064, and is patterned. Contact is made by arranging the pixel electrode 5064 such that this pixel electrode 5064 comes in contact with the connecting electrode 5062 and is overlapped with this connecting wiring

5062. Further, a transparent conductive film provided by mixing 2 to 20% of zinc oxide (ZnO) with indium oxide may also be used. This pixel electrode 5064 becomes an anode of the light emitting element (FIG. 23A).

As shown in FIG. 23B, an insulating film (a silicon oxide film in this embodiment) containing silicon and having a thickness of 500 nm is next formed. A third interlayer insulating film 5065 functions as a bank is formed in which an opening is formed in a position corresponding to the pixel electrode 5064. When the opening is formed, a side wall of the opening can easily be tapered by using the wet etching method. When the side wall of the opening is not gentle enough, deterioration of an organic light emitting layer caused by a level difference becomes a notable problem.

Next, an organic light emitting layer 5066 and a cathode (MgAg electrode) 5067 are continuously formed by using the vacuum evaporation method without exposing to the atmosphere. The organic light emitting layer 5066 has a thickness of from 80 to 200 nm (typically from 100 to 120 nm), and the cathode 5067 has a thickness of from 180 to 300 nm (typically from 200 to 250 nm).

In this process, the organic light emitting layer is sequentially formed with respect to a pixel corresponding to red, a pixel corresponding to green and a pixel corresponding to blue. In this case, since the organic light emitting layer has an insufficient resistance against a solution, the organic light emitting layer must be formed separately for each color instead of using a photolithography technique. Therefore, it is preferable to cover a portion except for desired pixels using a metal mask so that the organic light emitting layer is formed selectively only in a required portion.

Namely, a mask for covering all portions except for the pixel corresponding to red is first set, and the organic light emitting layer for emitting red light are selectively formed by using this mask. Next, a mask for covering all portions except for the pixel corresponding to green is set, and the organic light emitting layer for emitting green light are selectively formed by using this mask. Next, a mask for covering all portions except for the pixel corresponding to blue is similarly set, and the organic light emitting layer for emitting blue light are selectively formed by using this mask. Here, different masks are used, but instead the same single mask may be used repeatedly.

Here, a system for forming three kinds of light emitting element corresponding to RGB is used. However, a system in which an light emitting element for emitting white light and a color filter are combined, a system in which the light emitting element for emitting blue or blue green light is combined with a fluorescent substance (a fluorescent color converting medium: CCM), a system for overlapping the light emitting elements respectively corresponding to R, G, and B with the cathodes (opposite electrodes) by utilizing a transparent electrode, etc. may be used.

A known material can be used as the organic light emitting layer 5066. An organic material is preferably used as the known material in consideration of a driving voltage. For example, a four-layer structure consisting of a hole injection layer, a hole transportation layer, a light emitting layer and an electron injection layer is preferably used for the organic light emitting layer.

Next, the cathode 5067 is formed by using metal mask. This embodiment uses MgAg for the cathode 5067 but it is not limited thereto. Other known materials may be used for the cathode 5067.

Finally, a passivation film 5068 formed of silicon nitride film and having a thickness of 300 nm is formed. By forming the passivation film 5068, the passivation film 5068 plays a role of protecting the organic light emitting layer 5066 from moisture or the like. Thus, reliability of the light emitting element can be further improved.

Accordingly, the light emitting device having a structure shown in FIG. 23B is completed.

The light emitting device in this embodiment has very high reliability and improved operating characteristics by arranging the TFTs of the optimal structures in a driving circuit portion in addition to the pixel portion. Further, in a crystallization process, crystallinity can be also improved by adding a metal catalyst such as Ni. Thus, a driving frequency of the signal line driving circuit can be set to 10 MHz or more.

First, the TFT having a structure for reducing hot carrier injection so as not to reduce an operating speed as much as possible is used as an n-channel type TFT of a CMOS circuit forming the driving circuit portion. Here, the driving circuit includes a shift register, a buffer, a level shifter, a latch in line sequential driving, a transmission gate in dot sequential driving, etc.

In the case of this embodiment, an active layer of the n-channel type TFT includes a source region (source), a drain region (drain), an overlapping LDD region ($L_{OV}$ region) that is overlapped with the gate electrode through the gate insulating film, an offset LDD region ($L_{OFF}$ region) that is not overlapped with the gate electrode through the gate insulating film, and channel forming region.

Deterioration by the hot carrier injection in the p-channel type TFT of the CMOS circuit is almost negligible. Therefore, it is not necessary to particularly form the LDD region in this p-channel type TFT. However, similar to the n-channel type TFT, the LDD region can be formed in the p-channel type TFT as a hot carrier countermeasure.

Further, when the CMOS circuit for bi-directionally flowing an electric current through a channel forming region, i.e., the CMOS circuit in which roles of the source and drain regions are exchanged is used in the driving circuit, it is preferable for the n-channel type TFT that constitutes the CMOS circuit to form LDD regions such that the channel forming region is sandwiched between the LDD regions. As an example of this, a transmission gate used in the dot sequential driving is given. When a CMOS circuit required to reduce an OFF-state current value as much as possible is used in the driving circuit, the n-channel type TFT forming the CMOS circuit preferably has a $L_{OV}$ region. The transmission gate used in the dot sequential driving can be given also as an example as such.

In practice, the device reaching the state of FIG. 23B is packaged (enclosed) using a protective film that is highly airtight and allows little gas to transmit (such as a laminate film and a UV-curable resin film) or a light-transmissive sealing material, so as to further avoid exposure to the outside air. A space inside the seal may be set to an inert atmosphere or a hygroscopic substance (barium oxide, for example) may be placed there to improve the reliability of the light emitting element.

After securing the airtightness through packaging or other processing, a connector (flexible printed circuit: FPC) is attached for connecting an external signal terminal with a terminal led out from the elements or circuits formed on the substrate. The device in a state that can be shipped is called display device in this specification.

Furthermore, in accordance with the processes shown in this embodiment, the number of photomasks can be reduced that is need for manufacturing the light emitting device. As a result, the processes can be reduced, and this contributes to a reduction in the manufacturing costs and an increase in throughput.

Embodiment 6

Figure 15A:
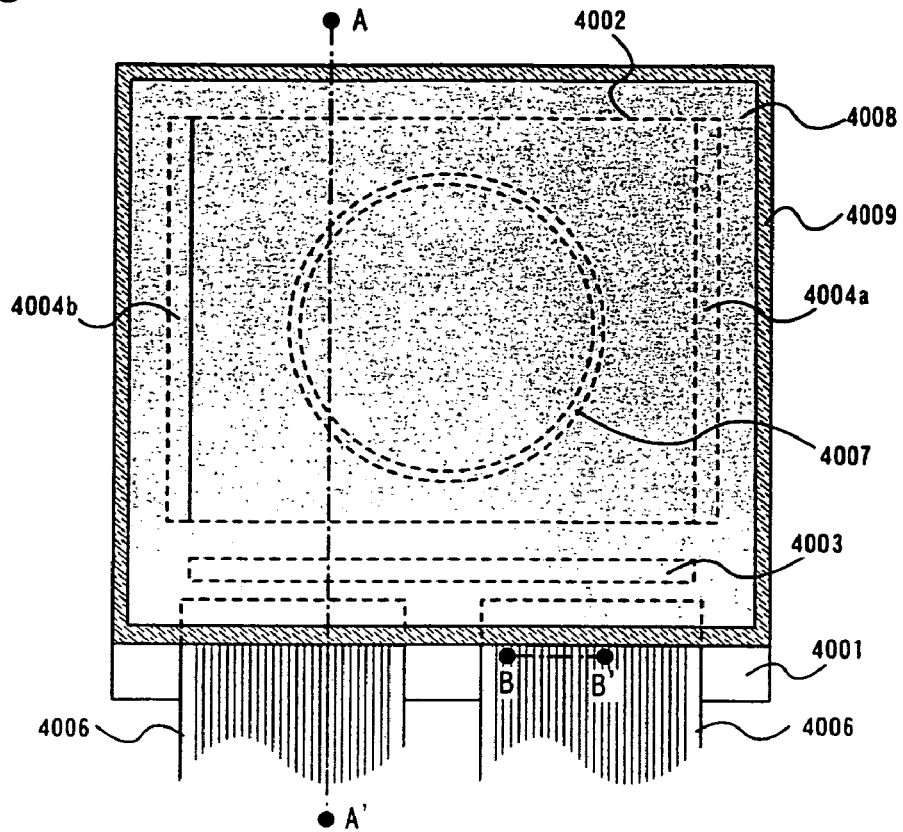
FIGS. 15A to 15C are an external diagram and cross sectional diagrams, respectively, of a semiconductor device.
Figure 15B:
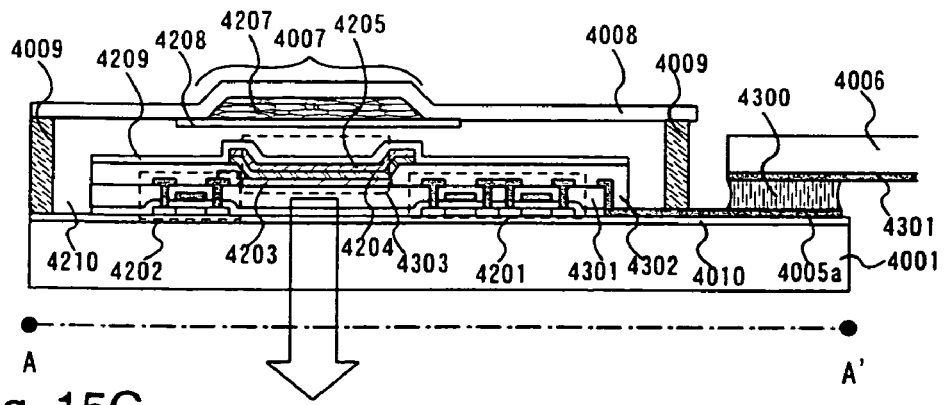
Figure 15C:
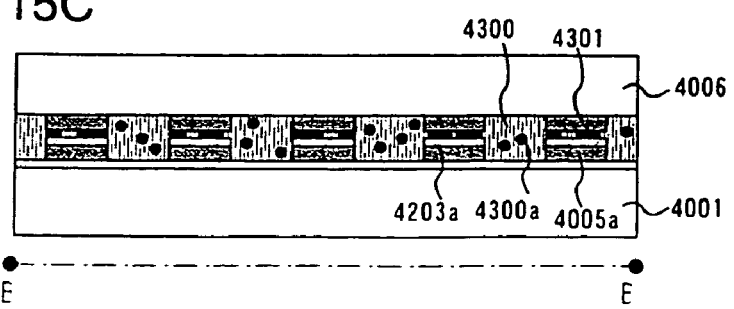

This embodiment deals with the fabrication of the light emitting device according to the invention with reference to FIGS. 15A to 15C.

FIG. 15A is a top view of the light emitting device that is fabricated by sealing a element substrate on witch a thin film transistor is formed thereof by a sealing material. FIG. 15B is a sectional view of taking along a line A-A' in FIG. 15A. FIG. 15C is a sectional view of taking along a line B-B' in FIG. 15A.

The sealing member 4009 is so provided as to surround a pixel unit 4002, signal line driving circuit 4003, and first and second scanning line driving circuits 4004a, 4004b formed on the substrate 4001. Further, a sealing member 4008 is provided on the pixel unit 4002, on the signal line driving circuit 4003 and on the first and second scanning line driving circuits 4004a, 4004b. Accordingly, the pixel unit 4002, signal line driving circuit 4003, and first and second scanning line driving circuits 4004a, 4004b are sealed with a filler material 4210 being surrounded by the substrate 4001, sealing member 4009 and sealing member 4008.

Plural TFTs are possessed by the pixel unit 4002, by the source signal line driving circuit 4003 and by the first and gate signal line deriving circuits 4004a, 4004b formed on the substrate 4001. FIG. 15B representatively illustrates driver TFTs (here, an n-channel type TFT and a p-channel type TFT) 4201 formed on the base film 4010 and included in the source signal line driving circuit 4003, and a TFT 4202 included in the pixel unit 4002.

An interlayer insulating film (flattened film) 4301 is formed on the TFTs 4201 and 4202, and on which is formed a pixel electrode (anode) 4203 electrically connected to the TFT 4202. As the pixel electrode 4203, there is used a transparent conductive film having a large work function. As the transparent conductive film, there can be used a compound of indium oxide and tin oxide, a compound of indium oxide and zinc oxide, zinc oxide, tin oxide or indium oxide. It is also allowable to add gallium to the transparent conductive film.

An insulating film 4302 is formed on the pixel electrode 4203. An opening is formed in the insulating film 4302 on the pixel electrode 4203. An organic light emitting layer 4204 is formed in the opening on the pixel electrode 4203. The organic light emitting layer 4204 may be made of a known organic light emitting material or an inorganic light emitting material. Further, the organic light emitting material may be either a low-molecular (monomeric) material or a high molecular (polymeric) material.

The organic light emitting layer 4204 may be formed by a known deposition technology or a coating technology. Further, the organic light emitting layer may have a laminated-layer structure of a hole-injection layer, a hole-transporting layer, a light emitting layer, and an electron-transporting layer or an electron injection layer, or may have a single-layer structure.

On the organic light emitting layer 4204 is formed a cathode 4205 comprising a conductive film (typically, a conductive film comprising chiefly aluminum, copper or silver, or a laminated-layer film thereof with other conductive films) having light-shielding property. It is desired that water and oxygen are removed as much as possible from the interface between the cathode 4205 and the organic light emitting layer 4204. It is therefore necessary to make such a contrivance that the organic light emitting layer 4204 is formed in a nitrogen or a rare gas atmosphere, and the cathode 4205 is formed while being kept away from oxygen and water. In this embodiment, the film is formed as described above by using a film-forming device of the multi-chamber type (cluster tool type). A predetermined voltage is given to the cathode 4205.

There is thus formed an light emitting element 4303 comprising the pixel electrode (anode) 4203, light emitting layer 4204 and cathode 4205. A protection film 4209 is formed on the insulating film 4302 so as to cover the light emitting element 4303. The protection film 4209 is effective in preventing oxygen and water from entering into the light emitting element 4303.

Reference numeral 4005a is a detour wiring connected to the power supply wiring, and is electrically connected to the input electrode of the TFT 4202. The detour wiring 4005a is electrically connected to the FPC wiring 4301 possessed by the FPC 4006 passing through between the sealing member 4009 and the substrate 4001 and via an anisotropic conductive film 4300.

As the sealing member 4008, there can be used a glass member, a metal member (representatively, a stainless steel member), a ceramic member or a plastic member (inclusive of a plastic film). As the plastic member, there can be used an FRP (Fiberglass-Reinforced Plastic) plate, a PVF (polyvinyl fluoride) film, a Mylar film, a polyester film, or an acrylic resin film. It is also allowable to use a sheet of a structure in which an aluminum foil is sandwiched by the PVF films or the Mylar films.

When light emitted from the light emitting element is directed toward the cover member, however, the cover member must be transparent. In this case, use is made of a transparent material such as glass plate, a plastic plate, a polyester film or an acrylic film.

As the filler material 4210, there can be used an ultraviolet-ray curable resin or a thermosetting resin in addition to the inert gas such as nitrogen or argon. Namely, there can be used a PVC (polyvinyl chloride), an acrylic resin, a polyimide, an epoxy resin, a silicone resin, a PVB (polyvinyl butyral) or an EVA (ethylenevinyl acetate). In this embodiment, nitrogen is used as the filler material.

In order to have the filler material 4210 exposed to a hygroscopic material (preferably, barium oxide) or a material capable of adsorbing oxygen, further, a recessed portion 4007 is formed in the sealing member 4008 on the side of the substrate 4001, and the hygroscopic material or the material 4207 capable of adsorbing oxygen is disposed therein. The hygroscopic material or the material 4207 capable of adsorbing oxygen is held in the recessed portion 4007 by a recessed portion-covering member 4208, so that the hygroscopic material or the material 4207 capable of adsorbing oxygen will not scatter. The recessed portion-covering member 4208 is of the form of a fine mesh which permits the air or water to pass through but does not permit the passage of the hygroscopic material or the material 4207 that adsorbs oxygen. Provision of the hygroscopic material or the material 4207 capable of adsorbing oxygen suppresses the deterioration of the light emitting element 4303.

Referring to FIG. 15C, the conductive film 4203a is formed to come in contact onto the detour wiring 4005a simultaneously with the formation of the pixel electrode 4203.

The anisotropic film 4300 has an conductive filler 4300a. Upon thermally adhering the substrate 4001 and the FPC 4006 together, the conductive film 4203a on the substrate

4001 and the wiring 4301 for FPC on the FPC 4006 are electrically connected together through the conductive filler 4300a.

Embodiment 7

Figure 30A:
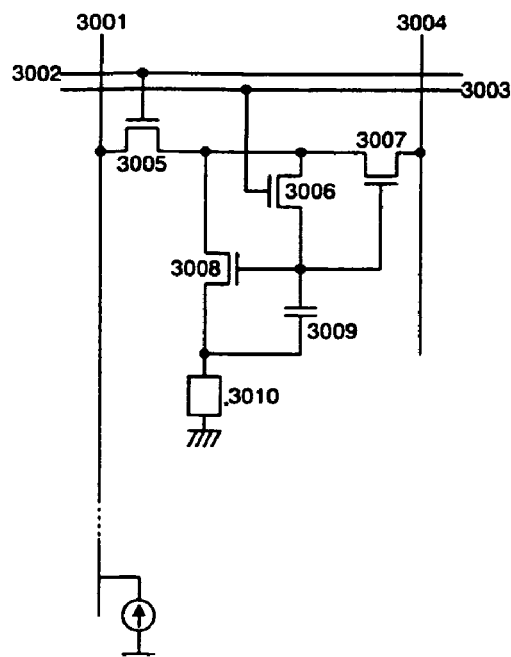
FIGS. 30A to 30D are diagrams showing operation and electric current pathways during signal write-in and light emission for a pixel having a structure that differs from that of Embodiment Mode 2.

In the structure shown in FIG. 28B, the first electrode of a storage TFT 2856 is connected to the source signal line 2801. an example in which the storage TFT 2856 connections are changed is shown in FIG. 30A. A first electrode of a storage TFT 3006 is connected to a second electrode of a switching TFT 3005 and a first electrode of a driver TFT 3007.

Figure 30B:
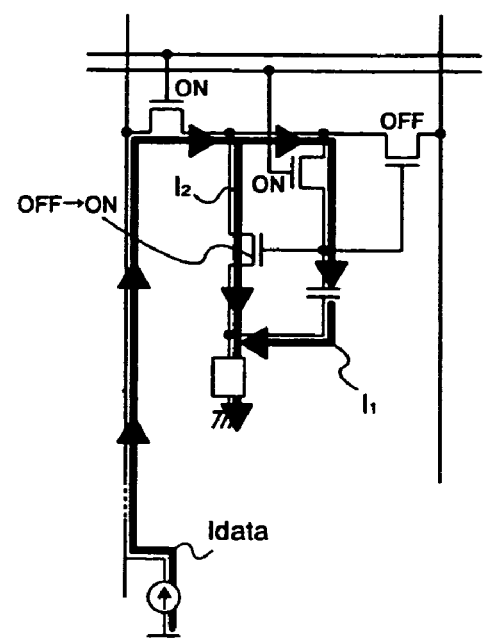
Figure 30C:
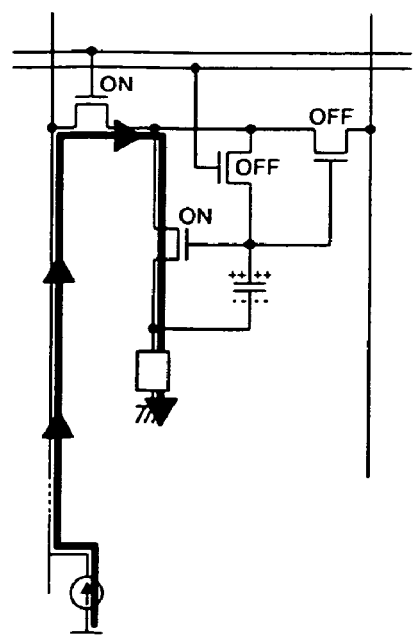
Figure 30D:
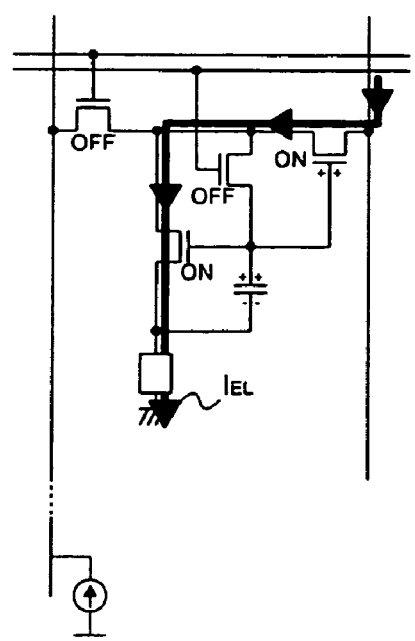

Signal electric current write-in and light emission operations are shown in FIGS. 30B to 30D, but other than an electric current pathway $I_1$ being slightly different, the operations are similar to those of FIGS. 28B to 28D, and therefore an explanation is omitted here.

Further, a storage TFT 3006 can be used as a reset TFT in a light emitting device driven by a time gray scale method using a digital image signal by making connections to the storage TFT 3006 like those of Embodiment 7. The voltage between a gate and a source of a driver TFT 3007 becomes zero, and the driver TFT 3007 turns off, by turning the storage TFT 3006 on after completing a light emission period. An electric current pathway to an EL element 3010 is cutoff as a result. Further, an electric charge that has accumulated in a storage capacitor 3009 is released through a pathway from the storage capacitor 3009 to the storage TFT 3006 to a converter and driver TFT 3008. As a result, the light emission period ends.

Note that although a detailed explanation regarding the time gray scale method is omitted here, the methods disclosed in JP 2001-5426 A and JP 2000-86968 may be referenced.

Note that similar operation is also possible using structures that differ from that of FIGS. 30A to 30D. In short, a pathway like that of FIG. 39A may be established when the signal electric current is input, and a pathway like that of FIG. 39B may be established during light emission. The switching elements and the like may therefore be disposed such that their positions are not inconsistent with the aforementioned pathways.

Embodiment 8

First, consider the pixel disclosed by Embodiment Mode 2. The switching TFT 2855 and the storage TFT 2856 are on when the signal electric current is written in, and therefore the gate electrode and the second electrode of the driver TFT 2807 have the same electric potential. That is, the voltage between the gate and the source becomes zero, and the TFT turns off.

However, there are cases in which a drain current will flow (normally on) even if the voltage between the gate and the source of a TFT is zero due to processing defects and the like. The driver TFT 2807 will thus be on during write-in of the signal electric current in this case.

Figure 31A:
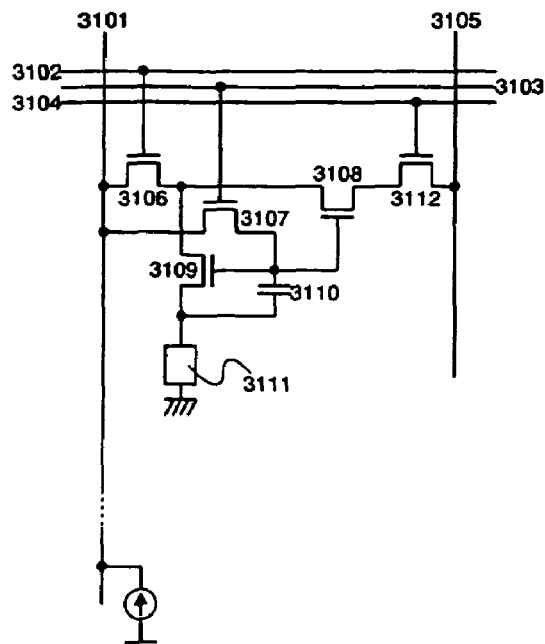
FIGS. 31A to 31D are diagrams showing operation and electric current pathways during signal write-in and light emission for a pixel having a structure that differs from that of Embodiment Mode 2.

Normal operation is possible for the switching TFT 2855 and the storage TFT 2856, even for cases in which it is assumed that they are normally on, by changing the electric potential of the gate signal line. However, the voltage between the gate and the source of the driver TFT 2807 is partially dependent upon the on or off state of the storage capacitor 2856, and the normally on problem cannot be resolved even if the electric potential of the signal line is changed. This problem may be solved by disposing a light emitting TFT 3112 between an electric current supply line 3105 and a driver TFT 3108, as shown in FIG. 31A.

Note that, although the light emitting TFT 3112 is connected in series with the driver TFT 3108, it may also be inserted in other locations provided that the locations are such that electric current leaking from the driver TFT 3108 can be cutoff. Further, the light emitting TFT 3112 uses a simple switching element, and therefore may have any polarity.

Figure 31B:
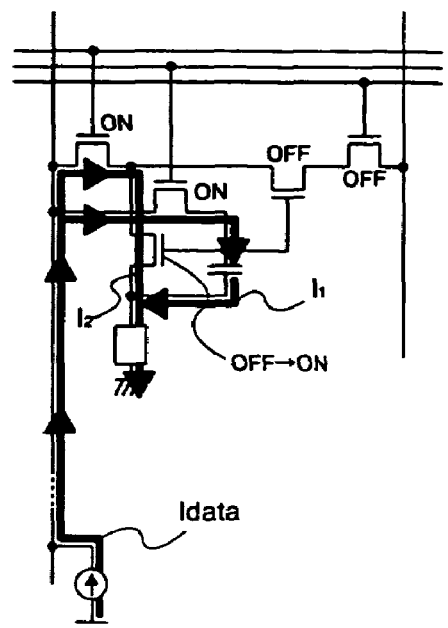
Figure 31C:
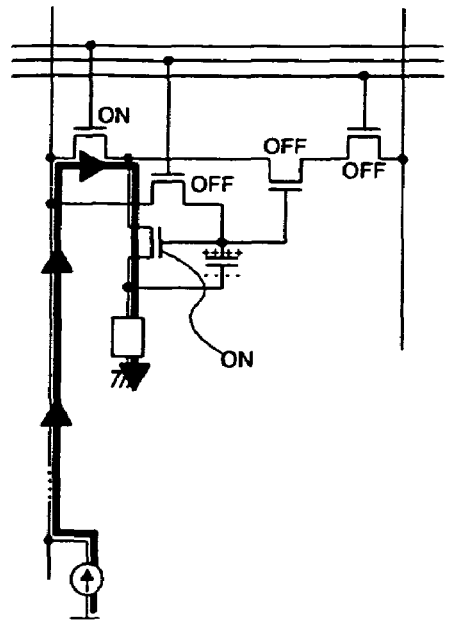
Figure 31D:
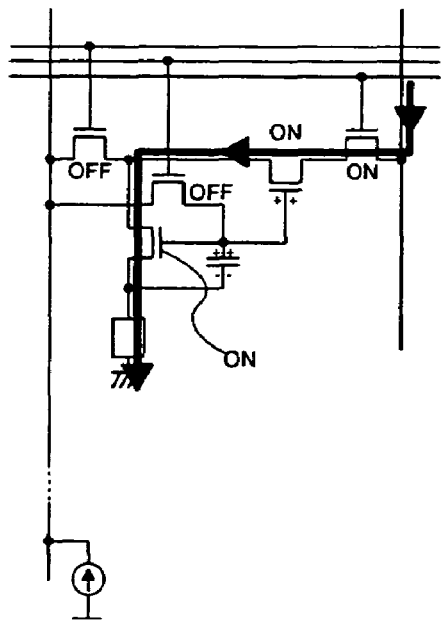

Operation is shown in FIGS. 31B to 31D. the light emitting TFT 3112 is turned off during write-in of the signal electric current, and is turned on during light emission. Other operations may be made similar to those shown in the embodiment modes.

Furthermore, the switching TFT 3106 and the storage TFT 3107 may both be controlled by the same gate signal line, as discussed above. The number of gate signal lines can thus be reduced, and the aperture ratio can be increased.

Further, the connections of the switching TFT 3106 and the storage TFT 3107 may also be changed as discussed in Embodiment 7. Similar changes corresponding to Embodiment Mode 1 and Embodiment 4 are also possible.

Embodiment 9

The voltage between the gate and the source of the driver TFT 2807 is zero during write-in of the signal electric current with the structure shown by FIGS. 28A and 28B, and therefore the driver TFT 2807 is turned off. The driver TFT 2807 then turns on, and light is emitted, when the switching TFT 2855 turns off due to a portion of the electric charge that has accumulated in the storage capacitor 2809 is transferred to the gate electrode of the driver TFT 2807.

For cases of considering parasitic capacitance of the gate electrode of the driver TFT 2807 here, electric charge does not accumulate in the gate electrode of the driver TFT 2807 during write-in of the signal electric current, and electric charge moves to the gate electrode of the driver TFT 2807 during light emission. The supply source of the electric charge is the storage capacitor 2809, and the voltage (VGS) that must be originally stored by the storage capacitor 2809 becomes smaller by the amount of the parasitic capacitance of the driver TFT 2807 due to the movement of electric charge.

The driver TFT 2807 may be turned on in advance in order to solve this problem. A structure for a case of performing this type of operation is shown in Embodiment 9.

Figure 32A:
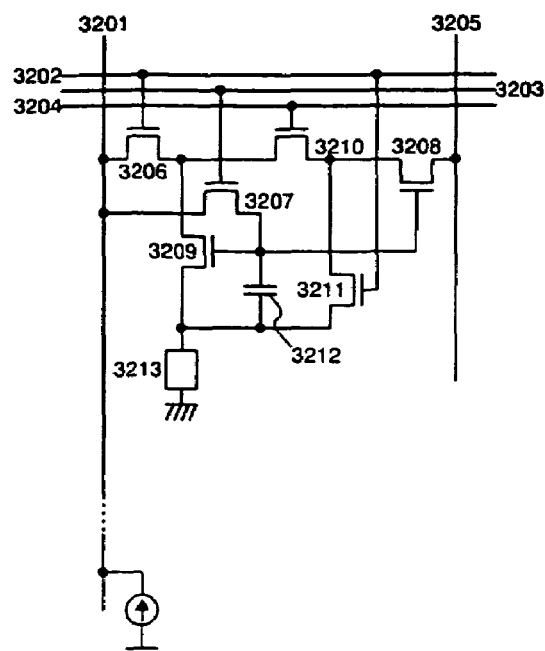
FIGS. 32A to 32D are diagrams showing operation and electric current pathways during signal write-in and light emission for a pixel having a structure that differs from that of Embodiment Mode 2.

The structure is shown in FIG. 32A. In addition to the structure shown in FIGS. 28A and 28B, a third gate signal line 3204, a light emitting TFT 3210, and a compensator TFT 3211 have been added. The light emitting TFT 3210 is controlled by the third gate signal line 3204, and the compensator TFT 3211 is controlled by a first gate signal line 3202, similar to a switching TFT 3206. The light emitting TFT 3210 is disposed between a second electrode of the switching TFT 3206 and a first electrode of the driver TFT 3208, and the compensator TFT 3211 is disposed between the first electrode of the driver TFT 3208 and one electrode of an EL element 3213. note that simple switching elements are used for the TFTs added here, and therefore they may have any polarity.

Write-in of a signal electric current is explained first. The first gate signal line 3202 and a second gate signal line 3203 are selected, the switching TFT 3206, a storage TFT 3207, and the compensator TFT 3211 turn on, and the signal electric current is input from a source signal line 3201.

A single electric current $I_{data}$ is divided into $I_1$ and $I_2$ here. Electric charge has not yet accumulated in a storage capacitor 3212 immediately after write-in begins, and therefore the driver TFT 3208 and a converter and driver TFT 3209 are both off, and $I_2=0$ at this point. Therefore $I_{data}=I_1$, electric current only develops in this period by the movement of electric charge that occurs with the accumulation of electric charge in the storage capacitor.

Electric charge then gradually builds up in the storage capacitor 3212, and an electric potential difference begins to develop between both electrodes of the storage capacitor 3212. The converter and driver TFT 3209 turns on when the electric potential difference between the electrodes reaches the threshold value of the converter and driver TFT 3209, and $I_2$ develops. $I_{data} = I_1 + I_2$, as stated above, and therefore $I_2$ becomes smaller but does not reach zero until the accumulation of electric charge in the storage capacitor 3212 is complete, and an electric current still develops.

Figure 32B:
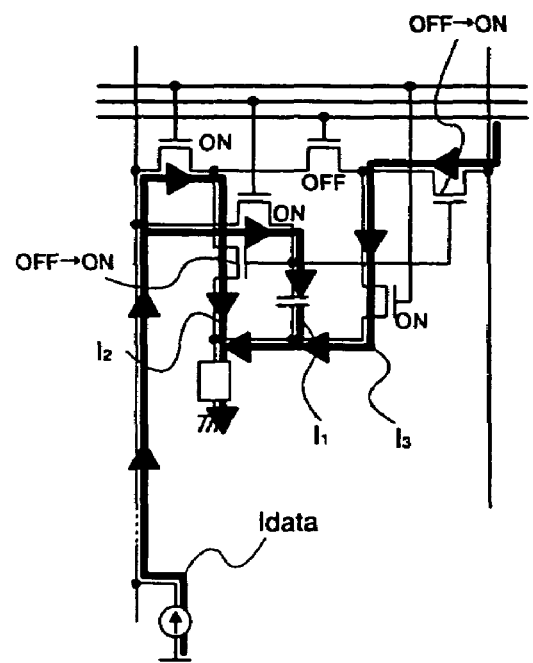
Figure 32C:
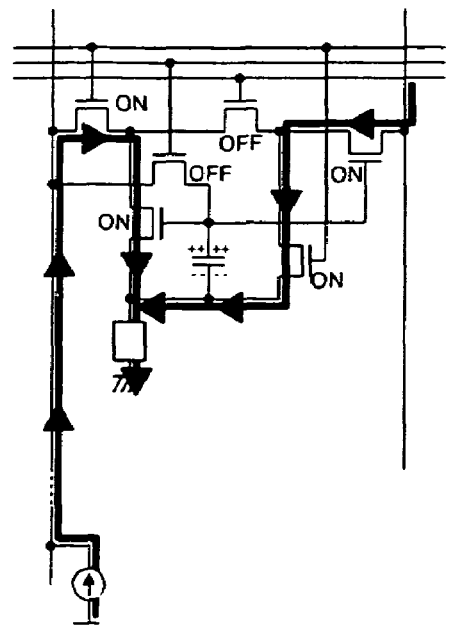
Figure 32D:
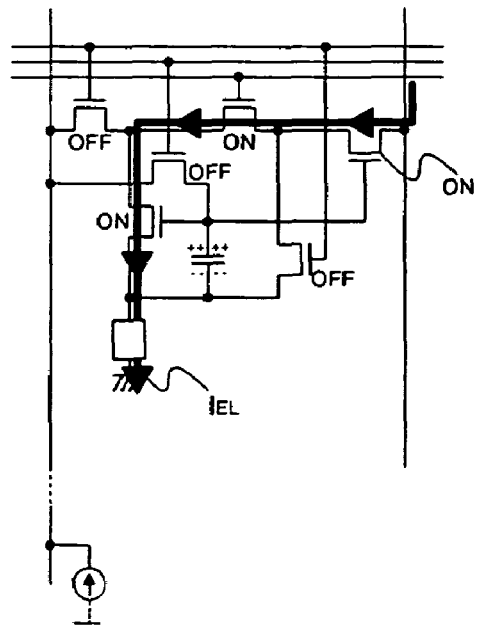

On the other hand, although the voltage between a gate and a source of the driver TFT 3208 became zero during write-in of the signal electric current in the embodiment modes, the light emitting TFT 3210 is disposed in Embodiment 9 and is turned off, and therefore an electric potential difference develops between the gate and the source of the driver TFT 3208, which turns on. Further, the compensator TFT 3211 is on, and therefore an electric current pathway from the electric current supply line 3205 to the driver TFT 3208 to the compensator TFT 3211 and to the EL element 3213 develops, and an electric current $I_3$ develops as shown in FIG. 32B. Note that $I_3$ is an independent electric current, and is not influenced by $I_{data}$, $I_1$, or $I_2$.

Electric charge accumulates in the storage capacitor 3212 until the electric potential difference between both electrodes in the storage capacitor 3212, namely the voltage between the gate and the source of the converter and driver TFT 3209, becomes a desired voltage, that is becomes a voltage (VGS) at which the converter and driver TFT 3209 causes as much as possible of the electric current $I_{data}$ to flow. When the accumulation of electric charge is then complete, the electric current $I_1$ stops flowing, and in addition, an electric current corresponding to VGS flows in the converter and driver TFT 3209 at this point, and $I_{data} = I_2$ (see FIG. 32B). Selection of the second gate signal line 3203 is completed next, the storage TFT 3207 turns off, and signal write-in operations are complete.

Light emission operations are covered next. Selection of the first gate signal line 3202 is complete, and the switching TFT 3206 and the compensator TFT 3211 turn off. On the other hand, the third gate signal line 3204 is selected, and the light emitting TFT 3210 turns on. The voltage between the gate and the source of the converter and driver TFT 3209 is stored in the storage capacitor at this point, and the gate electrode of the driver TFT 3208 is in a state in which electric charge has already flowed in, and therefore an electric current pathway from the electric current supply line to the driver TFT 3208 to the light emitting TFT 3210 to the converter and driver TFT 3209 and to the EL element develops. A light emitting electric current $I_{EL}$ develops. The EL element 3213 therefore emits light.

The gate electrode of the driver TFT 3208 and the gate electrode of the converter and driver TFT 3209 are connected, and therefore the two TFTs function as a multi-gate TFT at this point. Generally, if the gate length L in a TFT becomes longer, the drain current becomes smaller. In this case, the signal electric current finally flows only in the converter and driver TFT 3209 during signal write-in operations, while the signal electric current flows in the converter and driver TFT 3209 and in the driver TFT 3208 during light emission. The number of gate electrodes therefore becomes larger during light emission, the gate length L becomes longer as a result, and the relationship between the electric currents becomes $I_{data} > I_{EL}$.

In accordance with Embodiment 9, the driver TFT 3208 is also on during write-in of the signal electric current, and therefore electric charge flows into the gate electrode of the driver TFT 3208 and electric charge does not move from the storage capacitor 3212 during light emission. The parasitic capacitance of the gate of the driver TFT 3208 thus does not influence the gray scale.

Further, the switching TFT 3206 and the storage TFT 3207 may both be controlled by the same gate signal line, as discussed above. The number of gate signal lines can thus be reduced, and the aperture ration can be increased.

Furthermore, connections to the switching TFT 3206 and the storage TFT 3207 may also be changed as discussed in Embodiment 7. It is also possible to make similar changes corresponding to Embodiment Mode 1 and Embodiment 4.

Embodiment 10

A structure that uses p-channel TFTs for a converter and driver TFT and a driver TFT, differing from the structure of Embodiment Mode 1, is explained in Embodiment 10. Note that simple switching elements are used for all TFTs other than the converter and driver TFT and the driver TFT, and therefore the other TFTs may have any polarity.

Figure 33A:
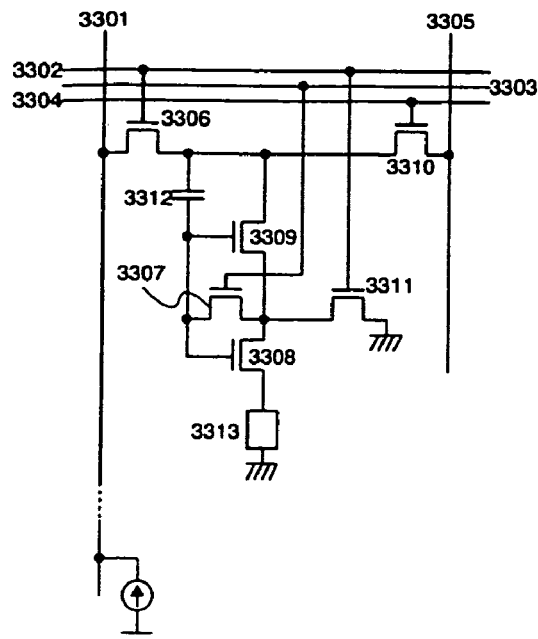
FIGS. 33A to 33D are diagrams showing operation and electric current pathways during signal write-in and light emission for a pixel having a structure that differs from that of Embodiment Mode 2.

A structure is shown in FIG. 33A. A pixel of FIG. 33A has a source signal line 3301, first to third gate signal lines 3302 to 3304, an electric current supply line 3305, a switching TFT 3306, a storage TFT 3307, a driver TFT 3308, a converter and driver TFT 3309, a light emitting TFT 3310, a control TFT 3311, a storage capacitor 3312, and an EL element 3313.

The a gate electrode of the switching TFT 3306 is connected to the first gate signal line 3302, a first electrode of the switching TFT 3306 is connected to the source signal line 3301, and a second electrode of the switching TFT 3306 is connected to a first electrode of the converter and driver TFT 3309 and a first electrode of the light emitting TFT 3310. A second electrode of the converter and driver TFT 3309 is connected to a first electrode of the driver TFT 3308, and gate electrodes of the converter and driver TFT 3309 and the driver TFT 3308 are connected to each other. A second electrode of the driver TFT 3308 is connected to one electrode of the EL element 3313. A gate electrode of the storage TFT 3307 is connected to the second gate signal line 3303, a first electrode of the storage TFT 3307 is connected to the gate electrode of the converter and driver TFT 3309 and the gate electrode of the driver TFT 3308, and a second electrode of the storage TFT 3307 is connected to the second electrode of the converter and driver TFT 3309 and the first electrode of the driver TFT 3308. A gate electrode of the light emitting TFT 3310 is connected to the third gate signal line 3304, and a second electrode of the light emitting TFT 3310 is connected to the electric current supply line 3305. A gate electrode of the control TFT 3311 is connected to the first gate signal line 3302, and a first electrode of the control TFT 3311 is connected to the second electrode of the converter and driver TFT 3309, the first electrode of the driver TFT 3308, and the second electrode of the storage TFT 3307. Predetermined electric potentials are input to the electric current supply line 3305 and the second electrode of the EL element 3313, and they thus have a mutual electric potential difference. Further, a certain constant electric potential is input to the second electrode of the control TFT 3311. There are no particular limitations placed on the value of this electric potential, provided that it is always less than the electric potential of the source signal line 3301. Further, although the second electrode of the storage TFT 3307 is connected to the first electrode of the driver TFT 3308 and the second electrode of the converter and driver TFT 3309, it may also be connected to the second electrode of the control TFT 3311, namely, connected to the certain constant electric potential.

Figure 33B:
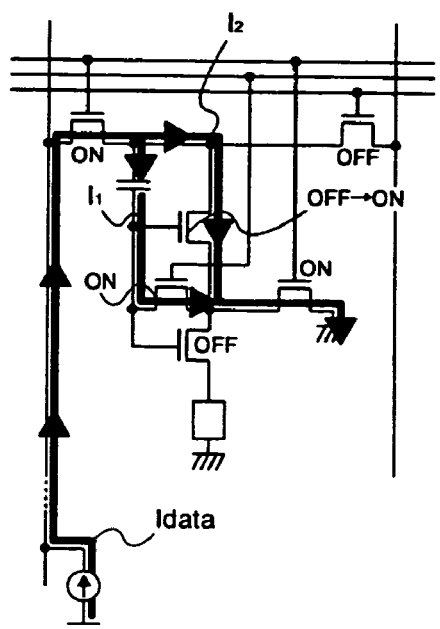
Figure 33C:
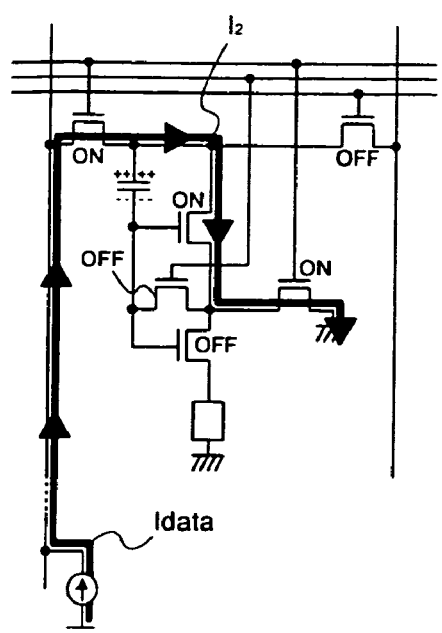
Figure 33D:
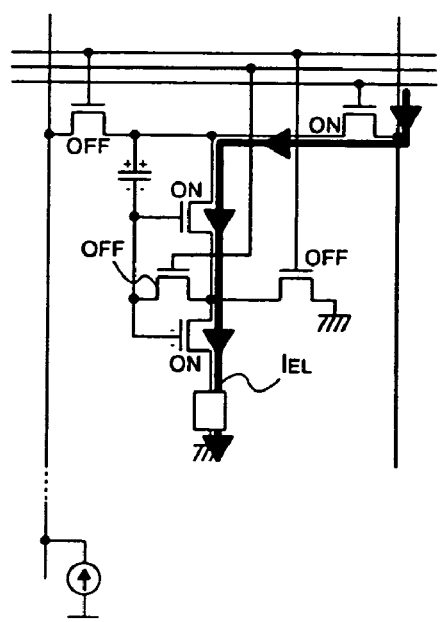

Operation from write-in of a signal electric current to light emission is explained using FIGS. 33B to 33D. The first and the second gate signal lines are selected first, the switching TFT 3306, the control TFT 3311, and the storage TFT 3307 turn on, and the signal electric current is input from the source signal line 3301 (see FIG. 33B).

A signal electric current $I_{data}$ flows separated into $I_1$ and $I_2$ here. Electric charge has not yet accumulated in the storage capacitor 3312 immediately after write-in begins, and therefore the driver TFT 3308 and the converter and driver TFT 3309 are both off, and $I_2=0$ at this point. The voltage between a gate and a source of the driver TFT 3308 becomes zero because the storage TFT 3307 is on, and therefore the driver TFT 3308 turns itself off. Consequently, $I_{data}=I_1$, and electric current only develops during this period due to the movement of electric charge accompanying the accumulation of electric charge in the storage capacitor.

Electric charge gradually builds up in the storage capacitor 3312, and an electric potential difference begins to develop between both electrodes of the storage capacitor 3312. The converter and driver TFT 3309 turns on, and $I_2$ develops, when the electric potential difference between the two electrodes reaches the threshold value of the converter and driver TFT 3309. As stated above, $I_{data}=I_1+I_2$, and therefore $I_1$ gradually is reduced but does not reach zero until the accumulation of electric charge in the storage capacitor 3312 is complete. Electric current thus still develops.

Further, the voltage between the gate and the source of the driver TFT 3308 becomes zero due to the storage TFT 3307 being on, and therefore the driver TFT 3308 turns off. The signal electric current $I_{data}$ consequently flows through the control TFT 3311, and does not flow in the EL element 3313.

Electric charge accumulates in the storage capacitor 3312 until the electric potential between both electrodes in the storage capacitor 3312, namely the voltage between the gate and the source of the converter and driver TFT 3309, becomes a desired voltage, that is becomes a voltage (VGS) at which the converter and driver TFT 3309 causes as much as possible of the electric current $I_{data}$ to flow. When the accumulation of electric charge is then complete, the electric current $I_1$ stops flowing, and in addition, an electric current corresponding to VGS flows in the converter and driver TFT 3309 at this point, and $I_{data}=I_2$ (see FIG. 33C). Selection of the second gate signal line 3303 is completed next, the storage TFT 3307 turns off. Selection of the first gate signal line 3302 finished next, the switching TFT 3306 and the control TFT 3311 turn off, and signal write-in operations are complete.

Light emission operations are covered next. When the signal electric current write-in operations are complete, an electric current pathway from the source signal line 3301 to the switching TFT 3306 to the converter and driver TFT 3309 to the control TFT 3311 and to the electric power source is cutoff. A portion of the electric charge that has accumulated in the storage capacitor 3312 due to $I_{data}$ flowing in the converter and driver TFT 3309 up to this point then moves to the gate electrode of the driver TFT 3308. The driver TFT 3308 thus automatically turns on. If the third gate signal line is selected and the light emitting TFT 3310 turns on, then an electric current pathway from the electric current supply line 3305 to the light emitting TFT 3310 to the converter and driver TFT 3309 to the driver TFT 3308 and to the EL element 3313 develops as shown in FIG. 33D, and a light emitting electric current $I_{EL}$ flows. The EL element 3313 thus emits light.

The gate electrode of the driver TFT 3308 and the gate electrode of the converter and driver TFT 3309 are connected, and therefore the two TFTs function as a multi-gate TFT at this point. Generally, if the gate length L in a TFT becomes longer, the drain current becomes smaller. In this case, the signal electric current finally flows only in the converter and driver TFT 3309 during signal write-in operations, while the signal electric current flows in the converter and driver TFT 3309 and in the driver TFT 3308 during light emission. The number of gate electrodes therefore becomes larger during light emission, the gate length L becomes longer as a result, and the relationship between the electric currents becomes $I_{data} > I_{EL}$.

Figure 39A:
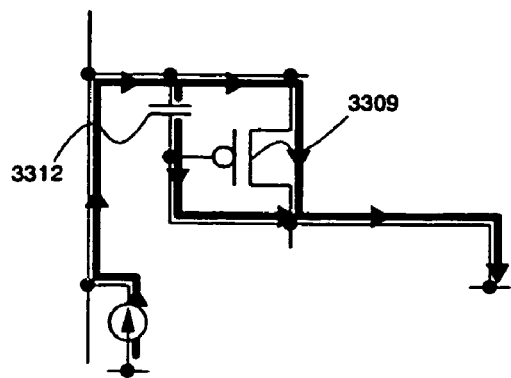
FIGS. 39A and 39B are diagrams showing electric current pathways for the pixel shown in FIGS. 33A to 33D.
Figure 39B:
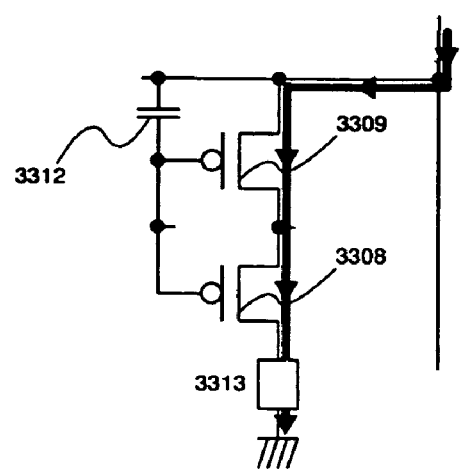

Note that a pathway like that of FIG. 39A may be formed during the input of the signal electric current, and that a pathway like that of FIG. 39B may be formed during light emission. The switching elements and the like may thus be disposed so as not to interfere with the pathways.

In accordance with Embodiment 10, the signal electric current $I_{data}$ does not flow into the EL element 3313 during write in of the signal electric current. Consequently, there is no influence due to the EL element 3313 acting as a load, and therefore write-in of the signal electric current can be performed at very high speed.

Furthermore, the switching TFT 3306 and the storage TFT 3307 may be controlled by the same gate signal line as discussed above. The number of gate signal lines can thus be reduced, and the aperture ratio can be increased.

Further, the converter and driver TFT and the driver TFT can also have p-channel structures in the embodiment modes and other embodiments by applying Embodiment 10.

Figure 37C:
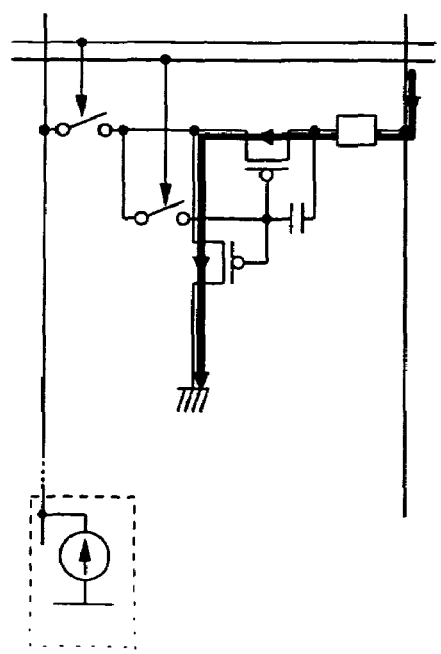

It is also possible to use a structure in which the converter and driver TFT and the driver TFT are p-channel in the structure shown in FIGS. 28A and 28B. An example of a structure for this case is shown in FIG. 37A. Aside from the converter and driver TFT and the driver TFT, the TFTs used as switching elements may be disposed in locations such that a pathway like that of FIG. 37B is established during signal electric current input, and a pathway like that of FIG. 37C is established during light emission.

Note that the signal electric current $I_{data}$ does not flow into the EL element in Embodiment 10. If the signal electric current $I_{data}$ were to flow into the EL element, then the amount of time until the EL element reaches a steady state will be added to the time for writing in electric charge to the storage capacitor, that is, the amount of time for original electric current setting, and as a result it becomes necessary to lengthen the signal write-in period. A structure like that of FIGS. 40A to 40C may be used for cases in which it is desired to shorten the amount of time for signal write-in with the circuits given as embodiments up to this point, for example FIGS. 28A and 28B and FIGS. 30A and 30B, in which the signal electric current $I_{data}$ flows in the EL element.

Figure 40A:
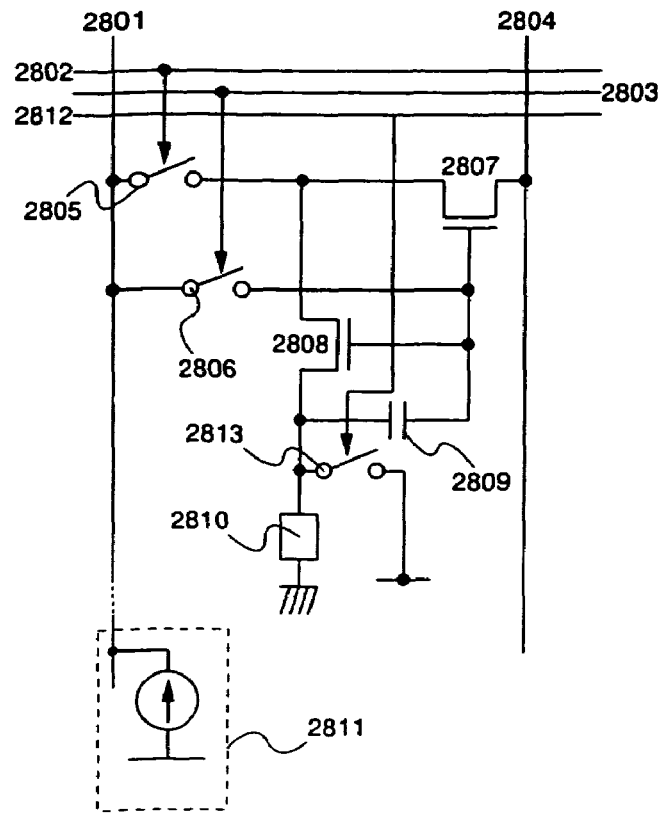
FIGS. 40A to 40C are diagrams showing examples in which a portion of the pixel structure shown in FIGS. 28A and 28B is changed.
Figure 40B:
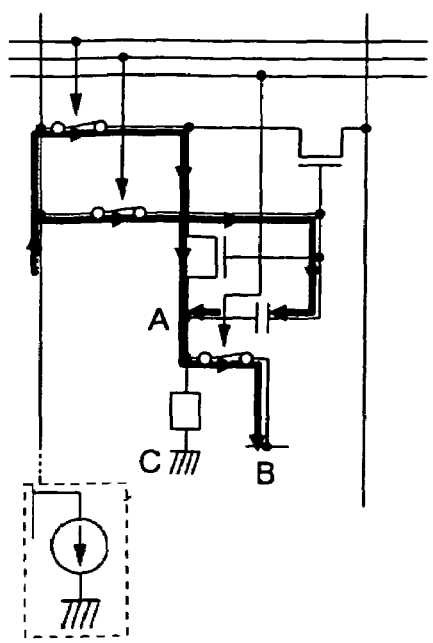
Figure 40C:
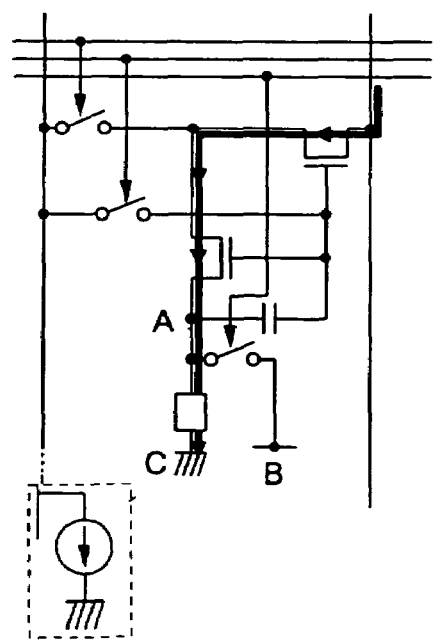

FIG. 40A is an example of applying the aforementioned procedures to the circuit of FIGS. 28A and 28B. A terminal not connected to a common electrode of the EL element is connected to a node having a certain voltage (preferable an electric power line or the like) through a TFT. The TFT is on during write-in of the signal electric current, and is off during light emission. Electric current pathways during signal electric current write-in and light emission are those shown in FIGS. 40B and 40C, respectively.

The electric potential of point A is quickly fixed to the electric potential of point B when the TFT turns on during signal electric current write-in. A steady state can therefore be quickly achieved, and the signal electric current write-in can be completed in a short amount of time.

The electric potential of the point B is arbitrary, but it is preferable that the electric potential be one such that the EL element does not emit light so as not to impart influence to the display. Furthermore, if the electric potential of a point C is made less than the electric potential of one electrode of the EL element (a cathode for the case of FIGS. 40A and 40B), then it is possible to apply a reverse bias to the EL element during write-in of the signal electric current.

Embodiment 11

Dispersion between elements is one problem faced for cases of circuit structures that use TFTs. Normally, the dispersion in the characteristics of adjacently disposed elements can be made relatively small, but for a case in which the dispersion of the element characteristics in a pixel portion are considered, for example if the dispersion in characteristics develops between adjacent pixels, then display irregularities will be able to be recognized, even if the dispersion is slight.

A method in which the TFTs in use are switched every certain period of time is used as a method of improving upon display irregularities caused by the dispersion between adjacent elements. The dispersion in the TFT characteristics can thus be averaged over time, and display irregularities can be made harder to recognize. The TFTs that become switching objects are those that are capable of imparting influence to display irregularities. That is, in particular, it is not necessary to change the TFTs in use for TFTs that are used as simple switching elements.

Figure 24A:
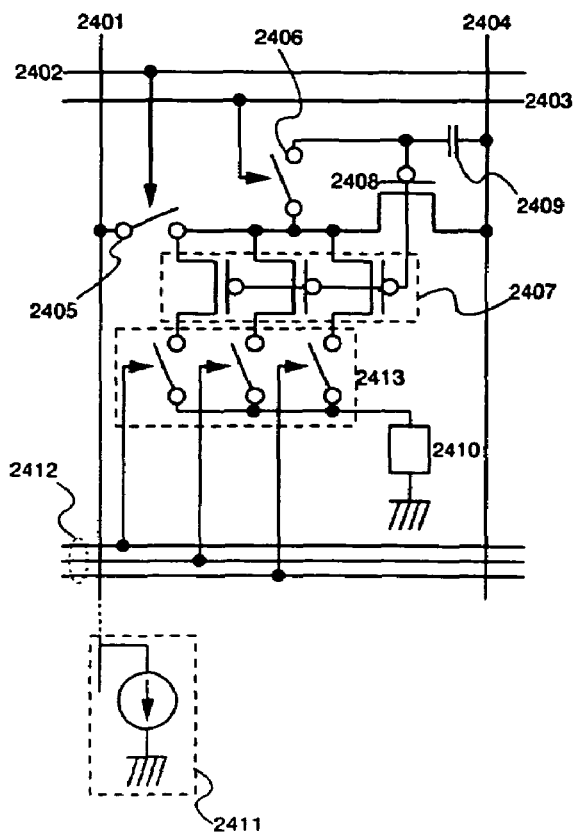
FIGS. 24A and 24B are diagrams showing examples having structures in which display irregularities due to dispersion between adjacent TFTs are averaged.
Figure 24B:
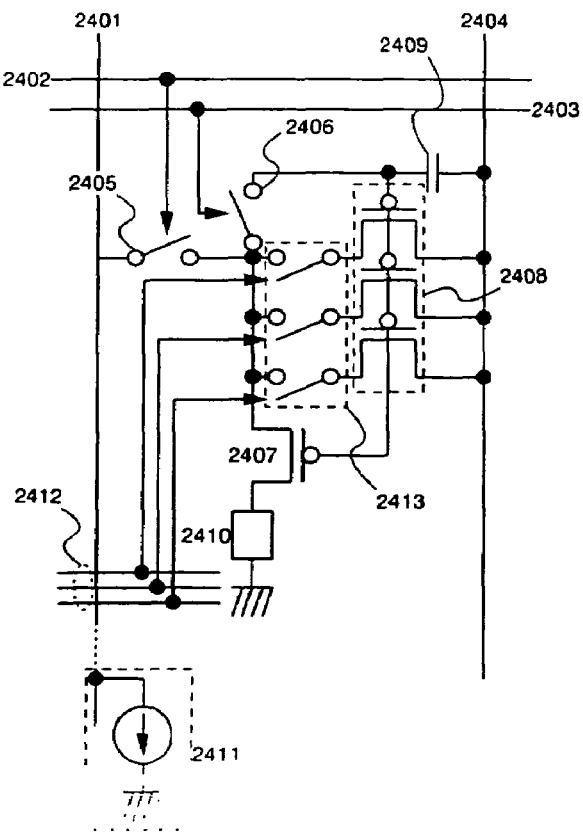

A structure like that shown in FIGS. 24A and 24B is proposed as an example. FIG. 24A is the example applied to the structure of FIG. 1A. If the characteristics of the converter and driver TFT 108 and the characteristics of the driver TFT 107 of the circuit in FIG. 1A are different, then there is the possible of display irregularities developing. The driver TFT 107 is given a structure in which a plurality of TFTs are disposed in parallel as denoted by reference numeral 2407 in FIG. 24A (three are shown as an example in the figure), and electric current flows in each of the TFTs. In addition, control of the conductivity and cutoff of each pathway is performed by switching elements 2413. Note that the switching element 2413 is not limited to the position of FIGS. 24A and 24B, provided that its position is one capable of selecting an electric current pathway for the TFTs connected in parallel, and performing control.

Basic portions of a driving method are similar to those shown in FIGS. 1A and 1B, but during light emission at least one of the switching elements 2413 is on, and electric current is supplied to a light emitting element 2410 through that pathway.

Note that a plurality of the switching elements 2413 may be on at the same time, and electric current may be supplied to the light emitting element 2410 through a plurality of pathways.

For example, the electric current pathway is changed by the switching elements 2413 each single frame period or each single subframe period. Even if there is dispersion between adjacent TFTs, there is switching between the TFTs possessing the different characteristics temporally, and therefore display irregularities are averaged over time. An effect in which it becomes difficult to recognize display irregularities can thus be obtained.

FIG. 24B is an example in which there is only one driver TFT 2407, but a plurality of converter and driver TFTs 2408 are disposed in parallel (three are used as an example in the figure). Switch over between electric current pathways is performed by the switching elements 2413. The circuit structure differs from that of FIG. 24A, but the effect in which display irregularities can be averaged over time by switching between different electric current pathways is similar. The switching elements 2413 are all conductive during electric current write-in here, and at least one is conductive during light emission.

Note that only a portion of the switching elements 2413 may be made conductive during electric current write-in. However, it is possible to perform the write-in operations in a very short period of time by increasing the electric current pathways during write-in by making all of the switching elements 2413 conductive, and this is therefore preferable.

Note that a plurality of the switching elements 2413 may also be on at the same time during light emission, thus supplying electric current to the light emitting element 2410 through a plurality of pathways.

Figure 25:
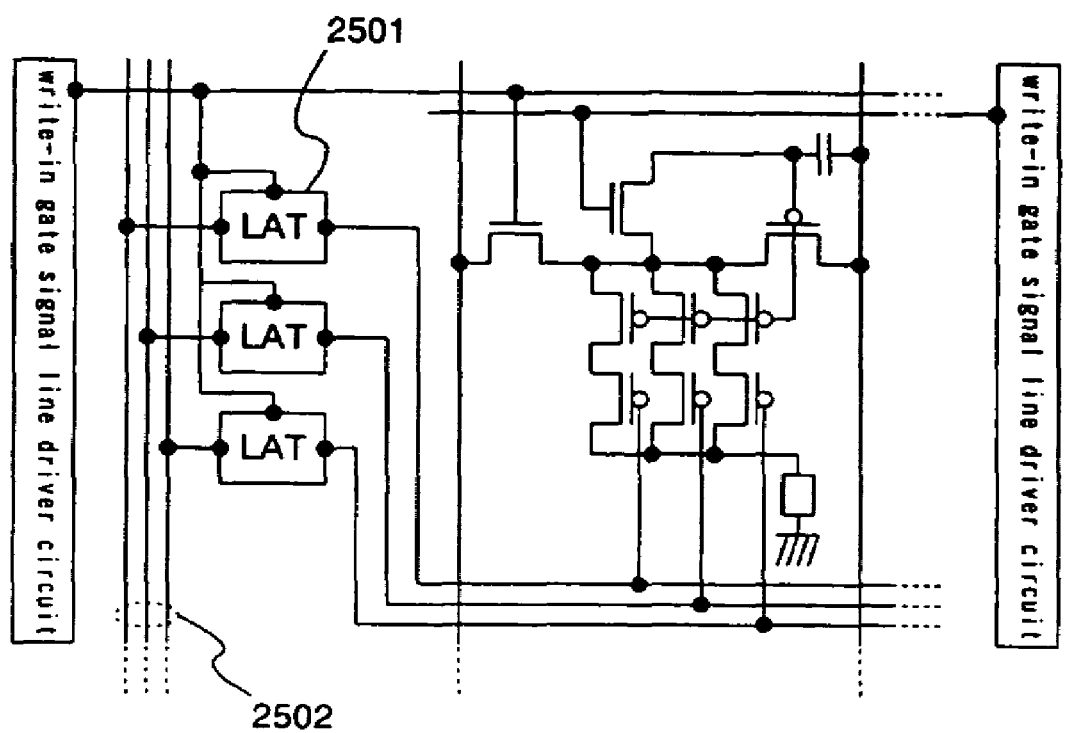
FIG. 25 is a diagram for briefly explaining a method of driving the pixels shown in FIGS. 24A and 24B, and explaining the structure of a driver circuit.

The switching elements 2413 for switching between the electric current pathways are controlled by the timing of pulses input to an electric current selection gate signal line 2412. The pulses are generated by a write-in gate signal line driver circuit as shown in FIG. 25, for example, and the gate signal line selection pulses are stored in a latching circuit 2501. A timing pulse is input to an electric current signal line 2502 from the outside, and some of the switching elements are made conductive at a desired timing. Conversely, operation may also be performed by switching between the switching elements 2413 in all pixels at the same time.

Further, the switching elements 2413 formed here do not control the value of the electric current supplied to the light emitting elements, and only function as switches for selecting one electric current pathway from a plurality of electric current pathways. They switching elements 2413 may therefore have any polarity.

Figure 5:
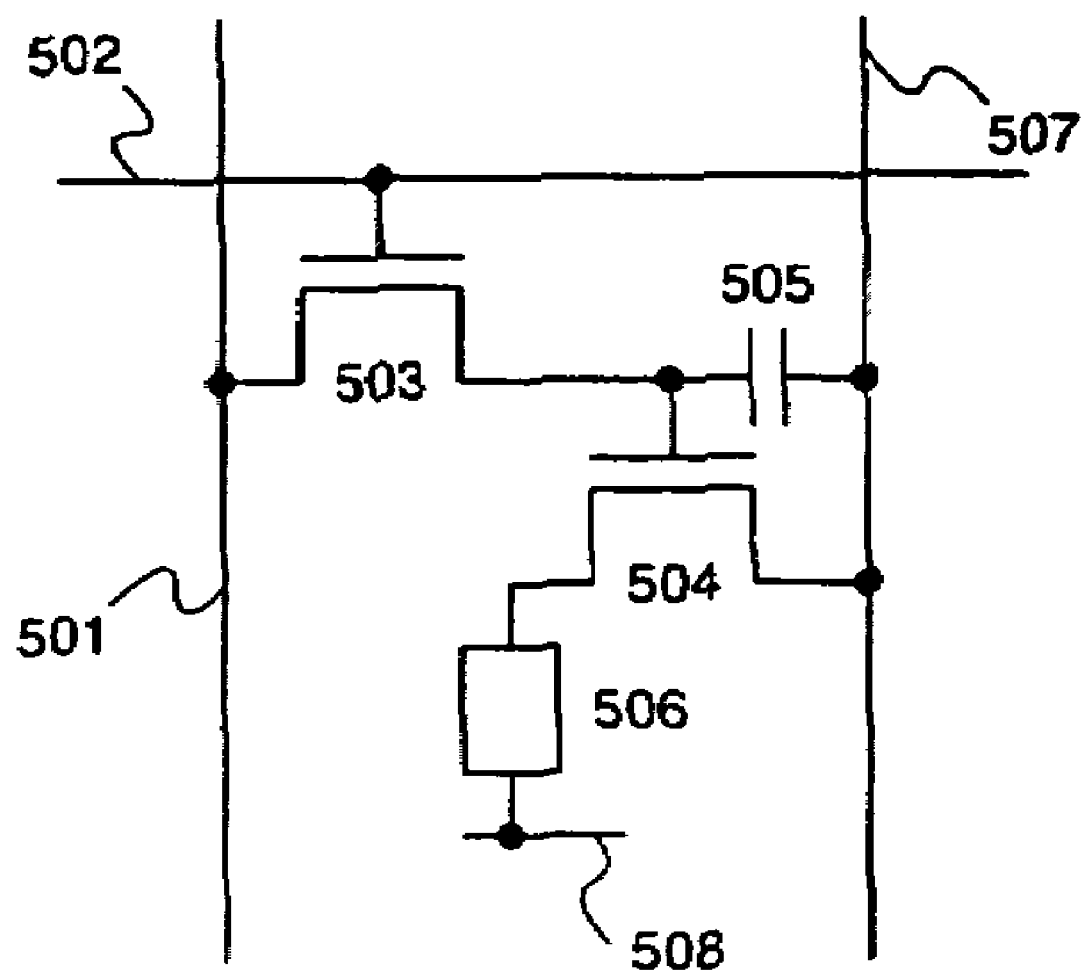
FIG. 5 is a diagram showing the structure of a pixel in a general semiconductor device.
Figure 26A:
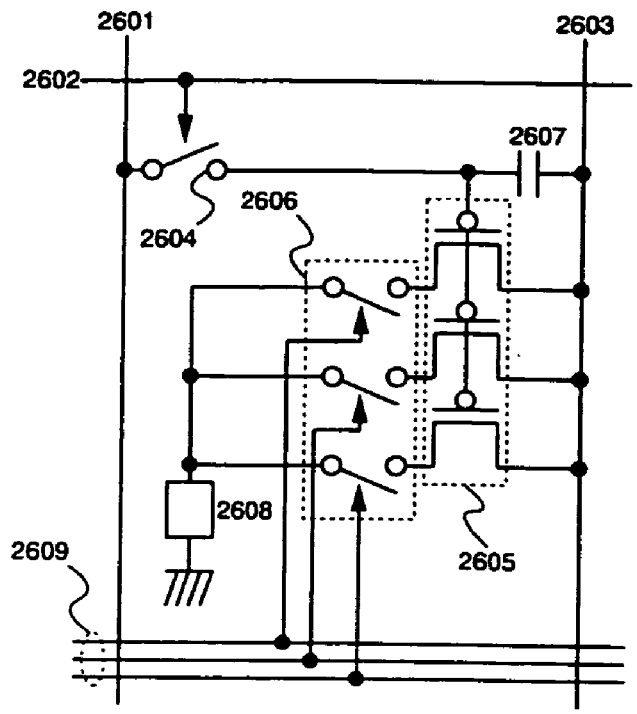
FIGS. 26A and 26B are diagrams showing examples having structures in which display irregularities due to dispersion between adjacent TFTs are averaged.

Note that the structure proposed here can also be easily applied to pixels having different structures. A structure shown in FIG. 26A is one in which the proposed structure of Embodiment 11 is applied to the structure shown in FIG. 5. An electric current pathway is selected by switching elements 2606, and electric current is supplied to a light emitting element 2608 via at least one of a plurality of driver TFTs 2605 disposed in parallel (three are used as an example in the figure).

Figure 6:
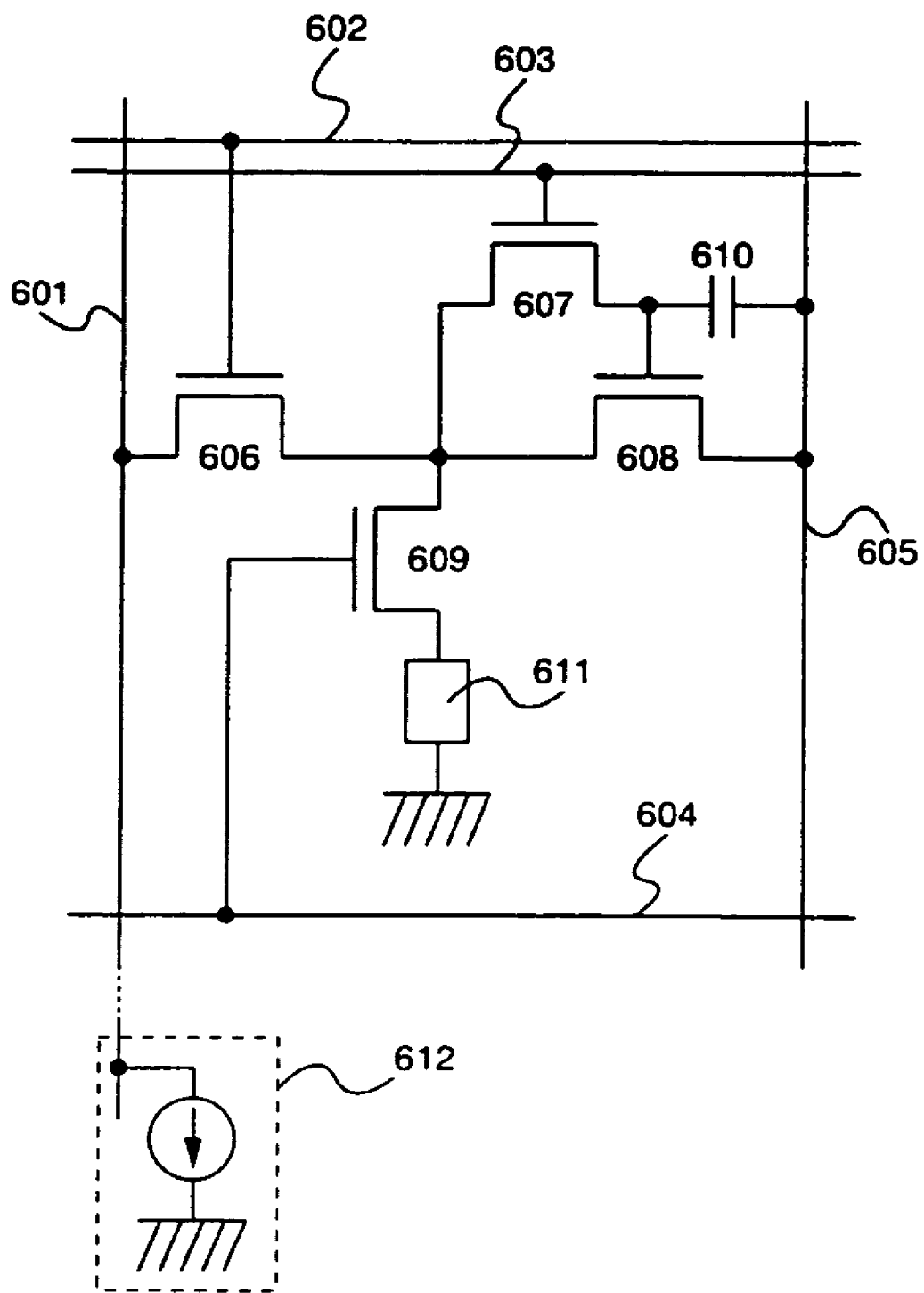
FIG. 6 is a diagram showing the structure of a pixel in a typical electric current write-in semiconductor device.
Figure 7A:
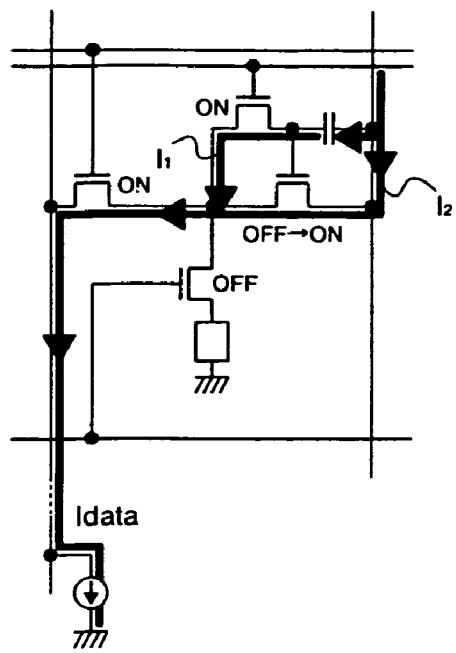
FIGS. 7A to 7E are diagrams showing operation and electric current pathways during signal write-in and light emission for the pixels shown in FIG. 6.
Figure 7B:
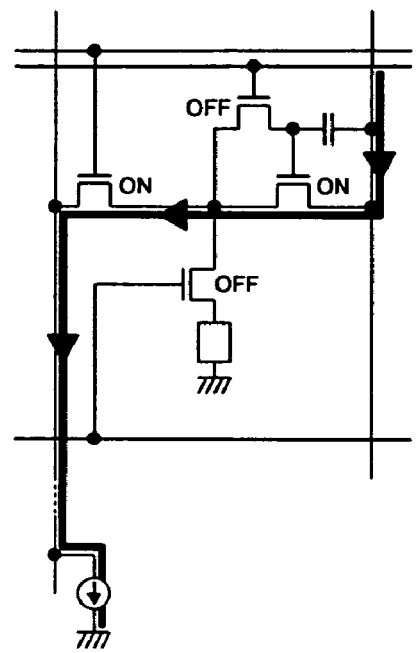
Figure 7C:
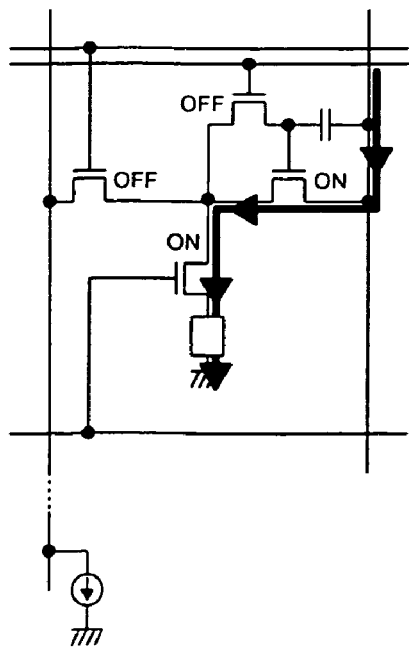
Figure 7D:
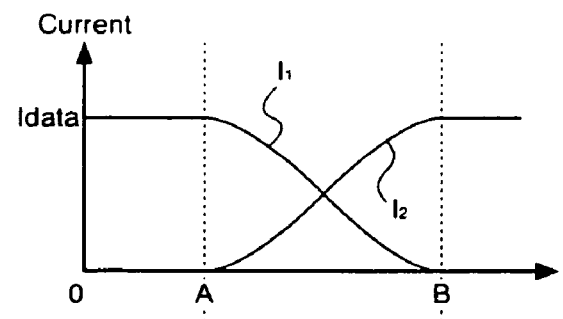
Figure 7E:
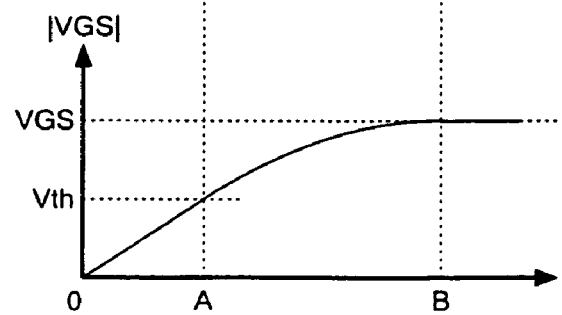
Figure 26B:
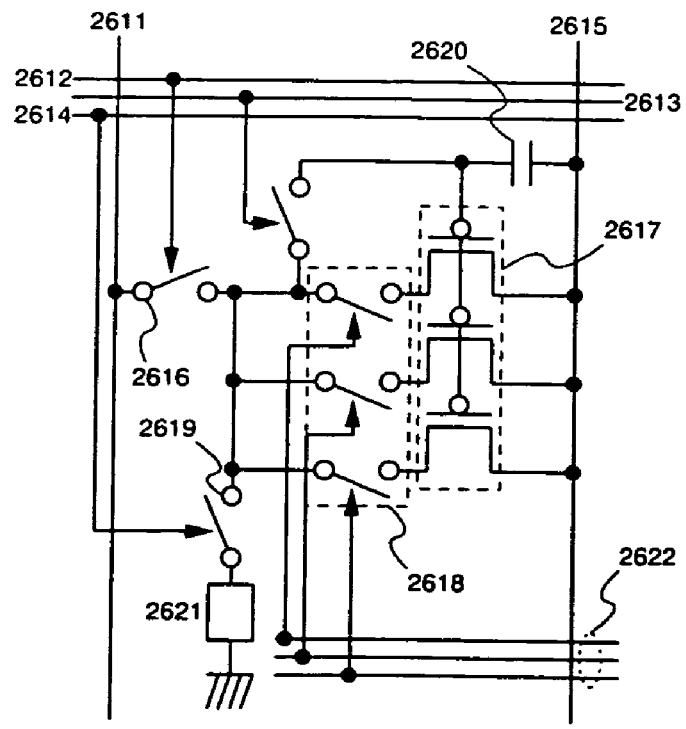

FIG. 26B is a diagram of the structure proposed by Embodiment 11 applied to the structure shown in FIG. 6. The TFT 608 has a plurality of converter TFTs 2617 disposed in parallel (three are used as an example in the figure), and switching elements 2618. An electric current pathway is selected by the switching elements 2618, and electric current is supplied to a light emitting element 2621 via at least one converter TFT 2617.

Note that the signal electric current for write-in operations can be made very large by making a lot of the switching elements 2618 conductive during electric current write-in, and making very few of the switching elements conductive during light emission. Write-in operations can thus be performed in a very short period of time.

Figure 17:
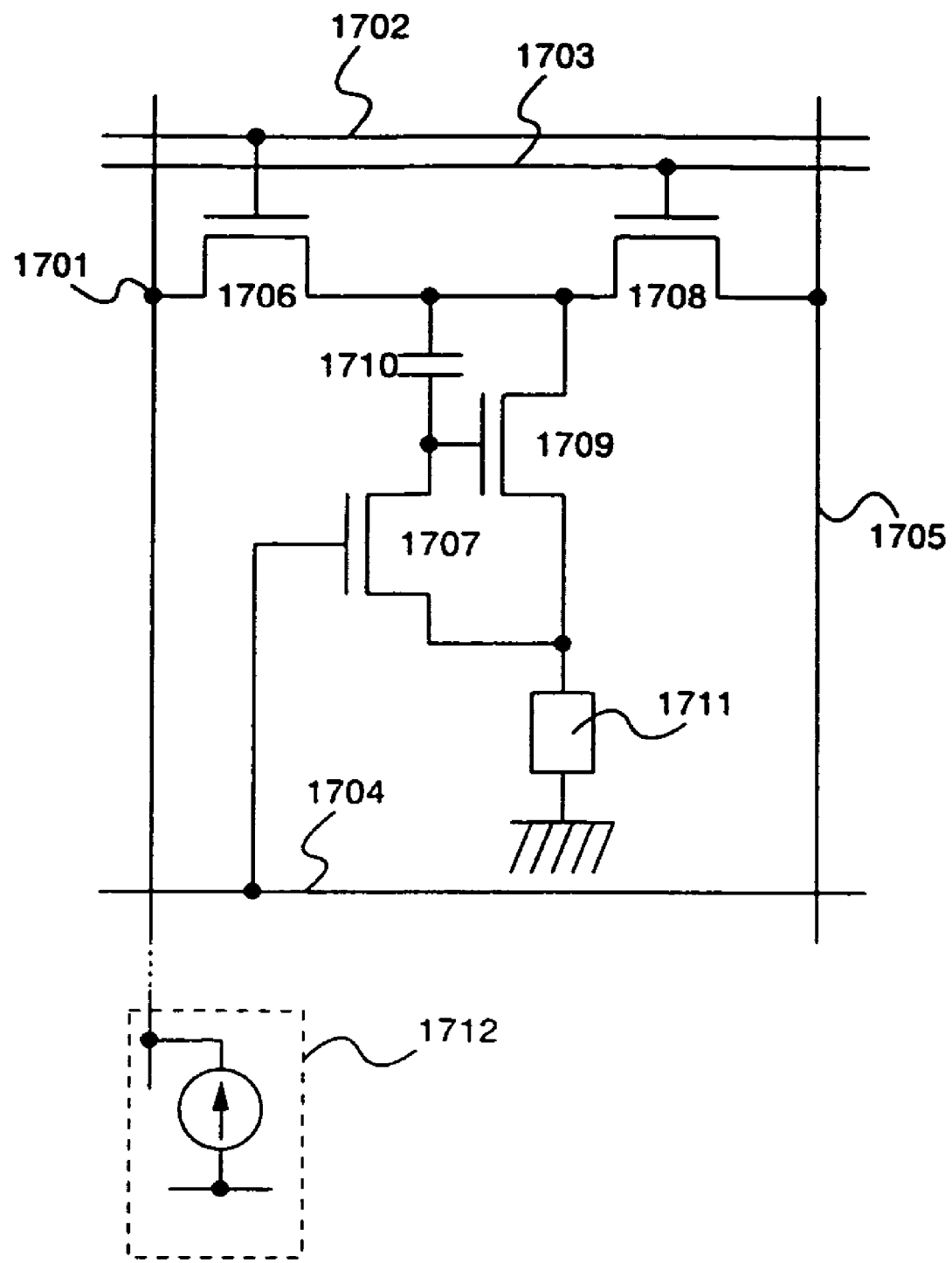
FIG. 17 is a diagram showing the structure of a pixel of a typical electric current write-in semiconductor device.
Figure 18A:
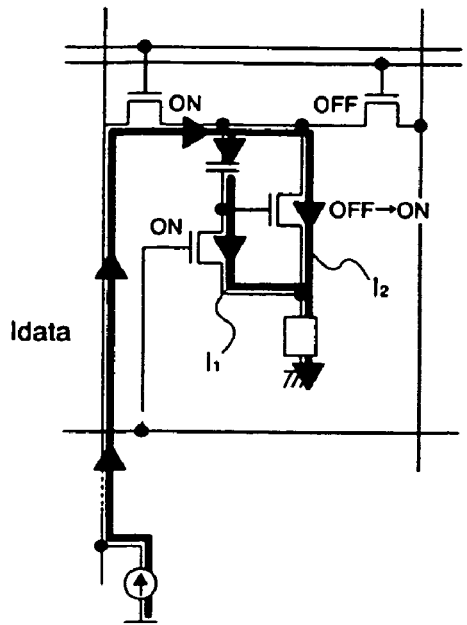
FIGS. 18A to 18E are diagrams showing operation and electric current pathways during signal write-in and light emission for the pixel shown in FIG. 17.
Figure 18B:
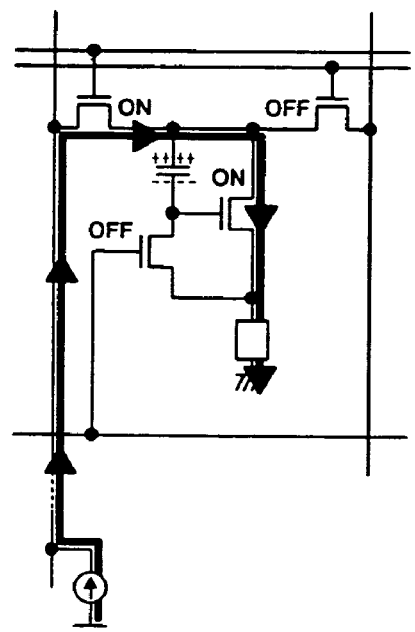
Figure 18C:
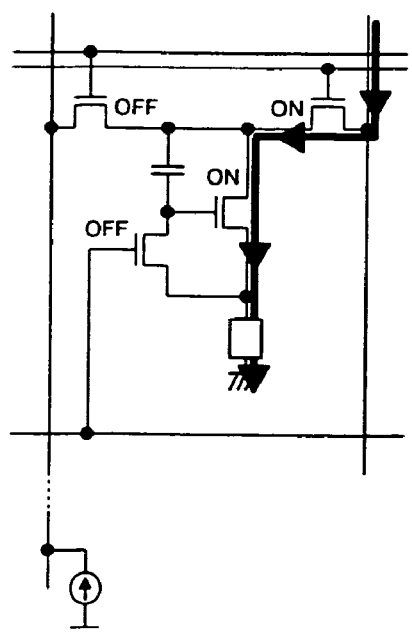
Figure 18D:
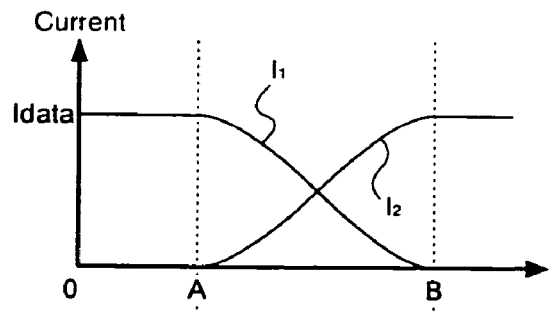
Figure 18E:
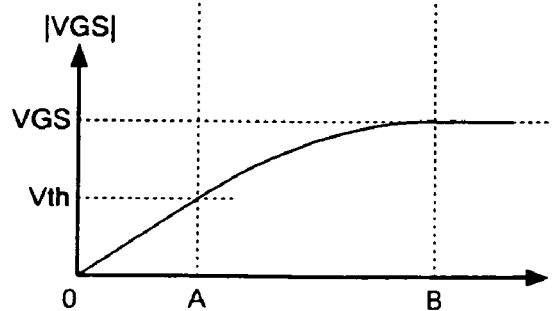
Figure 27A:
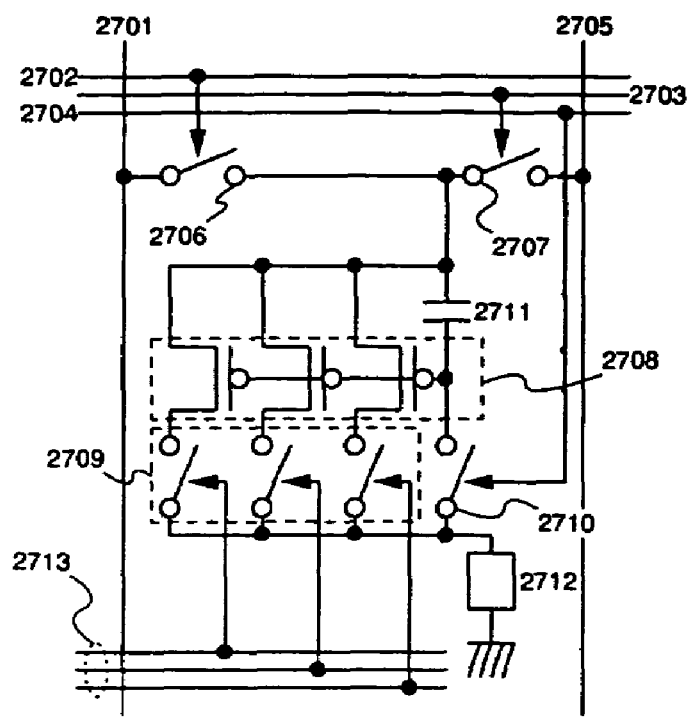
FIGS. 27A and 27B are diagrams showing examples having structures in which display irregularities due to dispersion between adjacent TFTs are averaged.

FIG. 27A is a diagram of the structure proposed by Embodiment 11 applied to the structure shown in FIG. 17. The TFT 1709 has a plurality of converter TFTs 2708 disposed in parallel (three are used as an example in the figure), and switching elements 2709. An electric current pathway is selected by the switching elements 2709, and electric current is supplied to a light emitting element 2712 via at least one of the converter TFTs 2708.

Note that the signal electric current for write-in operations can be made very large by making a lot of the switching elements 2709 conductive during electric current write-in, and making very few of the switching elements conductive during light emission. Write-in operations can thus be performed in a very short period of time.

Figure 19:
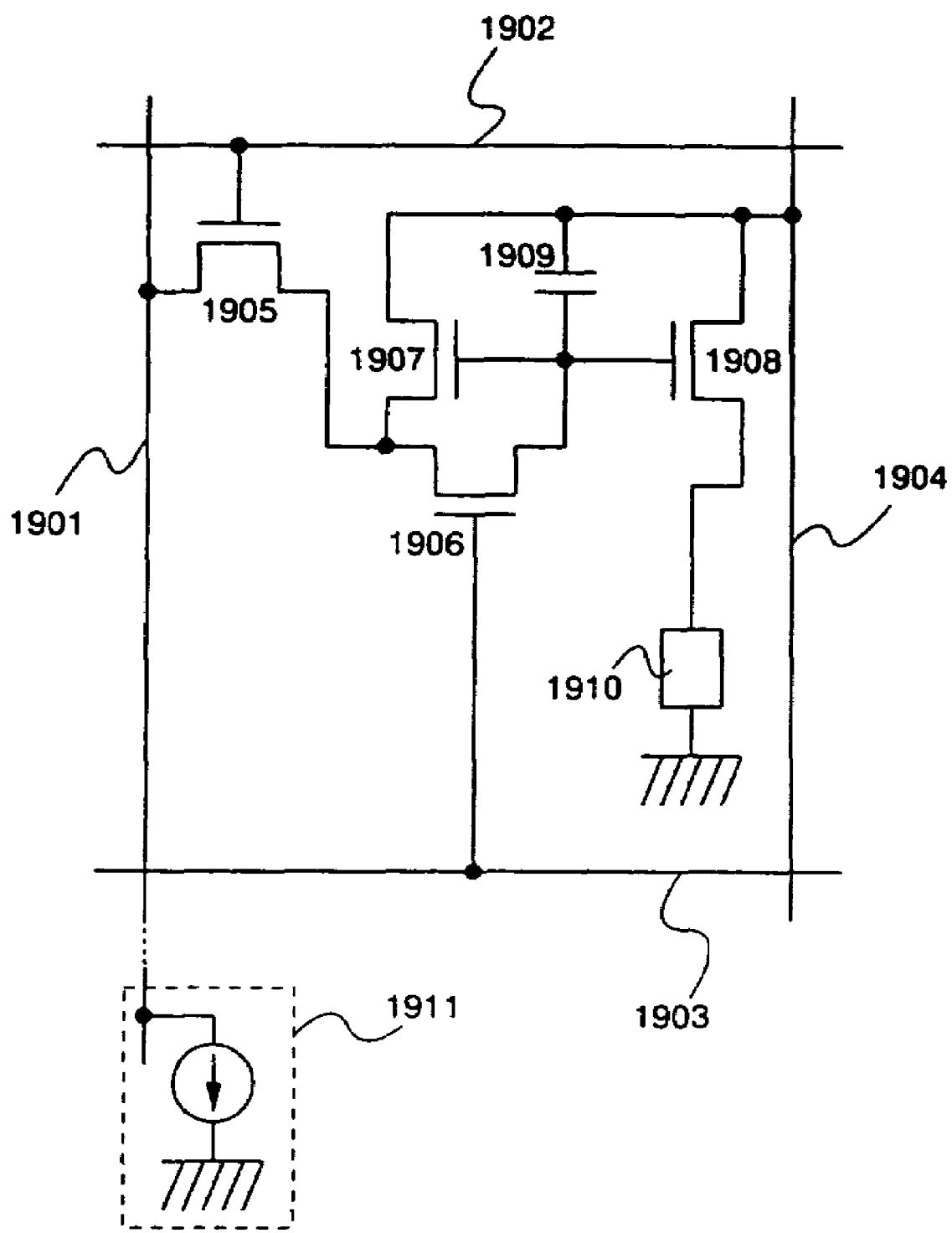
FIG. 19 is a diagram showing the structure of a pixel of a typical electric current write-in semiconductor device.
Figure 20A:
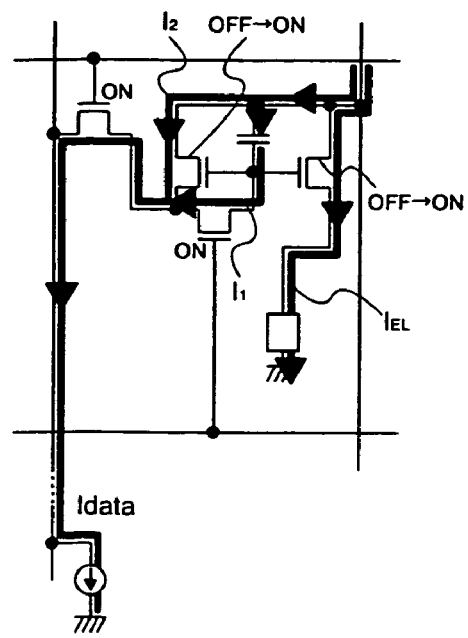
FIGS. 20A to 20E are diagrams showing operation and electric current pathways during signal write-in and light emission for the pixel shown in FIG. 19.
Figure 20B:
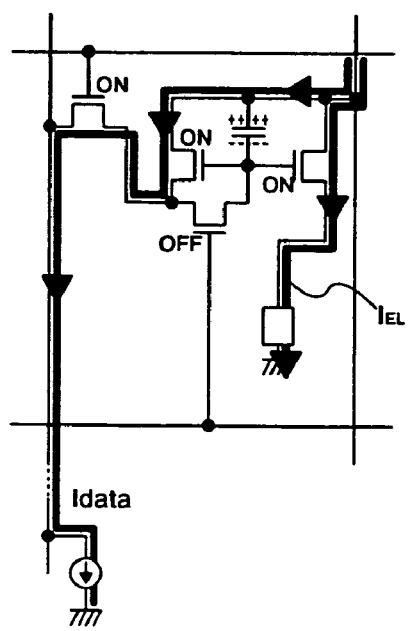
Figure 20C:
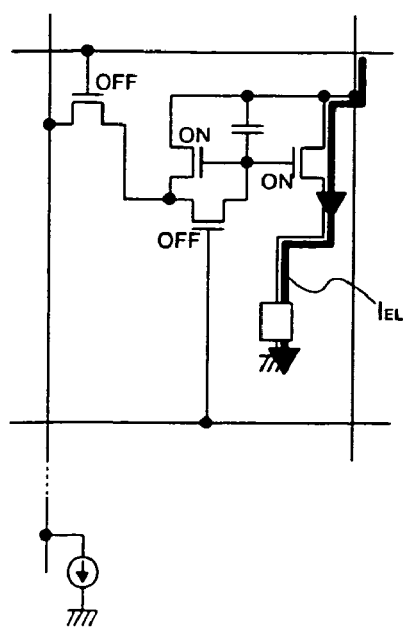
Figure 20D:
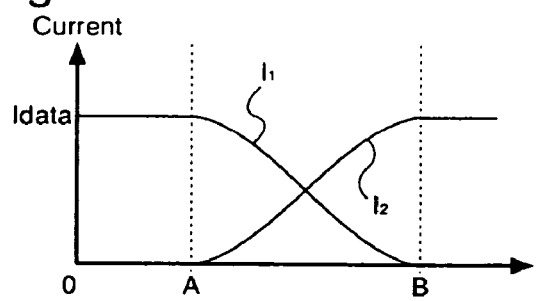
Figure 20E:
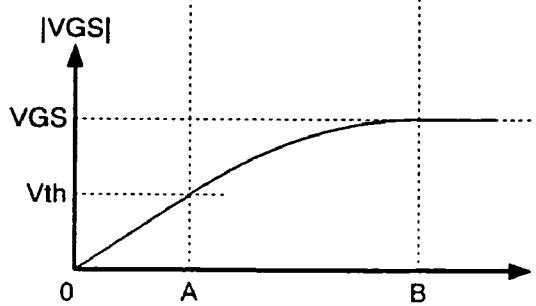
Figure 27B:
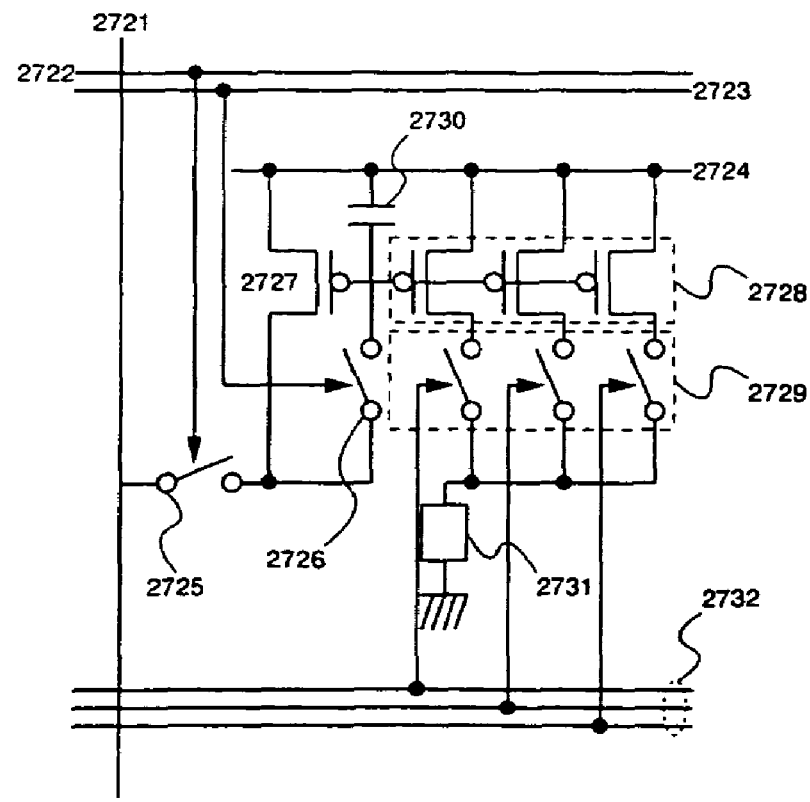

FIG. 27B is a diagram of the structure proposed by Embodiment 11 applied to the structure shown in FIG. 19. The TFT 1908 has a plurality of converter TFTs 2728 disposed in parallel (three are used as an example in the figure), and switching elements 2729. An electric current pathway is selected by the switching elements 2729, and electric current is supplied to a light emitting element 2731 via at least one of the converter TFTs 2728.

Note that, although switching is applied to the driver TFT in FIG. 27B, it may also be applied to the converter and driver TFT.

Figure 35:
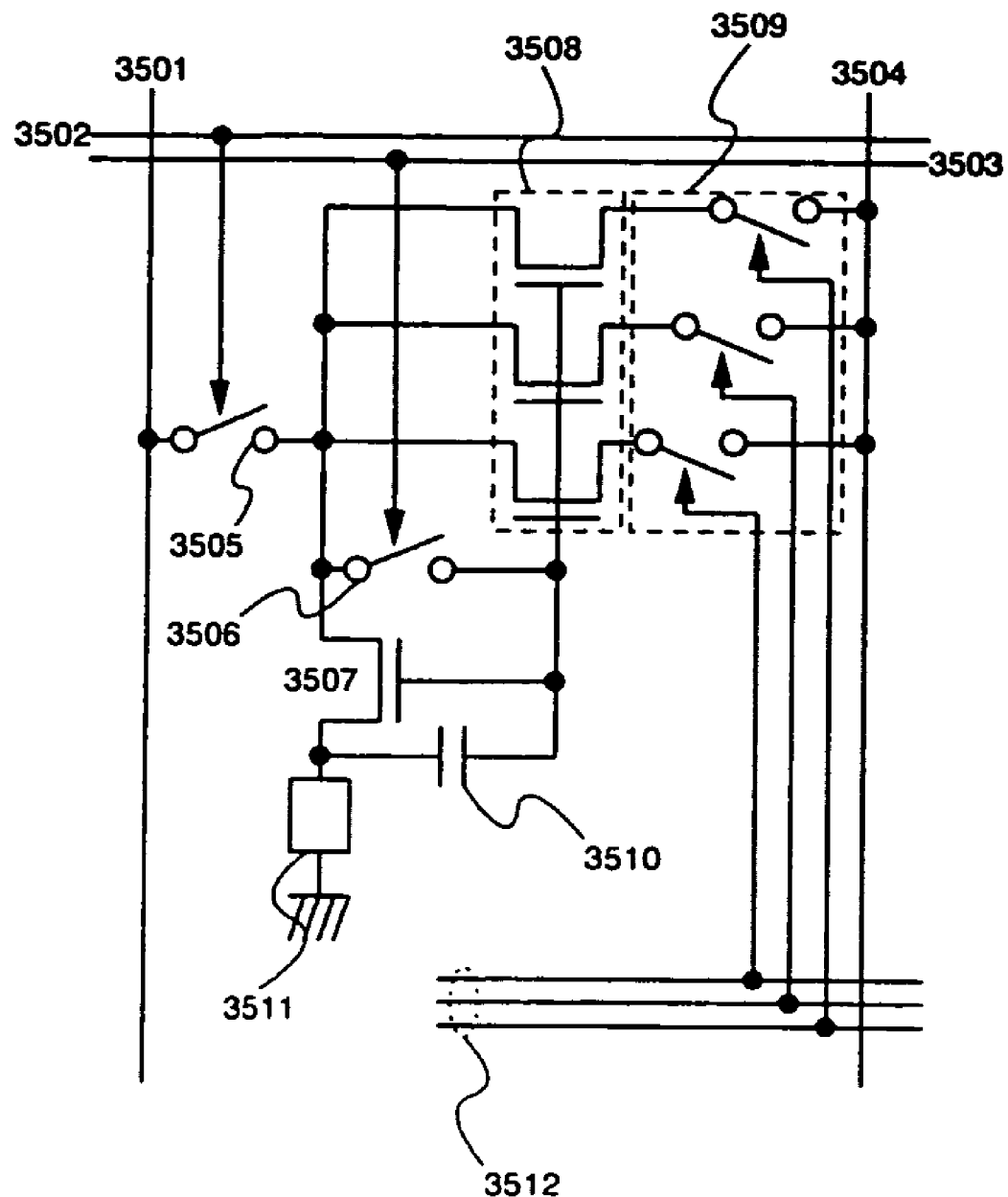
FIG. 35 is a diagram showing an example having a structure in which display irregularities due to dispersions between adjacent TFTs is averaged.

FIG. 35 is a diagram of the structure proposed by Embodiment 11 applied to the structure shown in FIG. 30. The TFT 3007 has a plurality of driver TFTs 3508 disposed in parallel (three are used as an example in the figure), and third switching elements 3509. An electric current pathway is selected by the third switching elements 3509, and electric current is supplied to a light emitting element 3511 via at least one of the driver TFTs 3508.

Although only several examples of pixel structures are shown in Embodiment 11, it is also possible to easily apply the method of averaging dispersion in characteristics by using TFTs arranged in parallel, and that are switched between over time, to other circuits.

Embodiment 12

In this embodiment, an external light emitting quantum efficiency can be remarkably improved by using an organic light emitting material by which phosphorescence from a triplet exciton can be employed for emitting a light. As a result, the power consumption of the light emitting element can be reduced, the lifetime of the light emitting element can be elongated and the weight of the light emitting element can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.

Chemical Formula 1

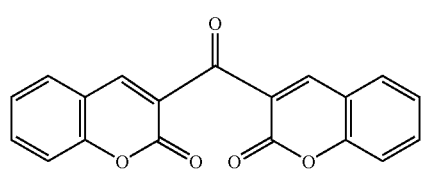

(M. A. Baldo, D. F. O'Brien, Y. You, A. Sboustikov, S. Sibley, M. E. Thompson, S. R. Forrest, Nature 395 (1998) p. 151)

The molecular formula of an organic light emitting material (Pt complex) reported by the above article is represented as follows.

Chemical Formula 2

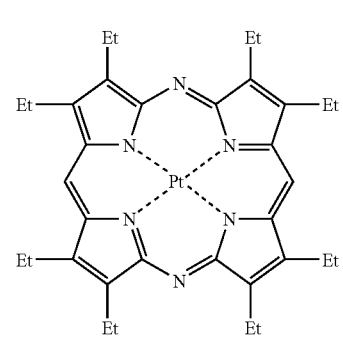

(M. A. Baldo, S. Lamansky, P. E. Burrows, M. E. Thompson, S. R. Forrest, Appl. Phys. Lett., 75 (1999) p. 4.)
(T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an organic light emitting material (Ir complex) reported by the above article is represented as follows.

Chemical Formula 3

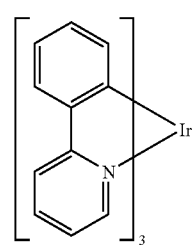

As described above, if phosphorescence from a triplet exciton can be put to practical use, it can realize the external light emitting quantum efficiency three to four times as high as that in the case of using fluorescence from a singlet exciton in principle. The structure according to this embodiment can be freely implemented in combination of any structures of the first to eleventh embodiments.

Embodiment 13

The semiconductor device is of the self-emission type, and thus exhibits more excellent recognizability of the displayed image in a light place as compared to the liquid crystal display device. Furthermore, the light emitting device has a wider viewing angle. Accordingly, the semiconductor device can be applied to a display portion in various electronic devices.

Such electronic devices using a semiconductor device of the present invention include a video camera, a digital camera, a goggles-type display (head mount display), a navigation system, a sound reproduction device (a car audio equipment and an audio set), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like. In particular, in the case of the portable information terminal, use of the light emitting device is preferable, since the portable information terminal that is likely to be viewed from a tilted direction is often required to have a wide viewing angle. FIG. 16 respectively shows various specific examples of such electronic devices.

Figure 16A:
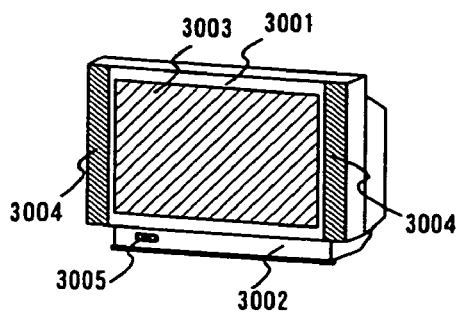
FIGS. 16A to 16H are diagrams showing examples of electronic equipment capable of applying the present invention.

FIG. 16A illustrates an organic light emitting display device which includes a casing 3001, a support table 3002, a display portion 3003, a speaker portion 3004, a video input terminal 3005 or the like. The present invention is applicable to the display portion 3003. The light emitting device is of the self-emission type and therefore requires no back light. Thus, the display portion thereof can have a thickness thinner than that of the liquid crystal display device. The organic light emitting display device is including the entire display device for displaying information, such as a personal computer, a receiver of TV broadcasting and an advertising display.

Figure 16B:
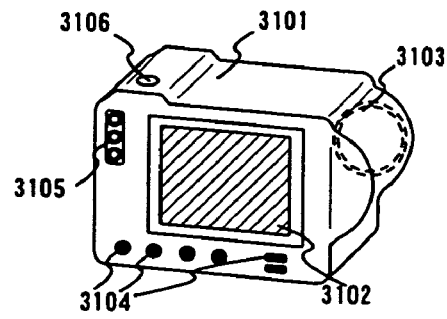

FIG. 16B illustrated a digital still camera which includes a main body 3101, a display portion 3102, an image receiving portion 3103, an operation key 3104, an external connection port 3105, a shutter 3106, or the like. The light emitting device in accordance with the present invention can be used as the display portion 3102.

Figure 16C:
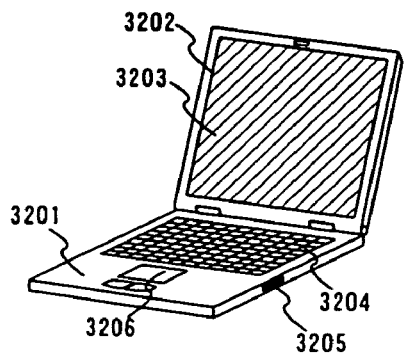

FIG. 16C illustrates a laptop computer which includes a main body 3201, a casing 3202, a display portion 3203, a keyboard 3204, an external connection port 3205, a pointing mouse 3206, or the like. The light emitting device in accordance with the present invention can be used as the display portion 3203.

Figure 16D:
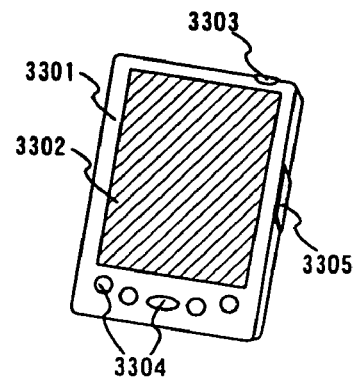

FIG. 16D illustrated a mobile computer which includes a main body 3301, a display portion 3302, a switch 3303, an operation key 3304, an infrared port 3305, or the like. The light emitting device in accordance with the present invention can be used as the display portion 3302.

Figure 16E:
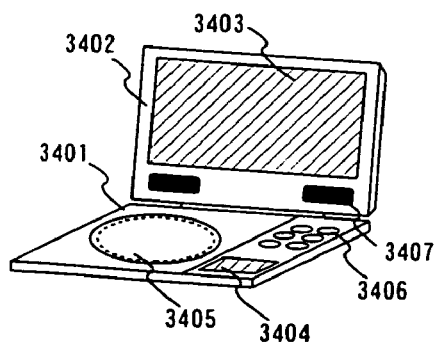

FIG. 16E illustrates an image reproduction apparatus including a recording medium (more specifically, a DVD reproduction apparatus), which includes a main body 3401, a casing 3402, a display portion A 3403, another display portion B 3404, a recording medium (DVD or the like) reading portion 3405, an operation key 3406, a speaker portion 3407 or the like. The display portion A 3403 is used mainly for displaying image information, while the display portion B 3404 is used mainly for displaying character information. The light emitting device in accordance with the present invention can be used as these display portions A and B. The image reproduction apparatus including a recording medium further includes a game machine or the like.

Figure 16F:
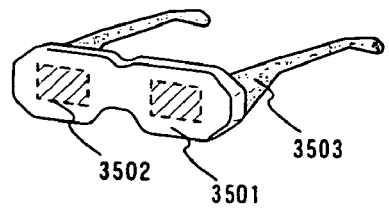

FIG. 16F illustrates a goggle type display (head mounted display) which includes a main body 3501, a display portion 3502, an arm portion 3503. The light emitting device in accordance with the present invention can be used as the display portion 3502.

Figure 16G:
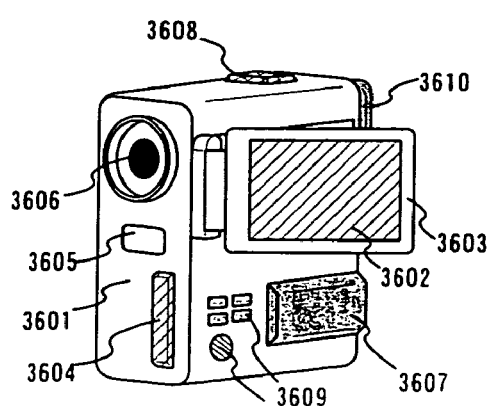

FIG. 16G illustrates a video camera which includes a main body 3601, a display portion 3602, a casing 3603, an external connecting port 3604, a remote control receiving portion 3605, an image receiving portion 3606, a battery 3607, a sound input portion 3608, an operation key 3609, an eyepiece portion 3610 or the like. The light emitting device in accordance with the present invention can be used as the display portion 3602.

Figure 16H:
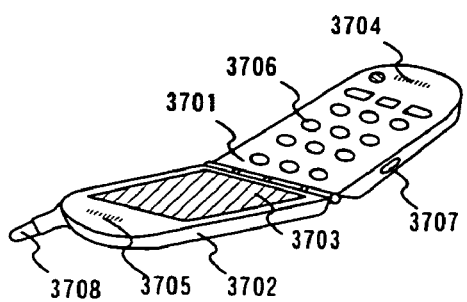

FIG. 16H illustrates a mobile phone which includes a main body 3701, a casing 3702, a display portion 3703, a sound input portion 3704, a sound output portion 3705, an operation key 3706, an external connecting port 3707, an antenna 3708, or the like. The light emitting device in accordance with the present invention can be used as the display portion 3703. Note that the display portion 3703 can reduce power consumption of the portable telephone by displaying white-colored characters on a black-colored background.

When the brighter luminance of light emitted from the organic light emitting material becomes available in the future, the light emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The self-emission type semiconductor device is suitable for displaying moving pictures since the organic light emitting material can exhibit high response speed.

A portion of the self-emission type semiconductor device that is emitting light consumes power, so it is desirable to display information in such a manner that the light emitting portion therein becomes as small as possible. Accordingly, when the semiconductor device is applied to a display portion which mainly displays character information, e.g., a display portion of a portable information terminal, and more particular, a portable telephone or a sound reproduction device, it is desirable to drive the light emitting device so that the character information is formed by a light emitting portion while a non-emission portion corresponds to the background.

As set forth above, the present invention can be applied variously to a wide range of electronic devices in all fields. The electronic device in this embodiment can be obtained by utilizing a semiconductor device having the configuration in which the structures in Embodiments 1 through 12 are freely combined.

Write-in time can be made faster in accordance with the present invention by performing write-in operations using a large electric current even for low gray scales. Further, converter TFTs are used during signal write-in, and converter TFTs are used in addition to driver TFTs during light emission for supplying electric current to light emitting elements, and therefore the influence of dispersion in the characteristics of the TFTs during write-in and during light emission can be reduced. In addition, either one or two gate signal lines are required for driving one row of pixels, and therefore a high aperture ratio can be achieved compared to typical conventional electric current write-in pixels.

What is claimed is:

1. A semiconductor device comprising:
   a first transistor;
   a second transistor; and
   an EL element electrically connected to one of first and second electrodes of the second transistor,
   wherein one of first and second electrodes of the first transistor is electrically connected to another one of first and second electrodes of the second transistor,
   wherein a gate electrode of the first transistor is electrically connected to a gate electrode of the second transistor,
   wherein electric current $I_{EL}$ flows in the EL element through the first and second transistors during light emission, and
   wherein an electric current denoted by $I_{data}$ flows through the first transistor and does not flow through the second transistor during write-in.

2. The semiconductor device according to claim 1, wherein the semiconductor device is applied to an electronic equipment selected from the group consisting of an organic light emitting display device, a digital still camera, a laptop computer, a mobile computer, an image reproduction apparatus including a recording medium, a goggle type display, a video camera and a mobile phone.

3. The semiconductor device according to claim 1, wherein the relationship between the electric currents denoted by $I_{data}$ and $I_{EL}$ is $I_{data} \geqq I_{EL}$.

4. A semiconductor device comprising:
  a first transistor, wherein a gate electrode of the first transistor is electrically connected to a first gate signal line, and a first electrode of the first transistor is electrically connected to a source signal line;
  a second transistor, wherein a first electrode of the second transistor is electrically connected to a second electrode of the first transistor, and a second electrode of the second transistor is electrically connected to a current supply line; and
  a third transistor, wherein a gate electrode of the third transistor is electrically connected to a gate electrode of the second transistor, a first electrode of the third transistor is electrically connected to the second electrode of the first transistor, and a second electrode of the third transistor is electrically connected to an EL element.

5. The semiconductor device according to claim 4, wherein the semiconductor device is applied to an electronic equipment selected from the group consisting of an organic light emitting display device, a digital still camera, a laptop computer, a mobile computer, an image reproduction apparatus including a recording medium, a goggle type display, a video camera and a mobile phone.

6. The semiconductor device according to claim 4,
  wherein an electric current denoted by $I_{data}$ flows through the second transistor and does not flow through the third transistor during write-in, and
  wherein an electric current denoted by $I_{EL}$ flows through the second transistor and the third transistor during light emission.

7. The semiconductor device according to claim 6, wherein the relationship between the electric currents denoted by $I_{data}$ and $I_{EL}$ is $I_{data} \geqq I_{EL}$.

8. A semiconductor device comprising:
  a first switching element controlled by a first gate signal line;
  a second switching element controlled by a second gate signal line;
  a first transistor, wherein a gate electrode of the first transistor is electrically connected to the second switching element, a first electrode of the first transistor is electrically connected to the first switching element, and a second electrode of the first transistor is electrically connected to a current supply line; and
  a second transistor, wherein a gate electrode of the second transistor is electrically connected to the second switching element, a first electrode of the second transistor is electrically connected to the first switching element, and a second electrode of the second transistor is electrically connected to an EL element.

9. The semiconductor device according to claim 8, wherein the semiconductor device is applied to an electronic equipment selected from the group consisting of an organic light emitting display device, a digital still camera, a laptop computer, a mobile computer, an image reproduction apparatus including a recording medium, a goggle type display, a video camera and a mobile phone.

10. The semiconductor device according to claim 8,
  wherein an electric current denoted by $I_{data}$ flows through the first transistor and does not flow through the second transistor during write-in, and
  wherein an electric current denoted by $I_{EL}$ flows through the first transistor and the second transistor during light emission.

11. The semiconductor device according to claim 10, wherein the relationship between the electric currents denoted by $I_{data}$ and $I_{EL}$ is $I_{data} \geqq I_{EL}$.

12. A semiconductor device comprising:
  a first transistor, wherein a gate electrode of the first transistor is electrically connected to a first gate signal line, and a first electrode of the first transistor is electrically connected to a source signal line;
  a second transistor, wherein a gate electrode of the second transistor is electrically connected to a second gate signal line and, a second electrode of the second transistor is electrically connected to the source signal line;
  a third transistor, wherein a gate electrode of the third transistor is electrically connected to a first electrode of the second transistor, a first electrode of the third transistor is electrically connected to a second electrode of the first transistor, and a second electrode of the third transistor is electrically connected to a current supply line; and
  a fourth transistor, wherein a gate electrode of the fourth transistor is electrically connected to the first electrode of the second transistor, a first electrode of the fourth transistor is electrically connected to the second electrode of the first transistor, and a second electrode of the fourth transistor is electrically connected to an EL element.

13. The semiconductor device according to claim 12, wherein the semiconductor device is applied to an electronic equipment selected from the group consisting of an organic light emitting display device, a digital still camera, a laptop computer, a mobile computer, an image reproduction apparatus including a recording medium, a goggle type display, a video camera and a mobile phone.

14. The semiconductor device according to claim 12,
  wherein an electric current denoted by $I_{data}$ flows through the third transistor and does not flow through the fourth transistor during write-in, and
  wherein an electric current denoted by $I_{EL}$ flows through the third transistor and the fourth transistor during light emission.

15. The semiconductor device according to claim 14, wherein the relationship between the electric currents denoted by $I_{data}$ and $I_{EL}$ is $I_{data} \geqq I_{EL}$.

16. A semiconductor device comprising:
  a first transistor, wherein a gate electrode of the first transistor is electrically connected to a first gate signal line, and a first electrode of the first transistor is electrically connected to a source signal line;
  a second transistor, wherein a gate electrode of the second transistor is electrically connected to a second gate signal line and, a second electrode of the second transistor is electrically connected to a second electrode of the first transistor;
  a third transistor, wherein a gate electrode of the third transistor is electrically connected to a first electrode of the second transistor, a first electrode of the third transistor is electrically connected to a second electrode of the first transistor, and a second electrode of the third transistor is electrically connected to a current supply line; and
  a fourth transistor, wherein a gate electrode of the fourth transistor is electrically connected to the first electrode of the second transistor, a first electrode of the fourth transistor is electrically connected to the second electrode of the first transistor, and a second electrode of the fourth transistor is electrically connected to an EL element.

17. The semiconductor device according to claim 16, wherein the semiconductor device is applied to an electronic equipment selected from the group consisting of an organic light emitting display device, a digital still camera, a laptop computer, a mobile computer, an image reproduction apparatus including a recording medium, a goggle type display, a video camera and a mobile phone.

18. The semiconductor device according to claim 16,
wherein an electric current denoted by $I_{data}$ flows through the third transistor and does not flow through the fourth transistor during write-in, and
wherein an electric current denoted by $I_{EL}$ flows through the third transistor and the fourth transistor during light emission.

19. The semiconductor device according to claim 18, wherein the relationship between the electric currents denoted by $I_{data}$ and $I_{EL}$ is $I_{data} \geq I_{EL}$.

20. A semiconductor device comprising:
a first transistor, wherein a first electrode of the first transistor is electrically connected to a source signal line;
a second transistor, wherein a second electrode of the second transistor is electrically connected to the source signal line;
a third transistor, wherein a gate electrode of the third transistor is electrically connected to a first electrode of the second transistor, a first electrode of the third transistor is electrically connected to a second electrode of the first transistor, and a second electrode of the third transistor is electrically connected to a current supply line; and
a fourth transistor, wherein a gate electrode of the fourth transistor is electrically connected to the first electrode of the second transistor, a first electrode of the fourth transistor is electrically connected to the second electrode of the first transistor, and a second electrode of the fourth transistor is electrically connected to an EL element.

21. The semiconductor device according to claim 20, wherein a gate electrode of the first transistor is electrically connected to a gate signal line; and a gate electrode of the second transistor is electrically connected to the gate signal line.

22. The semiconductor device according to claim 20, wherein the semiconductor device is applied to an electronic equipment selected from the group consisting of an organic light emitting display device, a digital still camera, a laptop computer, a mobile computer, an image reproduction apparatus including a recording medium, a goggle type display, a video camera and a mobile phone.

23. The semiconductor device according to claim 20,
wherein an electric current denoted by $I_{data}$ flows through the third transistor and does not flow through the fourth transistor during write-in, and
wherein an electric current denoted by $I_{EL}$ flows through the third transistor and the fourth transistor during light emission.

24. The semiconductor device according to claim 23, wherein the relationship between the electric currents denoted by $I_{data}$ and $I_{EL}$ is $I_{data} \geq I_{EL}$.

25. A semiconductor device comprising:
a first transistor, wherein a first electrode of the first transistor is electrically connected to a source signal line;
a second transistor, wherein a second electrode of the second transistor is electrically connected to a second electrode of the first transistor;
a third transistor, wherein a gate electrode of the third transistor is electrically connected to a first electrode of the second transistor, a first electrode of the third transistor is electrically connected to a second electrode of the first transistor, and a second electrode of the third transistor is electrically connected to a current supply line; and
a fourth transistor, wherein a gate electrode of the fourth transistor is electrically connected to the first electrode of the second transistor, a first electrode of the fourth transistor is electrically connected to the second electrode of the first transistor, and a second electrode of the fourth transistor is electrically connected to an EL element.

26. The semiconductor device according to claim 25, wherein a gate electrode of the first transistor is electrically connected to a gate signal line; and a gate electrode of the second transistor is electrically connected to the gate signal line.

27. The semiconductor device according to claim 25, wherein the semiconductor device is applied to an electronic equipment selected from the group consisting of an organic light emitting display device, a digital still camera, a laptop computer, a mobile computer, an image reproduction apparatus including a recording medium, a goggle type display, a video camera and a mobile phone.

28. The semiconductor device according to claim 25,
wherein an electric current denoted by $I_{data}$ flows through the third transistor and does not flow through the fourth transistor during write-in, and
wherein an electric current denoted by $I_{EL}$ flows through the third transistor and the fourth transistor during light emission.

29. The semiconductor device according to claim 28, wherein the relationship between the electric currents denoted by $I_{data}$ and $I_{EL}$ is $I_{data} \geq I_{EL}$.

* * * * *